(12) United States Patent
Yazami et al.

(10) Patent No.: US 9,995,794 B2
(45) Date of Patent: Jun. 12, 2018

(54) METHODS FOR TESTING A BATTERY AND DEVICES CONFIGURED TO TEST A BATTERY

(71) Applicant: NANYANG TECHNOLOGICAL UNIVERSITY, Singapore (SG)

(72) Inventors: Rachid Yazami, Singapore (SG); Kenza Maher, Singapore (SG)

(73) Assignee: Nanyang Technological University, Singapore (SG)

(*) Notice: Subject to any disclaimer, the term of this patent is extended or adjusted under 35 U.S.C. 154(b) by 128 days.

(21) Appl. No.: 14/766,395

(22) PCT Filed: Feb. 6, 2014

(86) PCT No.: PCT/SG2014/000049
§ 371 (c)(1),
(2) Date: Aug. 6, 2015

(87) PCT Pub. No.: WO2014/123487
PCT Pub. Date: Aug. 14, 2014

(65) Prior Publication Data
US 2015/0377977 A1    Dec. 31, 2015

Related U.S. Application Data

(60) Provisional application No. 61/761,563, filed on Feb. 6, 2013.

(51) Int. Cl.
*G01R 31/36* (2006.01)
*H01M 10/48* (2006.01)

(52) U.S. Cl.
CPC ..... *G01R 31/3679* (2013.01); *G01R 31/3651* (2013.01); *H01M 10/48* (2013.01)

(58) Field of Classification Search
CPC .................................................. G01R 31/3679
(Continued)

(56) References Cited

U.S. PATENT DOCUMENTS 7,595,611 B2 * 9/2009 Reynier .................. H01M 6/50
320/152
8,446,127 B2 * 5/2013 Yazami ............... H01M 10/443
320/132

(Continued)

FOREIGN PATENT DOCUMENTS

CN      100344965 C     10/2007
CN      101365941 A     2/2009
(Continued)

OTHER PUBLICATIONS

Office Action for Chinese Patent Application No. 201480007668.7 dated Dec. 27, 2016 with English translation; 33 pages.
(Continued)

*Primary Examiner* — Samuel Berhanu
*Assistant Examiner* — Tessema Kebede
(74) *Attorney, Agent, or Firm* — Alston & Bird LLP

(57) ABSTRACT

A method for testing a battery may be provided. The method may include: bringing the battery to a pre-determined voltage; determining a parameter of the battery, the parameter of the battery including at least one of an entropy of the battery at the pre-determined voltage or an enthalpy of the battery at the pre-determined voltage; and determining an ageing history of the battery based on the determined parameter.

8 Claims, 113 Drawing Sheets

(58) Field of Classification Search
USPC .......................................................... 324/426
See application file for complete search history.

(56) References Cited

U.S. PATENT DOCUMENTS

| | | | |
|---|---|---|---|
| 2010/0090650 A1* | 4/2010 | Yazami | H01M 10/443 320/132 |
| 2011/0121786 A1 | 5/2011 | Tsuruta et al. | |
| 2012/0043929 A1 | 2/2012 | Yazami | |
| 2013/0090900 A1* | 4/2013 | Gering | G01R 31/3679 703/2 |

FOREIGN PATENT DOCUMENTS

| | | |
|---|---|---|
| JP | 2011-113688 A | 6/2011 |
| WO | WO-00/69008 | 11/2000 |
| WO | WO-2010/011586 A1 | 1/2010 |
| WO | WO 2010/105062 A1 | 8/2014 |

OTHER PUBLICATIONS

Y. F. Reynier, R. Yazami, B. Fultz, J. Power Sources 119-121 (2003) 850-855.
Y. F. Reynier, R. Yazami, B. Fultz, J. Electrochem. Soc. 151 (2004) A422-A426.
B. Fultz, Y. Reynier, J. Graetz, T. Swan-Wood, P. Rez, R. Yazami, Advanced Materials for Energy Conversion II, D. Chandra, R. G. Bautista and L. Schlaphach Eds., (2004).
Y. Reynier, R. Yazami, B. Fultz, Proc. 17th Annual Battery Conference on Applications and Advances, IEEE, R. S. L. Das and H. Frank, Eds. (2002) 145-150.
Y. Reynier, J. Graetz, T. Swan-Wood, P. Rez, R. Yazami, B. Fultz, Phys. Rev. B 70 (2004) 174304.
R. Stevens, J. L. Dodd, M. G. Kresch, R. Yazami, B. Fultz; J. Phys. Chem. B 110 (2006) 22732-22735.
R.Yazami, Y. Reynier, B. Fultz, Electrochem. Soc. Trans. 1 (2006) 87-96.
Y. Reynier, R. Yazami, J. Power Sources 153 (2006) 312-318.
Y. Reynier, R. Yazami, B. Fultz, I. Barsukov, J. Power Sources 165 (2007) 552-558.
R. Yazami, A. Martinent, Y. Reynier, New Carbon Advanced Workshop and Conference on New Carbon Materials, NATO Science Series, Mathematics, Physics, Chemistry 279 (2006) 245-258.
K. Maher and R. Yazami , Electrochim. Acta (2013) 71-78.
K. Maher and R. Yazami, J. Power Sources (2013, under review).
R. Yazami; in Lithium Ion Rechargeable Batteries, K. Ozawa, Editor, WILEY-VCH, 2009, pp. 67-102.
K. Maher, R. Yazami, J. Power Sources (2014) 527-533.
J. Vetter, P. Novak, M. R. Wagner, C. Veit, K. C. Moller, J. O. Besenhard, M. Winter, M. Wohlfahrt-Mehrens, C. Vogler, A. Hammouche, J. Power Sources 147 (2005) 269-281.
S. S. Choi, Hong S. Lim, J. Power Sources 111 (2002) 130-136.
R. A. Leising, M. J. Palazzo, E. S. Takeuchi, K. J. Takeuchi, J. Power Sources 97-98 (2001) 681-683.
W. Lu, C. M. Lopez, N. Liu, J. T. Vaughey, A. Jansen, D. W. Dees, J. Electrochem. Soc. 159 (2012) A566-A570.
J. R. Belt, C. D. Ho, T. J. Miller, M. A. Habib, T. Q. Duong, J. Power Sources 142 (2005) 354-360.
K. Amine, J. Liu, I. Belharouak, Electrochem. Commun. 7 (2005) 669-673.
E. V. Thomas, H. L. Case, D. H. Doughty, R. G. Jungst, G. Nagasubramanian, E. P. Roth, J. Power Sources 124 (2003) 254-260.
K. Asakura, M. Shimomura, T. Shodai, J. Power Sources 119-121 (2003) 902-905.
R. P. Ramasamy, R. E. White, B. N. Popov, J. Power Sources 141 (2005) 298-306.
T. Horiba, T. Maeshima, T. Matsumura, M. Koseki, J. Arai, Y. Muranaka, J. Power Sources 146 (2005) 107-110.

I. Bloom, B. W. Cole, J. J. Sohn, S. A. Jones, E. G. Polzin, V. S. Battaglia, G. L. Henriksen, C. Motloch, R. Richardson, T. Unkelhaeuser, D. Ingersoll, and H. L. Case, J. Power Sources 101 (2001) 238.
A. M. Lackner, E. Sherman, P. O. Braatz, J. D. Margerum, J. Power Sources 104 (2002) 1-6.
M. Dubarry, BY. Liaw, MS. Chen, SS. Chyan, KC. Han, WT. Sie, SH. Wu, J. Power Sources 196 (2011) 3420-3425.
P. Ramadass, B. Haran, R. White, B. N. Popov, J. Power Sources 112 (2002) 606-613.
K. Takei, K. Kumai, Y. Kobayashi, H. Miyashiro, N. Terada, T. Iwahori, T. Tanaka, J. Power Sources 97-98 (2001) 697-701.
K. Sawai, R. Yamato, T. Ohzuku, Electrochim. Acta 51 (2006) 1651-1655.
M. Broussely, in Advances in Lithium-Ion Batteries, W. A. V. Schalkwijk and B. Scrosati, Editors, p. 393-432, Kluwer Academic/Plenum Publishers, New York, 2002.
S. Santhanagopalan, Q. Zhang, K. Kumaresan, R.E. White, J. Electrochem. Soc. 155 (2008) A345-A353.
P. Ramadass, B. Haran, R. White, B. N. Popov, J. Power Sources 111 (2002) 210-220.
J. Li, E. Murphy, J. Winnick, P.A. Kohl, J. Power Sources 102 (2001) 294-301.
Y. H. Ye, Y. X. Shi, N. S. Cai, J. Lee, X. M. He, J. Power Sources 199 (2012) 227-238.
K. C. Lim, A. M. Lackner, P. O. Braatz, W. H. Smith, J. D. Margerum, H. S. Lim, in: Proc. of the Symposium Batteries for Portable Applications and Electric Vehicles, vol. 97-181, The Electrochemical Society, Paris, France, Aug. 31-Sep. 5, 1997, pp. 470.
R. Kostecki, F. McLarnon, J. Power Sources 119-121 (2003) 550-554.
E. Markervich, G. Salitra, M. D. Levi, and D. Aurbach, J. Power Sources 146 (2005) 146-150.
J. Li, J. Zhang, X. Zhang, C. Yang, N. Xu, B. Xia, Electrochimica Acta 55 (2010) 927-934.
D.P. Abraham, J. Liu, C.H. Chen, Y.E. Hyung, M. Stoll, N. Elsen, S. MacLaren, R. Twesten, R. Haasch,E. Sammann, I. Petrov, K. Amine, G. Henriksen, J. Power Sources 119-121 (2003) 511-516.
Y. J. Park, J. W. Lee, Y. G. Lee, K. M. Kim, M. G. Kang, Y. Lee, Bull. Korean Chem. Soc. 28 (2007) 2226-2230.
R. Yazami, Y. Ozawa, H. Gabrisch, B. Fultz, Electrochim. Acta, 50 (2004) 385-390.
S. S. Choi, H. S. Lim, J. Power Sources, 111 (2002) 130-136.
Y. Matsumura, S. Wang and J. Mondori, J. Electrochem. Soc. 142 (1995) 2914-2918.
P. Arora, R.E. White, M. Doyle, J. Electrochem. Soc. 145 (1998) 3647-3667.
G. Ning, B. N. Popov, J. Electrochem. Soc. 151 (2004) A1584-A1591.
R.J. Gummow, A. de Kock, M.M. Thackeray, Solid State Ionics 69 (1994) 59-67.
J.M. Tarascon, W.R. McKinnon, F. Coowar, T.N. Bowmer, G. Amatucci, D. Guyomard, J. Electrochem. Soc. 141 (1994) 1421-1431.
S. Choi, A. Manthiram, J. Electrochem. Soc. 149 (2002) A1157-A1163.
G. Pistoia, A. Antonini, R. Rosati, D. Zane, Electrochem. Acta 41 (1996) 2683-2689.
D. Aurbach, K. Gamolsky, B. Markovsky, G. Salitra, Y. Gofer, U. Heider, R. Oesten, M. Schmidt, J. Electrochem. Soc 147 (2000) 1322-1331.
D. Aurbach, E. Zinigrad, Y. Cohen, H. Teller, Solid State Ionics 148 (2002) 405-416.
D. Aurbach, B. Markovsky, A. Rodkin, M. Cojocaru, E. Levi, H. J. Kim Electrochim. Acta 00 (2002) 1-13.
M. Murakami, H. Yamashige, H. Arai, Y. Uchimoto, Z. Ogumi; Electrochim. Acta 78 (2012) 49-54.
K. Maher et al., "Effect of overcharge on entropy and enthalpy of lithium-ion batteries," Electrochim. Acta 2012, 1-8.
In re: R. Yazami, C. M. Tan, J. McMenamin; U.S. Patent Application for Imbedded Chip for Battery; U.S. Appl. No. 61/639,712, filed Apr. 27, 2012.

(56) References Cited

OTHER PUBLICATIONS

In re: R. Yazami; U.S. Patent Application for Advanced Thermodynamics Measurements (DEET); U.S. Appl. No. 61/536,239, filed Sep. 19, 2011.
In re: R. Yazamir, K. Maher; U.S. Patent Application for Battery History Assessment; U.S. Appl. No. 61/761,563, filed Feb. 6, 2013.
International Search Report and Written Opinion from International Patent Application No. PCT/SG2014/000049 dated Apr. 15, 2014.
Office Action for Japanese Application No. 2015-555970 dated Nov. 21, 2017, 9 pages total.

* cited by examiner

METHODS FOR TESTING A BATTERY AND DEVICES CONFIGURED TO TEST A BATTERY

CROSS-REFERENCE TO RELATED APPLICATIONS

The present application claims the benefit of the U.S. Provisional Application No. 61/761,563 filed on 6 Feb. 2013, the entire contents of which are incorporated herein by reference for all purposes.

TECHNICAL FIELD

Embodiments relate generally to methods for testing a battery and devices configured to test a battery.

BACKGROUND

Batteries are an important energy storage and source of electrical energy. Thus, there may be a need to determine the status of a battery.

SUMMARY

According to various embodiments, a method for testing a battery may be provided. The method may include: bringing the battery to a pre-determined voltage; determining a parameter of the battery, the parameter of the battery comprising at least one of an entropy of the battery at the pre-determined voltage or an enthalpy of the battery at the pre-determined voltage; and determining an ageing history of the battery based on the determined parameter.

According to various embodiments, a device configured to test a battery may be provided. The device may include: a voltage setting circuit configured to bring the battery to a pre-determined voltage; a parameter determination circuit configured to determine a parameter of the battery, the parameter of the battery comprising at least one of an entropy of the battery at the pre-determined voltage or an enthalpy of the battery at the pre-determined voltage; and a history determination circuit configured to determine an ageing history of the battery based on the determined parameter.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1A:
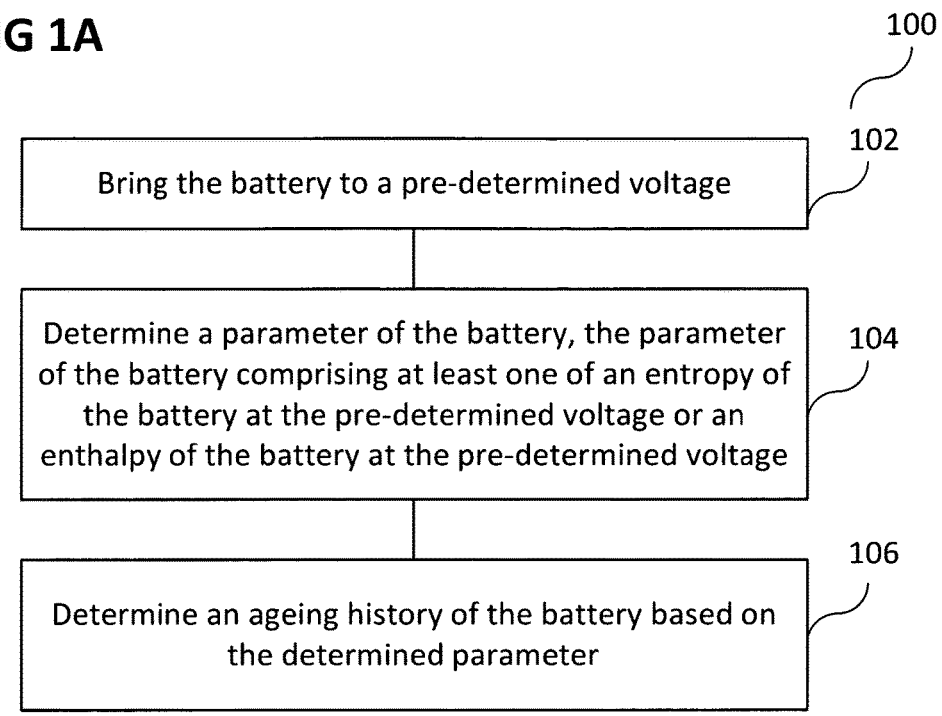
FIG. 1A shows a flow diagram illustrating a method for testing a battery according to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

In this context, the device as described in this description may include a memory which is for example used in the processing carried out in the device. A memory used in the embodiments may be a volatile memory, for example a DRAM (Dynamic Random Access Memory) or a non-volatile memory, for example a. PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

Batteries are an important energy storage and source of electrical energy. Thus, there may be a need to determine the status of a battery.

Batteries may undergo regular or accelerated ageing during service life.

Battery ageing may translate into decreased energy and power storage performances, such as:

Lower discharge capacity;
Lower discharge voltages;
Lower power output; and
Higher internal resistance (generates more heat)

These ageing effects may relate to the battery state of heath (SOH).

The most common causes of battery normal and premature ageing are:

1. Long charge and discharge cycles;
2. Storage and operation at high temperatures;
3. Overcharge and overdischarge;
4. High rate charge and discharge; and
5. Abuse tests: such as short circuit, reverse voltages, mechanical (vibration, crash, . . . ), extreme temperatures, . . . .

Battery history can be defined as the sum and combination of all ageing causes 1-5 experienced by the battery in the course of its operation life.

A fundamental question is: Is it possible to assess a posteriori the kind(s) of ageing processes a battery underwent during its operation life? In other words: Does a battery keep a memory or traces of different operations causing its ageing? Can we unveil the "battery history"?

Up to now, there is no existing technology able to trace battery history.

According to various embodiments, devices and methods may be provided for battery history assessment.

Battery history may be important at least for the following reasons:

Battery history controls battery state of health (SOH), a crucial knowledge for the end user.
SOH enables the following:
1. Predict battery performance (energy storage, power, residual/remaining cycle life);
2. Predict battery safety;
3. Adjust battery operation parameters (charge current, temperature, . . . ) according to SOH so as to extend battery life.
Battery history technology can be used for diagnosis purposes (legal, user information, . . . )

However, commonly used technologies such as battery management systems (BMS) do not include battery history features.

We found thermodynamics functions such as entropy (S) and enthalpy (H) bear a signature characteristic of the kind of battery ageing.

Anode and cathode in a battery undergo irreversible changes in the process of ageing, which account for the battery performance decay.

We discovered that these changes are amplified at particular anode and cathode compositions and voltages where a phase transition or change occurs in anode and cathode.

FIG. 1A shows a flow diagram 100 illustrating a method for testing a battery according to various embodiments. In 102, the battery may be brought to a pre-determined voltage. In 104, a parameter of the battery may be determined. The parameter of the battery may include or may be an entropy of the battery at the pre-determined voltage and/or an enthalpy of the battery at the pre-determined voltage. In 106, an ageing history of the battery may be determined based on the determined parameter.

In other words, according to various embodiments, the history of the battery may be determined based on an entropy or an enthalpy of the battery at a pre-determined voltage. For example, according to various embodiments, the history of the battery may be determined from an entropy and an enthalpy of the battery at a pre-determined voltage, without any further entropy or enthalpy information (wherein the pre-determined voltage may for example be defined by the material of the anode of the battery and the material of the cathode of the battery, and the pre-determined voltage may for example be determined based on an in-situ diffraction of the battery).

According to various embodiments, the method may further include: applying the pre-determined voltage to the battery for a pre-determined time; and determining the parameter after applying the pre-determined voltage for the pre-determined time.

According to various embodiments, determining the parameter may include changing the temperature of the battery by a pre-determined value.

According to various embodiments, determining the history may include or may be comparing the determined parameter with a reference parameter.

According to various embodiments, the reference parameter may be a parameter of a battery which underwent a pre-determined ageing history.

According to various embodiments, the pre-determined voltage may be associated to a phase transition in the anode.

According to various embodiments, the pre-determined voltage may be associated to a phase transition in the cathode.

According to various embodiments, the pre-determined voltage may be associated to a material change in the anode.

According to various embodiments, the pre-determined voltage may be associated to a material change in the cathode.

According to various embodiments, the history of ageing of the battery may include or may be information about high voltage ageing.

According to various embodiments, the history of ageing of the battery may include or may be information about high temperature ageing.

According to various embodiments, the history of ageing of the battery may include or may be information about long cycling ageing.

Figure 1B:
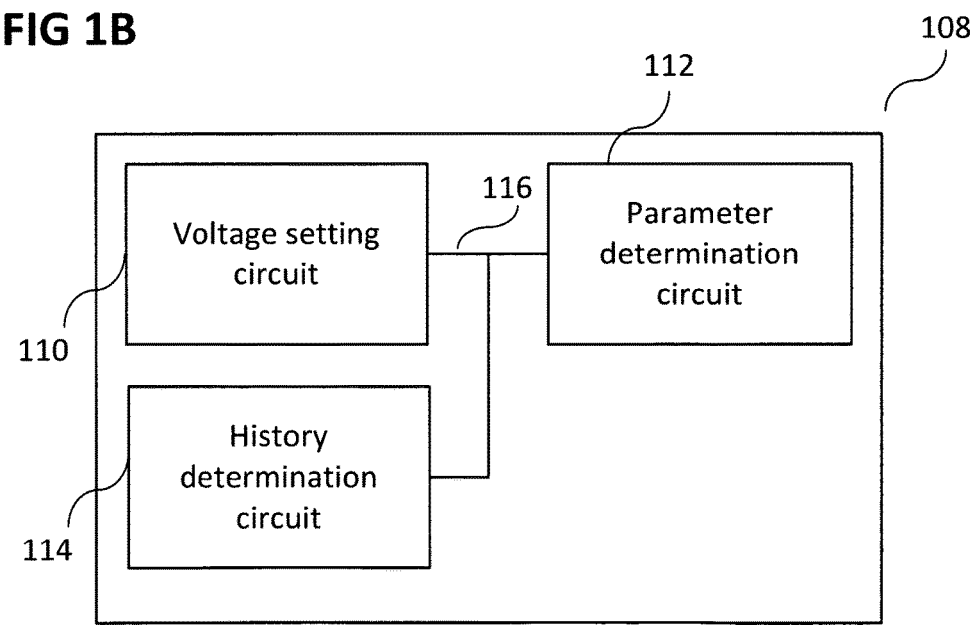
FIG. 1B shows a device configured to test a battery according to various embodiments.

FIG. 1B shows a device 108 configured to test a battery according to various embodiments. The device 108 may include a voltage setting circuit 110 configured to bring the battery to a pre-determined voltage. The device 108 may further include a parameter determination circuit 112 configured to determine a parameter of the battery. The parameter of the battery may include or may be an entropy of the battery at the pre-determined voltage and/or an enthalpy of the battery at the pre-determined voltage. The device 108 may further include a history determination circuit 114 configured to determine an ageing history of the battery based on the determined parameter. The voltage setting circuit 110, the parameter determination circuit 112, and the history determination circuit 114 may be coupled by a coupling 116, for example by an electrical coupling or by an optical coupling, for example a cable or a bus.

According to various embodiments, the voltage setting circuit 110 may be configured to apply the pre-determined voltage to the battery for a pre-determined time. According to various embodiments, the parameter determination circuit 112 may be configured to determine the parameter after applying the pre-determined voltage for the pre-determined time.

According to various embodiments, the parameter determination circuit 112 may be configured to change the temperature of the battery by a pre-determined value.

According to various embodiments, the history determination circuit 114 may be configured to determine the history based on comparing the determined parameter with a reference parameter.

According to various embodiments, the reference parameter may include or may be a parameter of a battery which underwent a pre-determined ageing history.

According to various embodiments, the pre-determined voltage may be associated to a phase transition in the anode.

According to various embodiments, the pre-determined voltage may be associated to a phase transition in the cathode.

According to various embodiments, the pre-determined voltage may be associated to a material change in the anode.

According to various embodiments, the pre-determined voltage may be associated to a material change in the cathode.

According to various embodiments, the history of ageing of the battery may include or may be information about high voltage ageing.

According to various embodiments, the history of ageing of the battery may include or may be information about high temperature ageing.

According to various embodiments, the history of ageing of the battery may include or may be information about long cycling ageing.

According to various embodiments; devices and methods may be provided for assessing battery history. Batteries undergo energy storage and power performance decays during their operation life or ageing. Decay in performance include decreased discharge capacity, decreased discharge voltages (or potentials) and increased internal resistances. There are several causes of battery ageing: long cycling, exposure to high temperatures, overcharge and overdischarge, high rate charging and discharging, electrical and mechanical abuses. Battery ageing affect not only storage performances but also battery state of health and battery state of safety. The latter is a crucial knowledge for battery applications especially in electric cars and stationary energy storage such as for load leveling and green energy (solar, wind, tide) storage applications.

Methods and devices according to various embodiments may be based on thermodynamics data acquisition and analyses that allow to assess the mode (or causes) of battery ageing, for the first time, addressed to as "battery history"

According to various embodiments, devices and methods may use the fact that batteries keep traces of different conditions they experienced during their operation life which lead to their ageing. These act as a "memory effect" allowing us to unveil battery history, for the first time.

For instance, the methods and devices according to various embodiments may distinguish well between thermal ageing, long cycle life ageing and overcharge ageing as they all bear different thermodynamics characteristics signature.

The methods and devices according to various embodiments may be based on thermodynamics, and may provide nondestructiveness and universality and may allow for real time data acquisition and analysis, and furthermore may be easy to implement and may allow to access additional battery data crucial for battery performance and safety.

According to various embodiments, battery diagnosis tools for enhanced performance and safety may be provided.

According to various embodiments, thermodynamics of lithium-ion batteries may be considered.

Thermodynamics techniques and methods may be useful to understand the behavior of anode, cathode and full lithium-ion batteries (LIB or LiB) during charge and discharge and during overcharge and thermal ageing. A LIB cell consists of an anode and a cathode, which reversibly incorporate lithium ions in their host structures <H>, following a general schematic equation:

$$<H> + xLi^+ + xe^- \rightleftharpoons <Li_xH> \quad (1)$$

where 'x' is the electrode and/or cell reaction advancement rate ($0 \leq x \leq 1$).

The change in the cell's free energy $\Delta G(x)$ relates to the cell's open-circuit potential (OCP) $E_0(x)$ according to:

$$\Delta G(x) = -nFE_0(x) \quad (2)$$

where n=number of the transferred ions (here n=1 for Li$^+$) and F=Faraday's constant.

The cell potential at equilibrium $E_0(x)$ is given by:

$$E_0(x) = E_0^+(x) - E_0^-(x) \quad (3)$$

where $E_0^+(x)$, $E_0^-(x)$ denote the cathode and anode potentials, respectively.

$\Delta G(x)$ also relates to changes in enthalpy $\Delta H(x)$ and entropy $\Delta S(x)$ at defined electrode composition according to:

$$\Delta G(x) = \Delta H(x) - T\Delta S(x) \quad (4)$$

By deriving Eq.2 vs. T at constant reaction advancement rate (x) and pressure (p) one obtains:

$$\Delta S(x) = F\left(\frac{\partial E_0(x,T)}{\partial T}\right)_{x,p} \quad (5)$$

$$\Delta H(x) = -F\left(E_0(x,T) + T\left(\frac{\partial E_0(x,T)}{\partial T}\right)_{x,p}\right) \quad (6)$$

wherein T may be the temperature and p the pressure.

According to Equations 4 and 5, the measurement of the temperature dependence of $E_0(x)$ at different x values enables $\Delta S(x)$ and $\Delta H(x)$ to be assessed and their profile to be plotted versus x and OCP ($E_0(x)$). According to various embodiments, we found entropy and enthalpy profiles to be particularly powerful in revealing features at well-defined x and OCP such as maxima and minima values, which can barely be detected in the OCP profiles. The reason for such a higher detection capability is because $\Delta S(x)$ and $\Delta H(x)$ take into account an important thermodynamic parameter, i.e. temperature (T). By varying T by a few degrees enables revealing subtle changes in the crystallographic and electronic structures of the electrode materials according to their energy density of states. Since entropy is highly sensitive to disorder, it provides a more detailed information on the changes taking place in the materials structure during the cycling and ageing processes.

Configurational entropy, which is the dominating component of the total entropy in chemical processes, besides vibrational and electronic entropy, can be expressed by:

$$S(x) = -k[x \ln x + (1-x)\ln(1-x)] \quad (7)$$

where k is the Boltzmann's constant.

The change in entropy $\Delta S(x)$ derives from Eq. 7 according to:

$$\Delta S(x) = \left(\frac{\partial S(x)}{\partial x}\right)_{T,p} = -k\ln\frac{x}{1-x} \quad (8)$$

$\Delta S(x)$ should increase tremendously in absolute values at phase transitions composition around x=0 and x=1. These transitions are unique characteristics of electrode materials since they describe their phase diagram. Accordingly, thermodynamics methods and techniques show to be very efficient and non-destructive tools to characterize cells chemistry, state of health, state of charge and cycle history.

Most batteries are thermodynamically metastable because one or two electrodes develop an electric potential falling outside the potential stability window of the electrolyte. This means that the anode and/or the cathode should be oxidized and reduced by the electrolyte molecules, respectively. Still, batteries are stabilized for kinetics reasons as the electrode and electrolyte reactions are hindered by passivation, considerably slowing their kinetics. For example the growth of a passivating solid electrolyte interphase (SEI) on the graphite anode in LiB plays a major role in the LiB stability.

According to various embodiments, the thermodynamics characterization of lithium ion cells in the process of ageing may be provided. Three methods were applied to accelerate the cells ageing:

(1) Overcharge up to 4.9 V as compared to the usual end of charge cut-off voltage (COV) of 4.2 V;

(2) Thermal ageing under which the cells are stored at 60° C. and 70° C. in their initial charged state at 4.2 V; and (3) C/2-rate cycling at the ambient temperatures for up to 1000 cycles.

The entropy and enthalpy profiles evolution with ageing will be discussed. Furthermore, it will be shown how, according to various embodiments, thermodynamics allow to proactively determine the kind of ageing mode batteries experienced and a new concept of LiB ageing memory according to various embodiments will be described.

In the following, thermodynamics measurements, procedure and equipment according to various embodiments will be described.

For example lithium ion batteries of coin cell form factor (2032), rated 44 mAh may be used in a study. Whatever is the nature of the ageing mode, thermodynamics measurements may be performed using a battery analyzer BA-1000® (produced by KVI PTE LTD, Singapore). BA-1000 equipment displayed in FIG. 1C consists of three major parts:

(1) A temperature controlled battery holder capable of hosting up to four cells, (2) A potensiostat-galvanostat system with high accuracy potential and current measurement capability, and (3) A computer loaded with software to execute the thermodynamics measurements steps, collect and process the data.

Figure 1C:
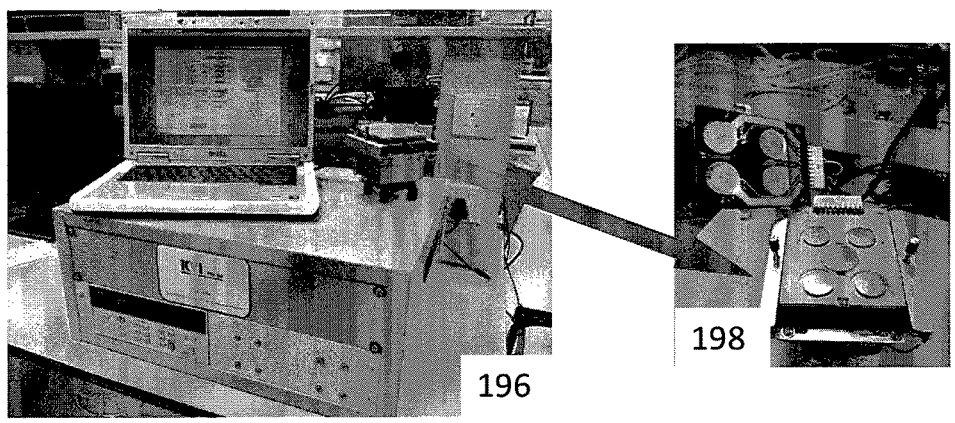
FIG. 1C shows an equipment used to perform thermodynamics measurements with a central unit with a potentiostat/galvanostat, and a Coin cells holder.

FIG. 1C shows an equipment used to perform thermodynamics measurements with a central unit 196 with a potentiostat/galvanostat, and a Coin cells holder 198.

The cells undergo a discharge to 2.75 V followed by a charge to 4.2 V and a second discharge to 2.75 V under a galvanostatic regime of 9 mA. During this conditioning step, the battery analyzer assesses the cells' capacity q (mAh). The thermodynamics measurements program then starts stepwise. At each step, the state charge (SOC) is increased by 5% by applying a constant current of C/6 (~6 mA) for 18 minutes, followed by a potential rest of 30 minutes during which the cells OCP rests to equilibrium. The cells temperature is then decreased from ambient to about 10° C. by 5° C. increments for 30 minutes, whereas the OCP is monitored. After the last temperature step at 10° C. is completed the temperature is left to rise to ambient then an additional 5% increment is applied to the SOC. According to this procedure, a total of twenty one OCP, entropy and enthalpy data are collected on each cell. Occasionally, at the end of charge of 4.2 V, a thermodynamics measurements program is run during discharge under similar conditions as for charge, except for the current sign. For each thermodynamics measurements applied to four cells, we found the $E_0(x)$, $\Delta S(x)$ and $\Delta H(x)$ profiles during charge and discharge quasi-identical. Therefore, only the data during charge will be described herein.

In the following, thermodynamics data before ageing and cell chemistry assessment according to various embodiments will be described.

Figure 2:
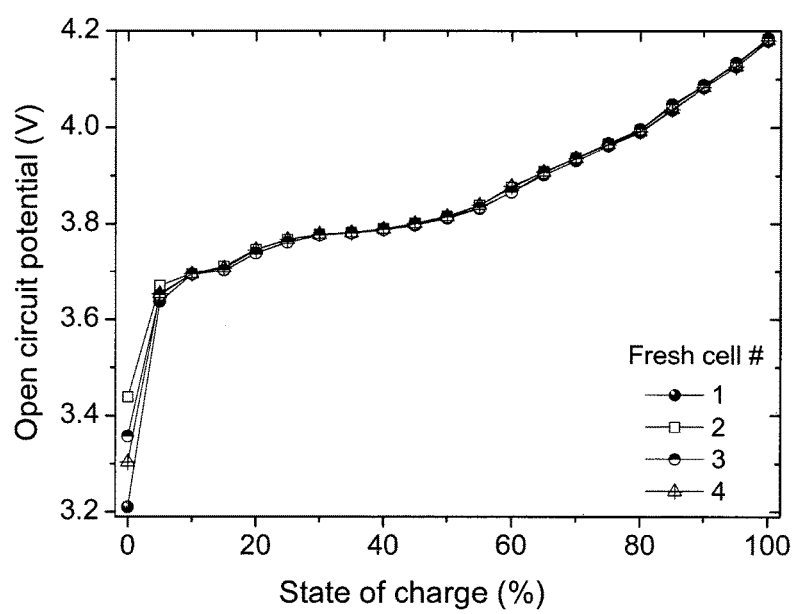
FIG. 2 shows OCP vs. SOC profiles of uncycled (fresh) cells during charge.

FIG. 2 shows OCP vs. SOC profiles of uncycled (fresh) cells during charge.

FIG. 2 shows the OCP vs. SOC profile of four fresh LiB cells during charge. The OCP data points fall on top of each other in the whole SOC range of 5%-100% proving excellent reproducibility. The only noticeable difference occurs at SOC=0%. This may be due to small differences in lithium composition in the graphite anode $Li_\epsilon C_6$, $\epsilon$~0, where the anode potential varies considerably with $\epsilon$. A change in sign in the OCP curvature occurs around SOC of 55%.

FIG. 2 shows three OCP areas where the OCP profile has a different behavior: (a) 5%-25%; (b) 25%-55%, and (c) 55%-100%. However, the OCP profile is too smooth to allow for unequivocally identifying onsets of phase transitions in the anode and cathode, where the OCP is expected to make a step or a plateau.

Figure 3:
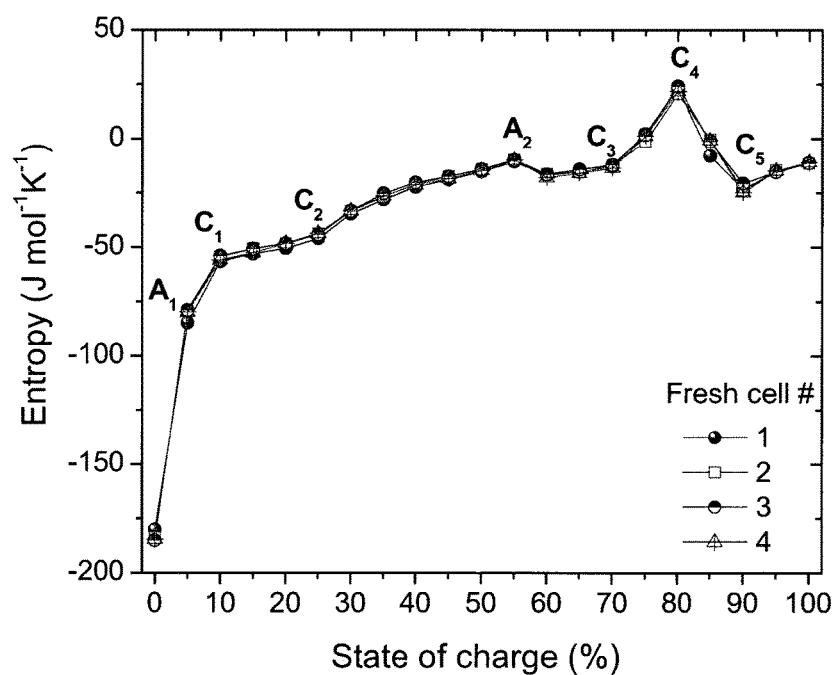
FIG. 3 shows Entropy vs. SOC profiles of uncycled (fresh) cells during charge. A1 and A2 data points correspond to onsets of phase transitions in the graphite anode and C1 to C5 correspond to phase transition onsets in the LCO cathode.

FIG. 3 shows Entropy vs. SOC profiles of uncycled (fresh) cells during charge. A1 and A2 data points correspond to onsets of phase transitions in the graphite anode and C1 to C5 correspond to phase transition onsets in the LCO cathode.

Figure 4:
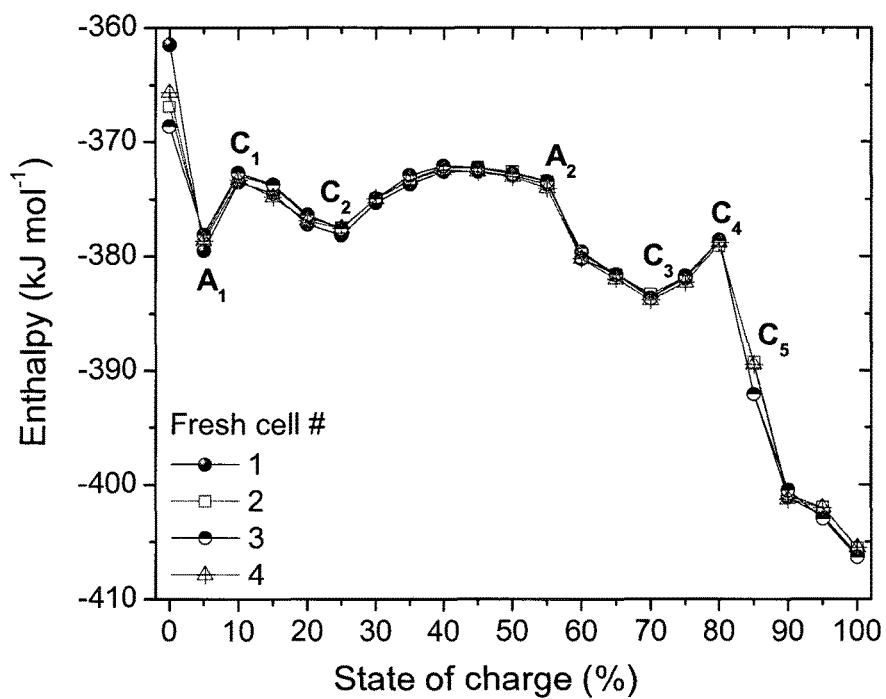
FIG. 4 shows Enthalpy vs. SOC profiles of uncycled (fresh) cells during charge. A1 and A2 data points correspond to onsets of phase transitions in the graphite anode and C1 to C5 correspond to phase transition onsets in the LCO cathode.

FIG. 4 shows Enthalpy vs. SOC profiles of uncycled (fresh) cells during charge. A1 and A2 data points correspond to onsets of phase transitions in the graphite anode and C1 to C5 correspond to phase transition onsets in the LCO cathode.

In contrast to the OCP profiles, entropy and enthalpy profiles displayed in FIG. 3 and FIG. 4, respectively show peaks, minima and changes in slopes. Several particular SOC values can be identified in both $\Delta S$ and $\Delta H$ curves denoted $A_1$, $A_2$ and $C_1$ to $C_5$, which are associated with onsets of phase transition in a graphitic anode ($A_1$, $A_2$) and in lithium cobalt oxide (LCO) cathode (from $C_1$ to $C_5$). These particular data points may be tribute to the following phase transitions, schematically represented by the $\leftrightarrow$ sign:

$A_1$: graphite $\leftrightarrow$ dilute stage-1; i.e. $Li_\epsilon C_6$ compound, $\epsilon$~0.05.

$A_2$: stage-2 $\leftrightarrow$ stage-1 compound around x=0.5 in $Li_x C_6$.

$C_1$: one phase (O3I) $\leftrightarrow$ two phases (O3I+O3II) in LCO $C_2$: two-phase hexagonal (O3I+O3II) $\leftrightarrow$ one-phase (O3II).

$C_3$: hexagonal one-phase (O3II) $\leftrightarrow$ monoclinic $C_4$: monoclinic $\leftrightarrow$ O3II'

$C_5$: hexagonal (O3II') $\leftrightarrow$ hexagonal ($O_3$).

Accordingly, the thermodynamics analysis method according to various embodiments enables revealing the chemistry of the cells used in this study. It consists of a graphite anode and LCO cathode.

This method can easily be applied to other LiB chemistries as phase transitions and transformations in the anode and cathode, when they occur, provide a fingerprint characteristic of each one of the electrodes material.

In the following, thermodynamics of overcharged cells will be described.

There may be recommended ranges of cell' potential, temperature and charge and discharge currents to insure the good operation of rechargeable batteries. Outside these ranges, batteries undergo fast irreversible processes which accelerate ageing. The later includes lower discharge capacity and discharge potentials and higher internal resistances. Accordingly, the cycle-life is therefore shorter.

Equation 3 gives the cell's potential at equilibrium $E_0(x)$, i.e. at open-circuit when no current is flowing in the cell. Under a charge and discharge currents 'i' the cell potential $E_i$ departs from $E_0$ owing to anode and cathode overpotentials, $\eta_a$ and $\eta_c$, respectively and to ohmic drops R|i|.

$$E_i = E_0 \pm (|\eta_a| + |\eta_c| + R|i|) \quad (9)$$

wherein the ± sign is + during charge and − during discharge.

During the cell' overcharge, part of the irreversible energy $-|\eta_a|F$ and $-|\eta_c|F$ may be used to overcome the activation energy of anode and cathode degradation, respectively and of electrolyte anodic oxidation and cathodic reduction reactions, which account for the cell' self-discharge and ageing.

In the following, an overcharge ageing method will be described.

Cells were charged galvanostatically under a 10 mA rate up to a fixed cut-off voltage (COV) comprised between 4.2 V and 4.9 V. For each set of tests, four new cells were used and the COV is increased by 0.1 V. Accordingly different cells were charged to 4.2V, 4.3V and so on up to 4.9V. The cells were then discharged to 2.75 V and charged to 4.2 V followed by a discharge to 2.75 V under 9 mA. The cells were then transferred to the battery assessment system to run a thermodynamics measurements test.

In the following, discharge characteristics (for example of cells) will be described.

Figure 5:
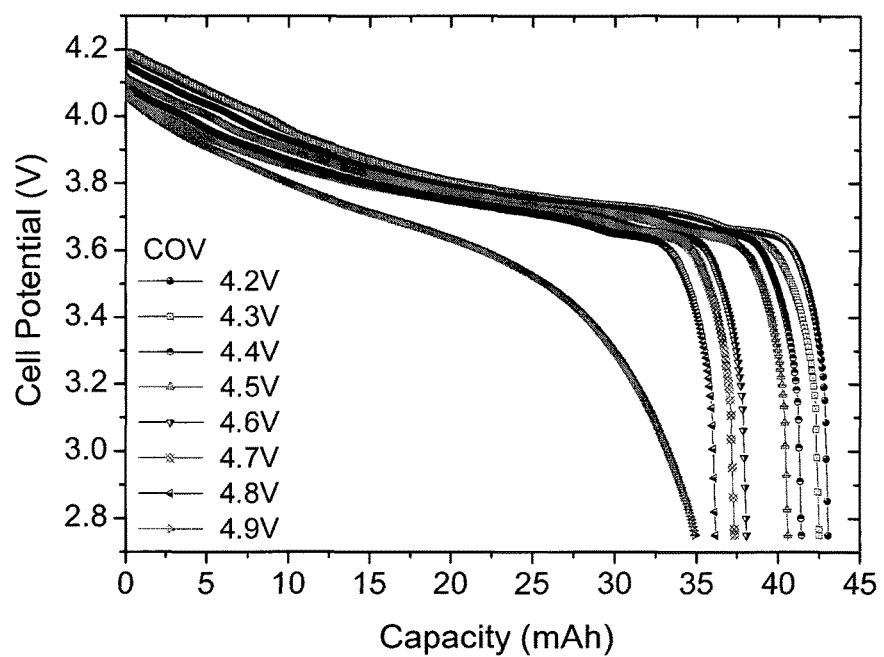
FIG. 5 shows discharge profiles of LiB cells subjected to different charge cut-off voltages (COV)

FIG. 5 shows discharge profiles of LiB cells subjected to different charge cut-off voltages (COV).

Table 1 shows discharge data of LiB cells vs. cut of voltage (COV); $q_{CL}$, $<e_d>$ and $\varepsilon_d$ refer to discharge capacity, discharge capacity loss, average discharge voltage and discharge energy, respectively.

TABLE 1

| COV (V) | $q_d$ (mAh) | $q_{CL}$ (%) | $<e_d>$ (V) | $\varepsilon_d$ (mWh) |
|---|---|---|---|---|
| 4.2 (fresh cell) | 43.07 | 0 | 3.82 | 164 |
| 4.3 | 42.51 | 1.30 | 3.81 | 162 |
| 4.4 | 41.44 | 3.78 | 3.80 | 157 |
| 4.5 | 40.62 | 5.69 | 3.78 | 153 |
| 4.6 | 38.09 | 11.56 | 3.77 | 143 |

TABLE 1-continued

| COV (V) | $q_d$ (mAh) | $q_{CL}$ (%) | $<e_d>$ (V) | $\varepsilon_d$ (mWh) |
|---|---|---|---|---|
| 4.7 | 37.35 | 13.28 | 3.76 | 140 |
| 4.8 | 36.16 | 16.04 | 3.77 | 136 |
| 4.9 | 34.90 | 18.97 | 3.62 | 126 |

FIG. 5 shows discharge profiles of cells of different COV whereas the discharge results are displayed in Table 1. Table 1 includes discharge capacity $q_d$, capacity loss $q_{CL}$, average discharge potential $<e_d>$ and discharge energy output, $E_d = q_d \times <e_d>$.

The cells incurred a large capacity loss between 4.5 V and 4.6 V COV, suggesting and important electrode and/or electrolyte materials degradation has taken place within this COV range.

We found an empirical relationship between capacity loss and COV with a good fit, which accounts for non-linearity:

$$q_{CL}(\%) = 35.47 - 40.12(COV) + 7.56(COV)^2 \qquad (10)$$

Moreover, a large drop in $<e_d>$ occurs at COV of 4.9 V, perhaps due to a combined materials degradation and increase in the cell' internal resistance.

In the following, OCP profiles will be described.

Figure 6:
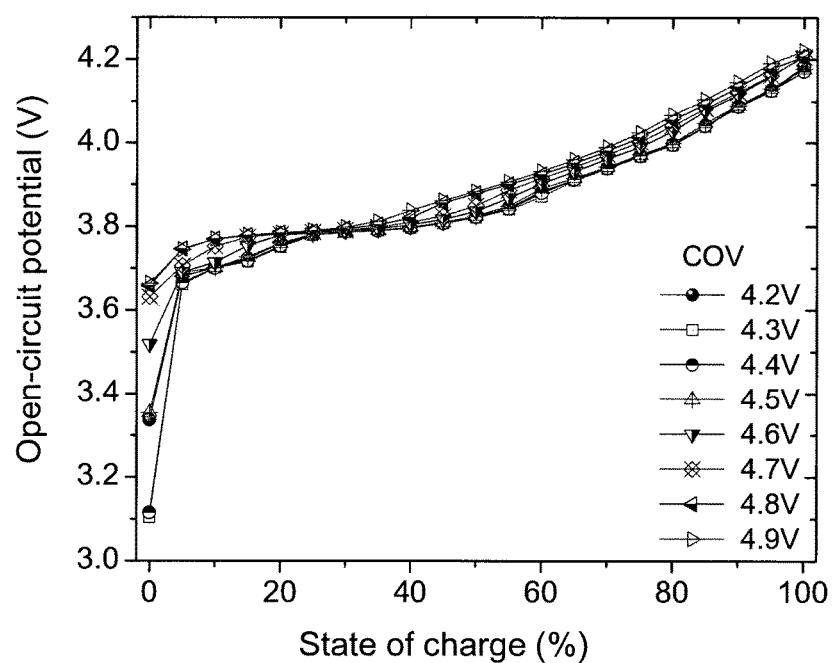
FIG. 6 shows OCP profiles of LiB cells vs. SOC. Cells were subjected to different COV.

FIG. 6 shows OCP profiles of LiB cells vs. SOC. Cells were subjected to different COV.

FIG. 6 shows the OCP vs. SOC profiles of cells overcharged to different COV. The OCP data are more scattered than those in FIG. 2 before ageing. Data scattering is a sign of the overcharge effects on the cells thermodynamics behavior. The OCP value at SOC=0 varies significantly upon COV. This is attributed to residual lithium in the graphite anode and/or to lithium deficiencies in the LCO cathode. Above 5% SOC, slight differences appeared in the OCP profiles. However, there is no particular SOC value or range where significant OCP changes can be observed as COV increases. Therefore, OCP profiles may not be used to characterize cells aged at different COV with enough high resolution.

In the following, entropy and enthalpy profiles will be described.

Figure 7:
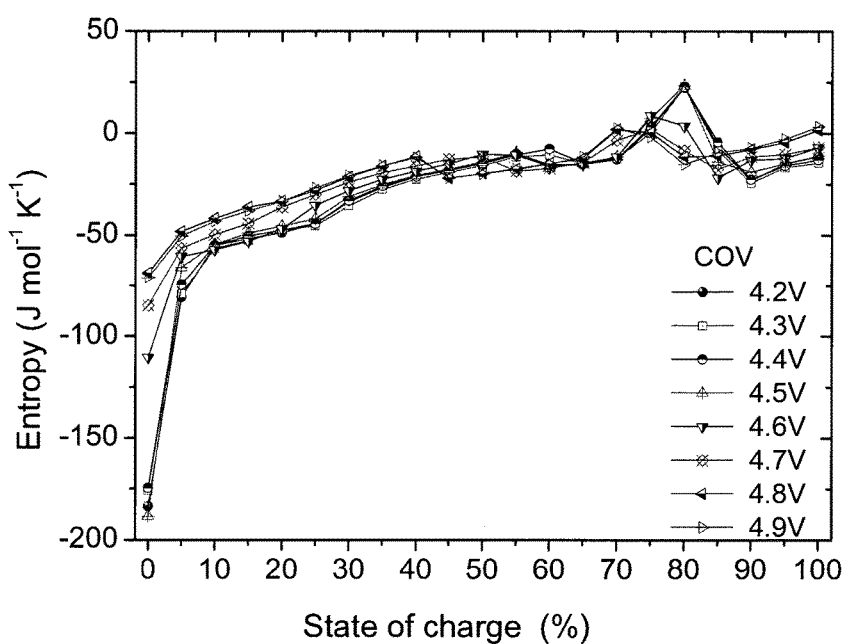
FIG. 7 shows entropy profiles of overcharged LIB cells vs. SOC at different COV.

FIG. 7 shows entropy profiles of overcharged LIB cells vs. SOC at different COV.

Figure 8:
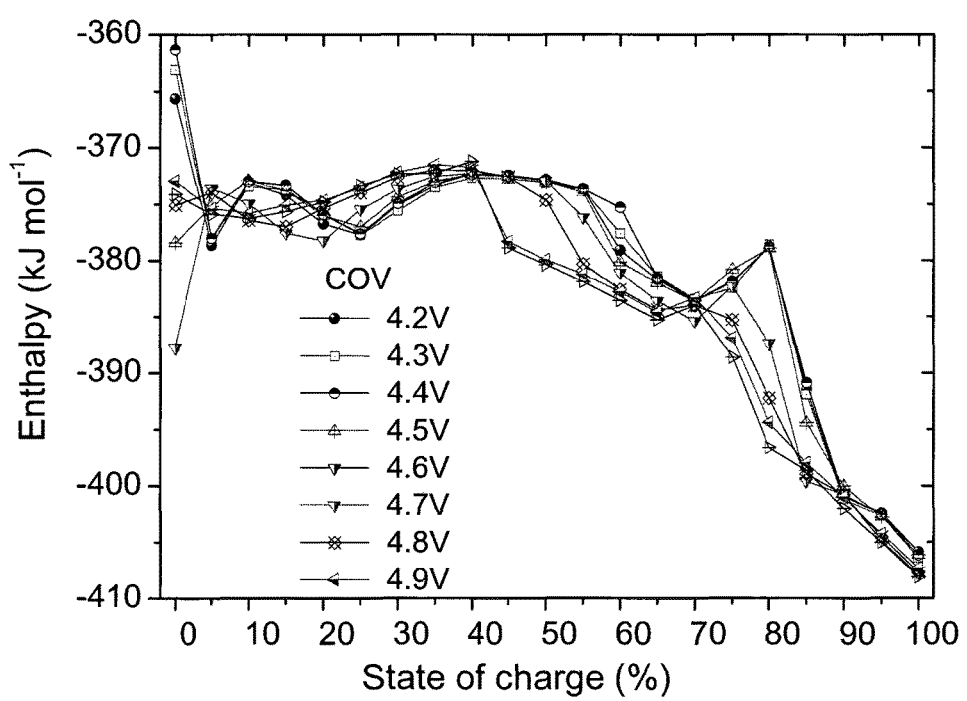
FIG. 8 shows enthalpy profiles of overcharged LIB cells vs. SOC, at different COV.

FIG. 8 shows enthalpy profiles of overcharged LIB cells vs. SOC, at different COV.

Figure 9:
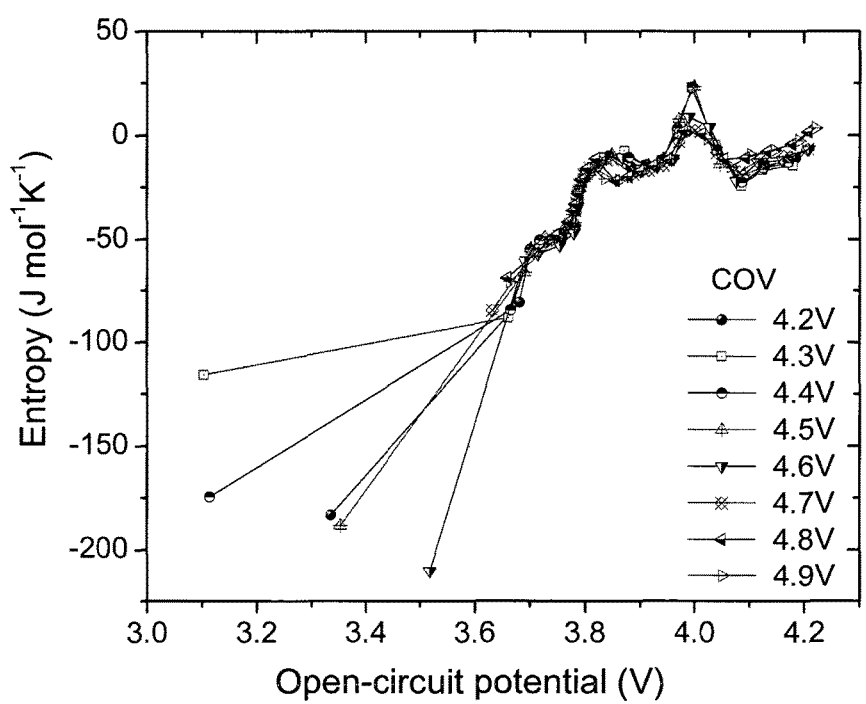
FIG. 9 shows entropy profiles of overcharged LIB cells vs. OCP, at different COV.

FIG. 9 shows entropy profiles of overcharged LIB cells vs. OCP, at different COV.

Figure 10:
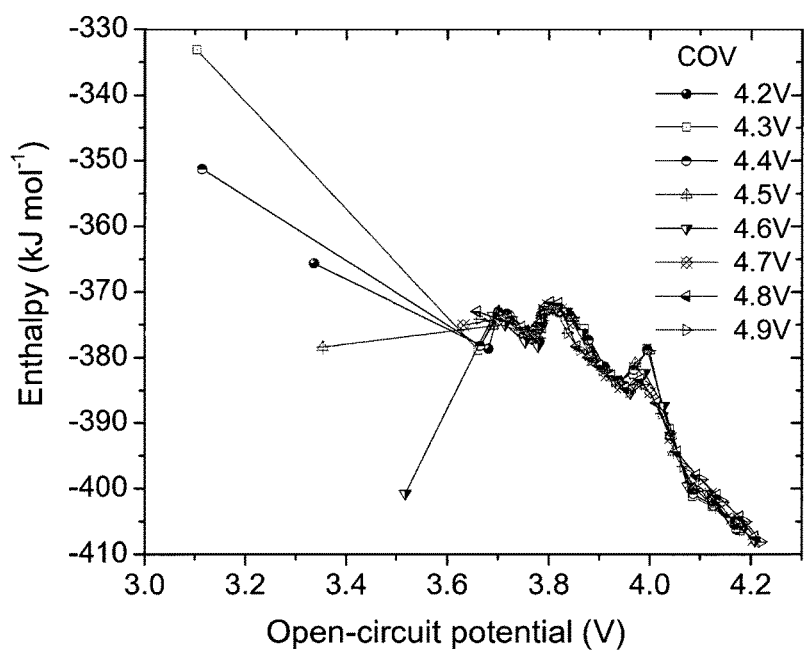
FIG. 10 shows enthalpy profiles of overcharged LIB cells vs. OCP, at different COV.

FIG. 10 shows enthalpy profiles of overcharged LIB cells vs. OCP, at different COV.

FIG. 7 and FIG. 8 show the entropy and enthalpy profiles vs. SOC of cells overcharged to different COV, respectively. FIG. 9 and FIG. 10 show the similar data plotted vs. OCP, respectively. Entropy and enthalpy profiles of FIG. 7 and FIG. 8 show significant changes more particularly in the following SOC domains: 0 to 5%, 40 to 65% and 65 to 90%. The data at 80% SOC where both the entropy and enthalpy traces make a peak are strongly COV dependent. A large variation in entropy and enthalpy data may be used to better characterize overcharged as compared to the OCP ones in FIG. 6.

We also found significant changes in the $\Delta S$ and $\Delta H$ data vs. OCP in FIG. 9 and FIG. 10 at OCP=3.87 V and OCP=3.94 V. Therefore, we have used these particular OCP values for accurate characterization of aged cells. To achieve this task, cells were charged gavanostatically to 3.87 V and 3.94 V then a potential plateau was applied a constant voltage was applied at 3.87 V and 3.94 V, respectively until the current drops below C/100 (~400 μA). Then a thermodynamics test was run to measure entropy and enthalpy around 3.87 V and 3.94 V OCP values.

Figure 11:
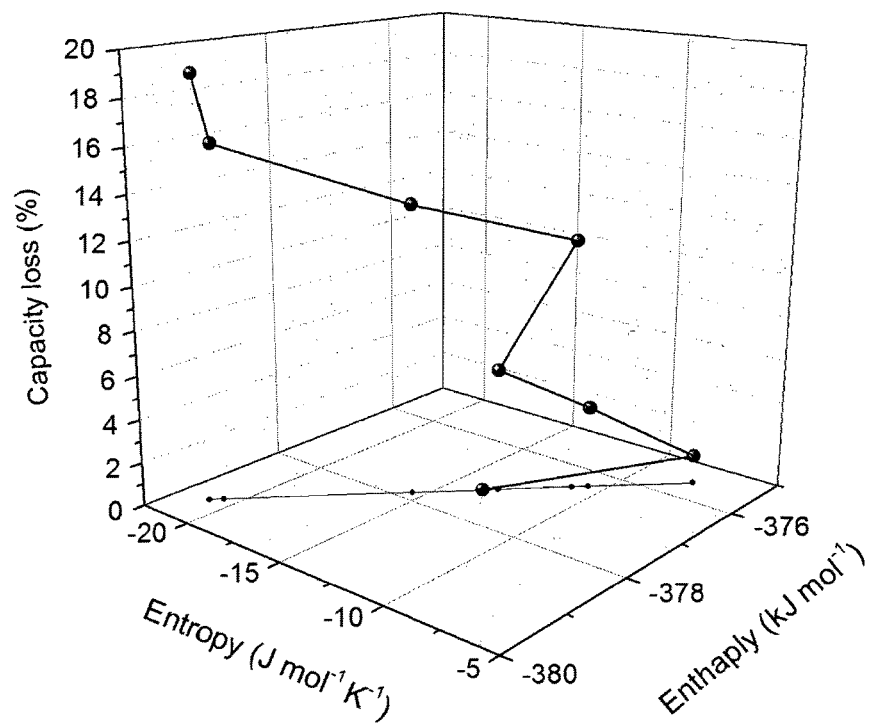
FIG. 11 shows a 3D ($\Delta S$, $\Delta H$, $q_{CL}$) plot at 3.87V OCP of LIB overcharged cells, at different COV.

FIG. 11 shows a 3D ($\Delta S$, $\Delta H$, $q_{CL}$) plot at 3.87V OCP of LIB overcharged cells, at different COV.

FIG. 11 is a 3D ($\Delta S$, $\Delta H$, $q_{CL}$) plot of data achieved at OCP=3.87 V on cells overcharged to different COV. In fact, capacity loss $q_{CL}$ increases with COV as displayed in Table 1 and in Equation 9.

Figure 12:
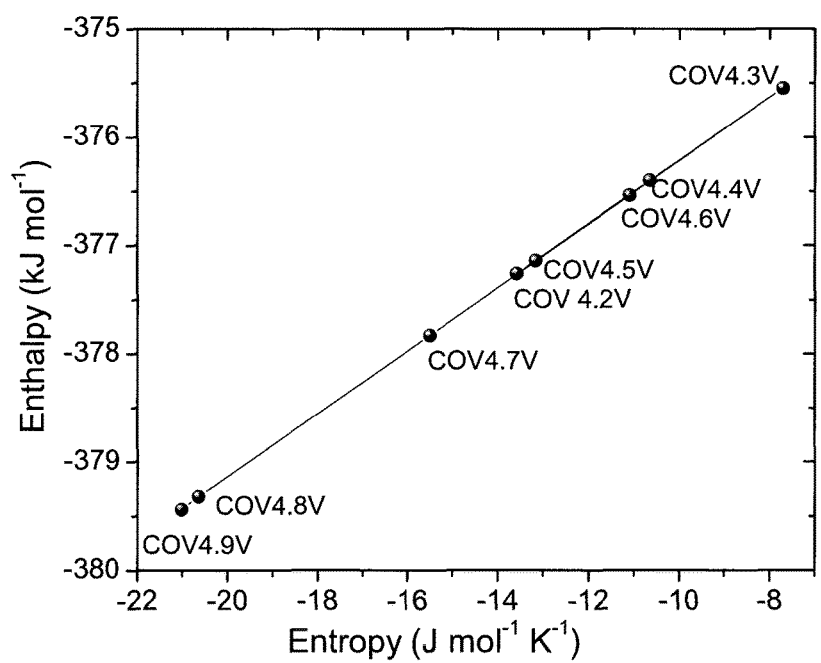
FIG. 12 shows a 2D projected curve on the ($\Delta S$, $\Delta H$) plane at 3.87V OCP of LIB overcharged cells at different COV.

FIG. 12 shows a 2D projected curve on the ($\Delta S$, $\Delta H$) plane at 3.87V OCP of LIB overcharged cells at different COV.

FIG. 12 is the 2D projection of the $q_{CL}$ trace of FIG. 11 on the ($\Delta S$, $\Delta H$) plane. As expected, all COV dependent $q_{CL}$ data fall on the same strait line in the since at constant OCP, $\partial \Delta H / \partial \Delta S$ is equal to T, which is the slope of the straight line of FIG. 12.

With increasing COV, the equipotential line drawn on the free energy surfaces takes different values making it possible to clearly distinguish between cells aged at different COV.

Figure 13:
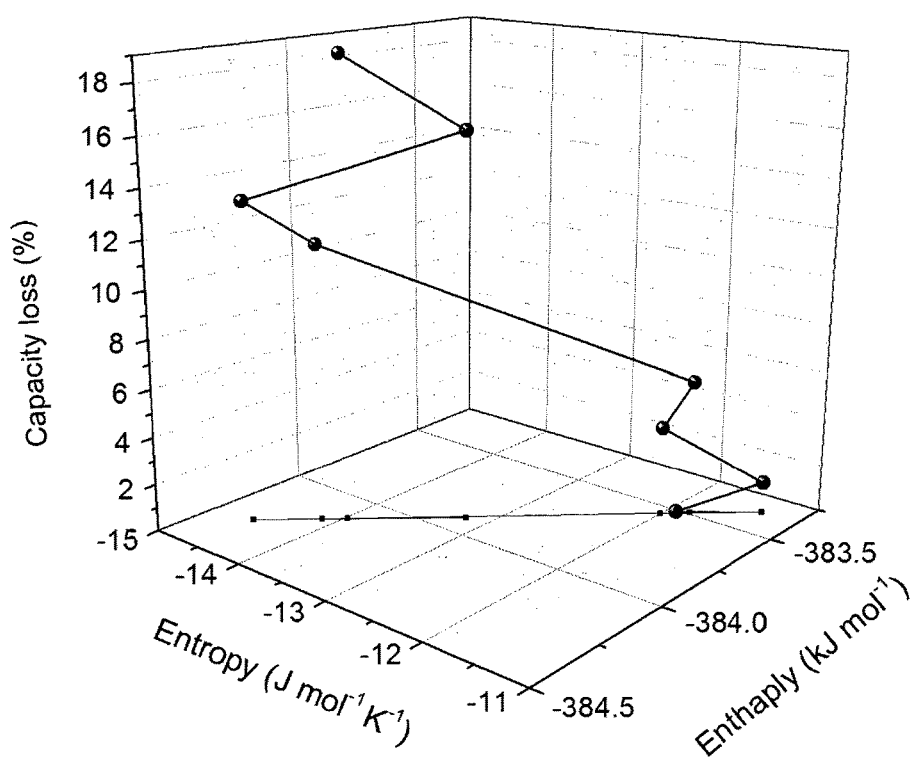
FIG. 13 shows a 3D ($\Delta S$, $\Delta H$, $q_{CL}$) plot at 3.94V OCP of LIB overcharged cells at different COV.
Figure 14:
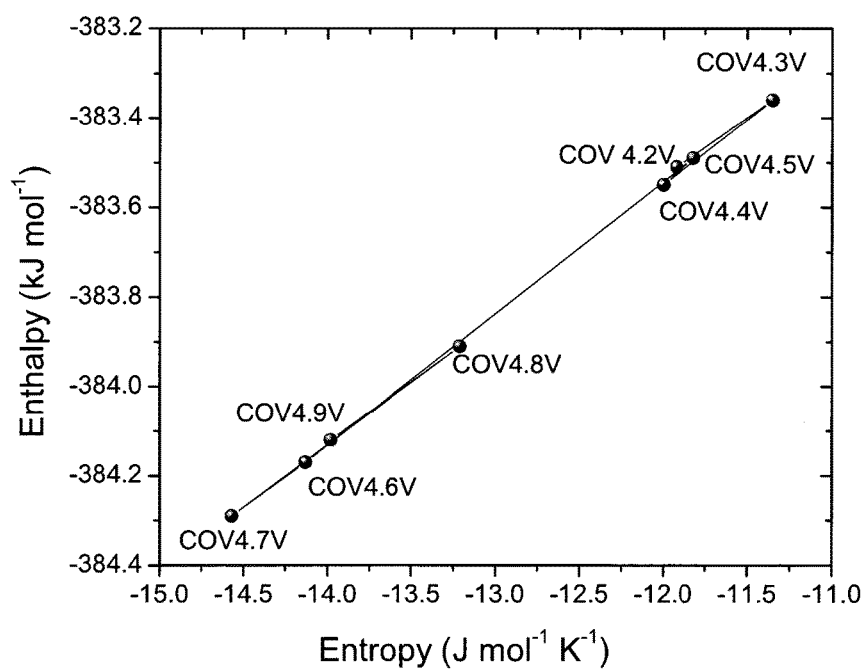
FIG. 14 shows a 2D projected curve on the ($\Delta S$, $\Delta H$) plane at 3.94V OCP of LIB overcharged cells at different COV.

Similar results are obtained with OCP=3.94 V as displayed in FIG. 13 and FIG. 14 of the 3D and projected curves, respectively.

FIG. 13 shows a 3D ($\Delta S$, $\Delta H$, $q_{CL}$) plot at 3.94V OCP of LIB overcharged cells, overcharged cells at different COV.

FIG. 14 shows a 2D projected curve on the ($\Delta S$, $\Delta H$) plane at 3.94V OCP of LIB overcharged cells, overcharged cells at different COV.

The reason why OCP values of 3.87 V and 3.94 V are so particular is because they are the actual potentials at which the graphite anode and the LCO cathode undergo specific phase transitions, respectively. Particular OCP where changes in entropy and enthalpy are more significant are more sensitive to ageing, and accordingly, they can be used as metrics to assess the cell chemistry and its state of health including during overcharge, allowing for a high resolution of the COV effect on ageing to be achieved.

In the following, thermodynamics of thermally aged cells will be described.

Thermal ageing is another method to accelerate cells ageing. Thermally activated electrode and electrolyte degradation processes, including irreversible phase transformations, electrode surface passivation, electrode dissolution and precipitation and electrolyte oxidoreduction account for most of the cell' self-discharge and storage performance decays. In addition to temperature, the other important controlling parameters of cell' ageing are the starting state of charge and the state of health (calendar life). The higher the state of charge and the lower the state of health, the faster is the cell ageing.

In the following, a thermal ageing method will be described.

Fresh cells were cycled between 2.75 V and 4.2 V at 10 mA (~C/4 rate) for four cycles then cells were charged to 4.2 V and stored in an oven at 60° C. and 70° C. for a period of time up to 8 weeks. At the end of each week, four cells were retrieved and tested by galvanostatic charge and discharge and by thermodynamics measurements.

In the following, discharge characteristics will be described.

Figure 15A:
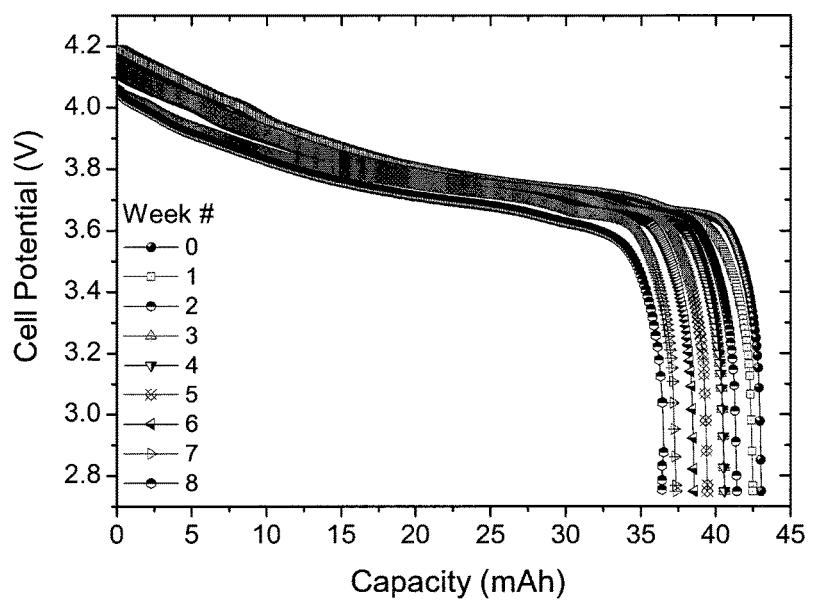
FIG. 15A shows discharge profiles of LiB cells subjected to thermal ageing at 60° C. for 0-8 weeks.

FIG. 15A shows discharge profiles of LiB cells subjected to thermal ageing at 60° C. for 0-8 weeks.

Figure 15B:
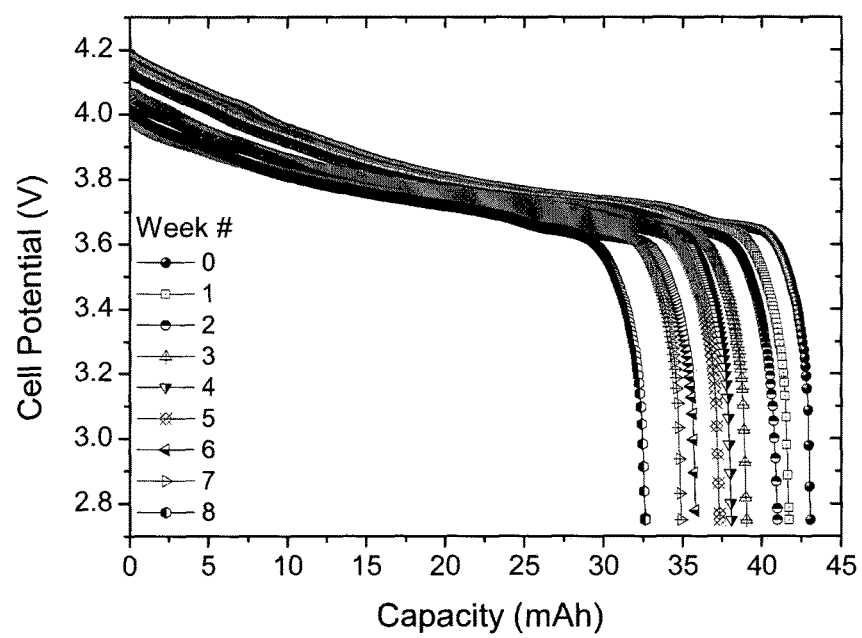
FIG. 15B shows discharge profiles of LiB cells subjected to thermal ageing at 70° C. for 0-8 weeks.

FIG. 15B shows discharge profiles of LiB cells subjected to thermal ageing at 70° C. for 0-8 weeks.

Table 2 shows discharge data of LiB cells aged at 60° C. vs. number of weeks; $q_d$, $q_{CL}$, $<e_d>$ and $\varepsilon_d$ refer to discharge capacity, discharge capacity loss, average discharge voltage and discharge energy, respectively.

Table 3 shows discharge data of LiB cells aged at 70° C. vs. number of weeks; $q_d$, $q_{CL}$, $<e_d>$ and $\varepsilon_1$ refer to discharge capacity, discharge capacity loss, average discharge voltage and discharge energy, respectively.

TABLE 2

| Weeks 60° C. | $q_d$ (mAh) | $q_{CL}$ (%) | $<e_d>$ (V) | $\varepsilon_d$ (mWh) |
|---|---|---|---|---|
| 0 (fresh cell) | 43.07 | — | 3.82 | 164 |
| 1 | 42.95 | 0.28 | 3.79 | 163 |
| 2 | 41.31 | 4.09 | 3.78 | 156 |
| 3 | 40.16 | 6.76 | 3.77 | 151 |
| 4 | 39.98 | 7.17 | 3.77 | 151 |
| 5 | 39.68 | 7.87 | 3.78 | 150 |
| 6 | 38.65 | 10.26 | 3.76 | 145 |
| 7 | 37.66 | 12.56 | 3.75 | 141 |
| 8 | 36.88 | 14.37 | 3.72 | 137 |

TABLE 3

| Weeks 70° C. | $q_d$ (mAh) | $q_{CL}$ (%) | $<e_d>$ (V) | $\varepsilon_d$ (mWh) |
|---|---|---|---|---|
| 0 | 43.07 | — | 3.82 | 164 |
| 1 | 42.06 | 2.35 | 3.79 | 159 |
| 2 | 40.84 | 5.18 | 3.77 | 154 |
| 3 | 38.94 | 9.59 | 3.76 | 146 |
| 4 | 38.00 | 11.77 | 3.76 | 142 |
| 5 | 36.97 | 14.16 | 3.76 | 139 |
| 6 | 35.77 | 16.95 | 3.75 | 134 |
| 7 | 34.93 | 18.90 | 3.74 | 131 |
| 8 | 32.65 | 24.19 | 3.73 | 122 |

FIG. 15A and FIG. 15B show the discharge profiles under a 10 mA rate of cells aged at 60° C. and 70° C., respectively. Tables 2 and 3 summarize the same discharge characteristics ($q_d$, $q_{CL}$, $<e_d>$ and $\varepsilon_d$) as function of number of ageing weeks at 60° C. and 70° C., respectively.

The capacity loss after 8 weeks ageing is −14.4% and 24.2% at 60° C. and 70° C., respectively. The average discharge potential $<e_d>$ is not so much affected by the ageing temperature. This statement supports the active-less active electrode materials model following which the anode and cathode discharge capacity and potentials under mild discharge rates are controlled by the active part still present in the electrode composition. The active part gradually converts to less active as cells aged.

In the following, OCP profiles will be described.

Figure 16A:
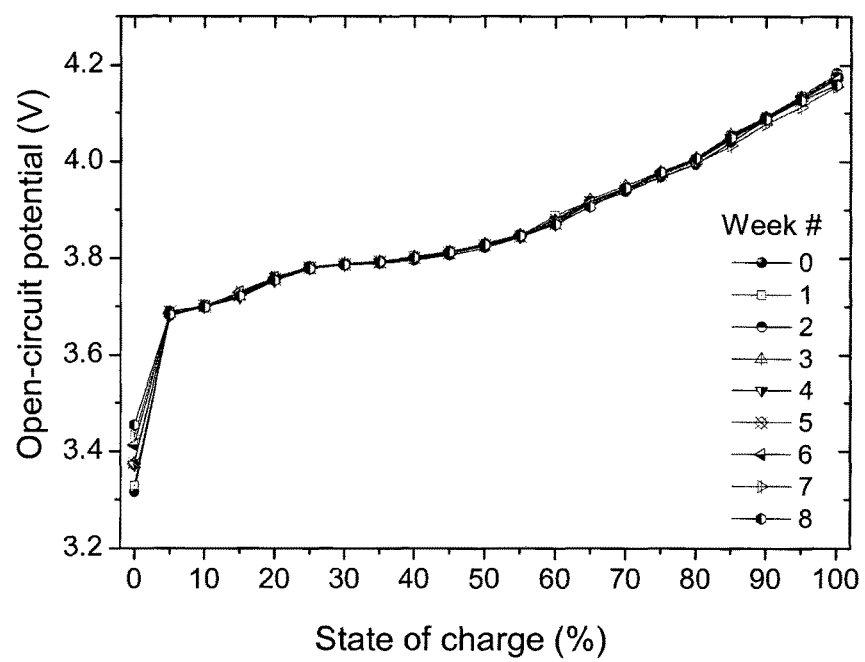
FIG. 16A shows OCP profiles of LIB cells vs. SOC. Cells were subjected to thermal ageing at 60° C. for 0-8 weeks.

FIG. 16A shows OCP profiles of LIB cells vs. SOC. Cells were subjected to thermal ageing at 60° C. for 0-8 weeks.

Figure 16B:
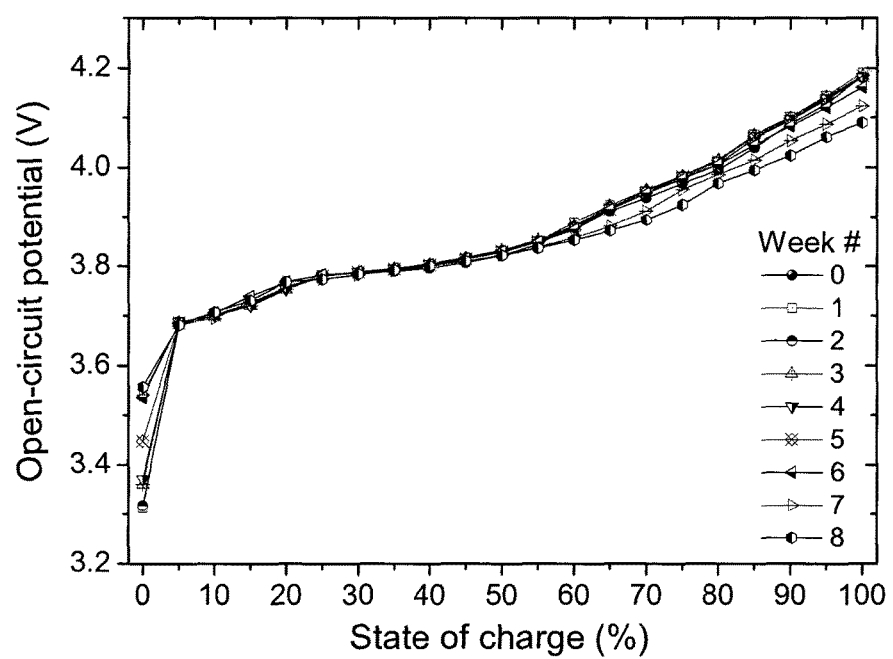
FIG. 16B shows OCP profiles of LIB cells vs. SOC. Cells were subjected to thermal ageing at 70° C. for 0-8 weeks.

FIG. 16B shows OCP profiles of LIB cells vs. SOC. Cells were subjected to thermal ageing at 70° C. for 0-8 weeks.

FIG. 16A and FIG. 16B show the OCP vs. SOC profiles of cells aged for up to 8 weeks at 60° C. and 70° C., respectively. At 60° C. the OCP profiles are not affected by the ageing time, whereas at 70° C., differences in OCP data appeared at SOC>55% as OCP decreases with ageing time. This is attributed to anode and cathode crystal structure degradation resulting from enhanced graphene layer disordering in the graphite anode and the formation of spinel LCO phase in the cathode, both processes being thermally activated.

In the following, entropy and enthalpy profiles will be described.

Figure 17A:
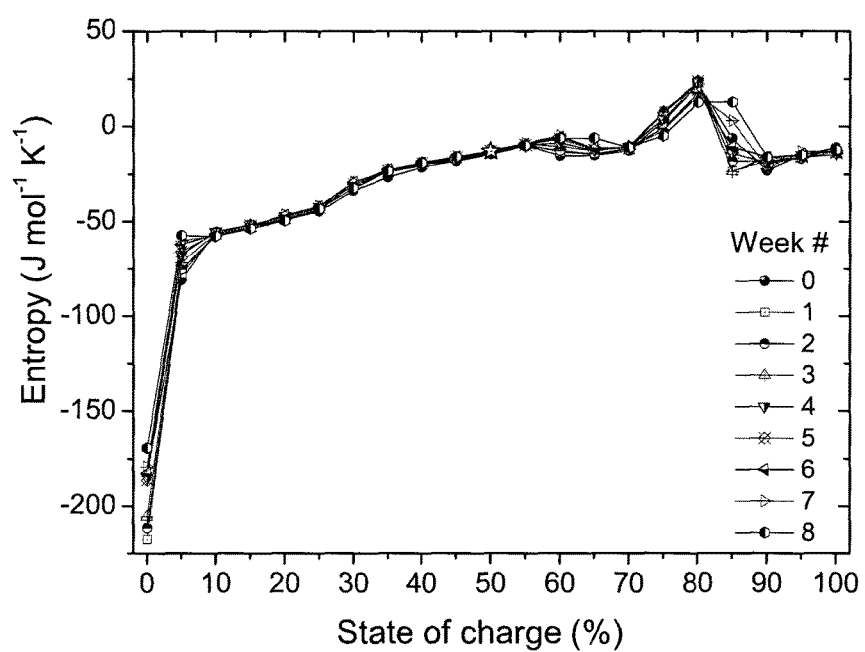
FIG. 17A shows entropy profiles of LIB cells aged at 60° C. vs. SOC for 0-8 weeks.

FIG. 17A shows entropy profiles of LIB cells aged at 60° C. vs. SOC for 0-8 weeks.

Figure 17B:
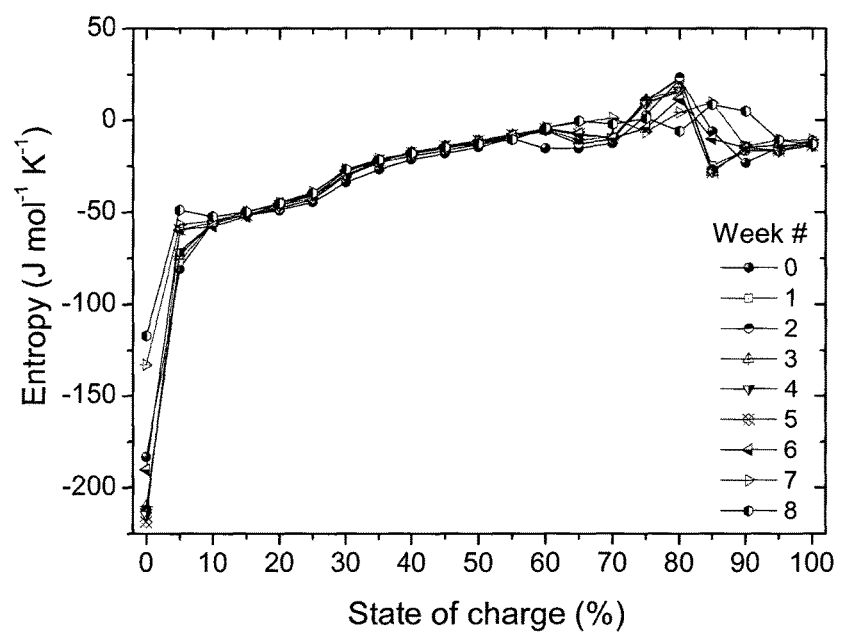
FIG. 17B shows entropy profiles of LIB cells aged at 70° C. vs. SOC for 0-8 weeks.

FIG. 17B shows entropy profiles of LIB cells aged at 70° C. vs. SOC for 0-8 weeks.

Figure 18A:
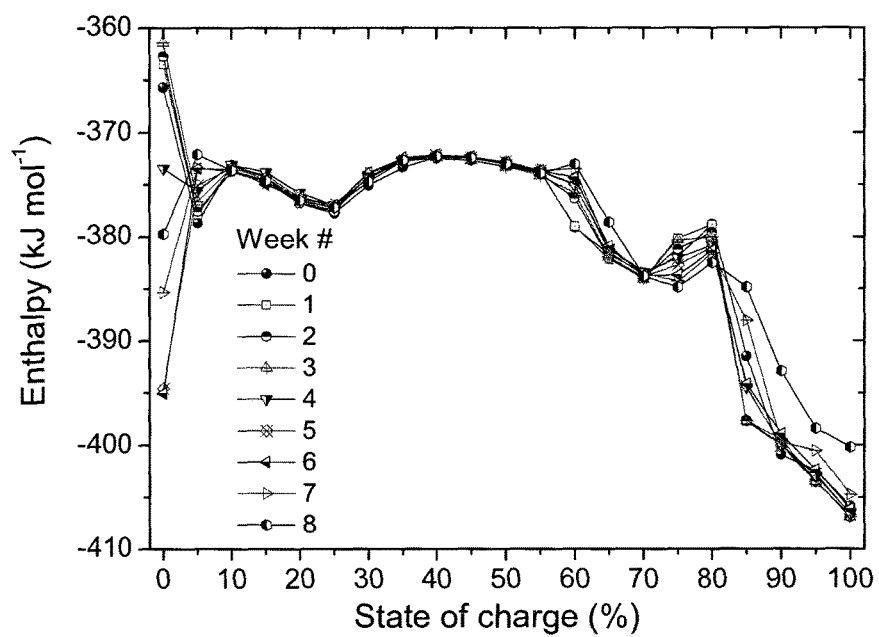
FIG. 18A shows enthalpy profiles of LIB cells aged at 60° C. vs. SOC for 0-8 weeks.

FIG. 18A shows enthalpy profiles of LIB cells aged at 60° C. vs. SOC for 0-8 weeks.

Figure 18B:
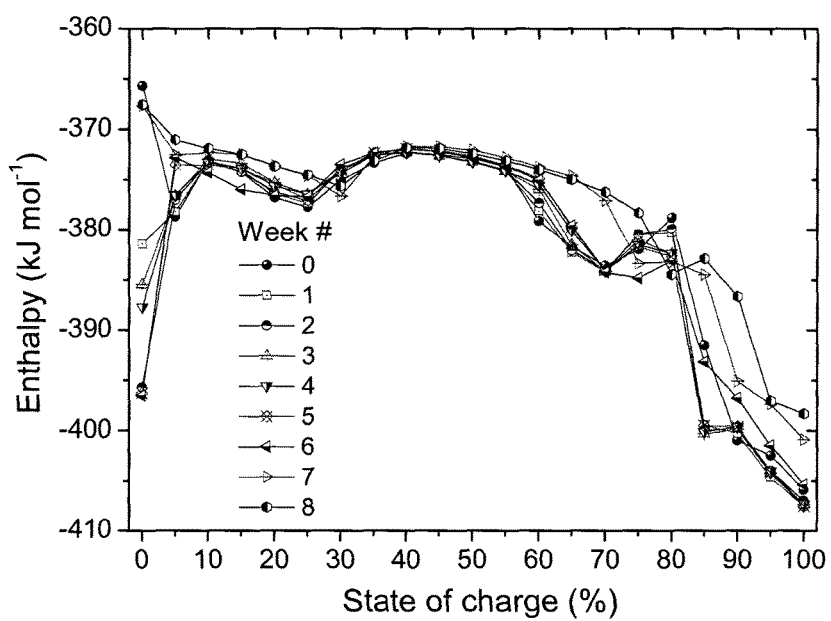
FIG. 18B shows enthalpy profiles of LIB cells aged at 70° C. vs. SOC for 0-8 weeks.

FIG. 18B shows enthalpy profiles of LIB cells aged at 70° C. vs. SOC for 0-8 weeks.

Figure 19A:
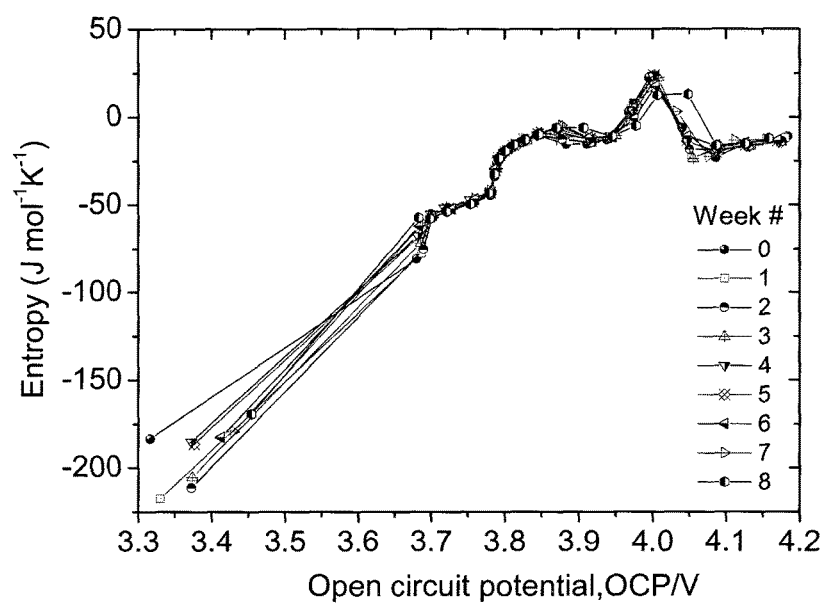
FIG. 19A shows entropy profiles of LIB cells aged at 60° C. vs. OCP for 0-8 weeks.

FIG. 19A shows entropy profiles of LIB cells aged at 60° C. vs. OCP for 0-8 weeks.

Figure 19B:
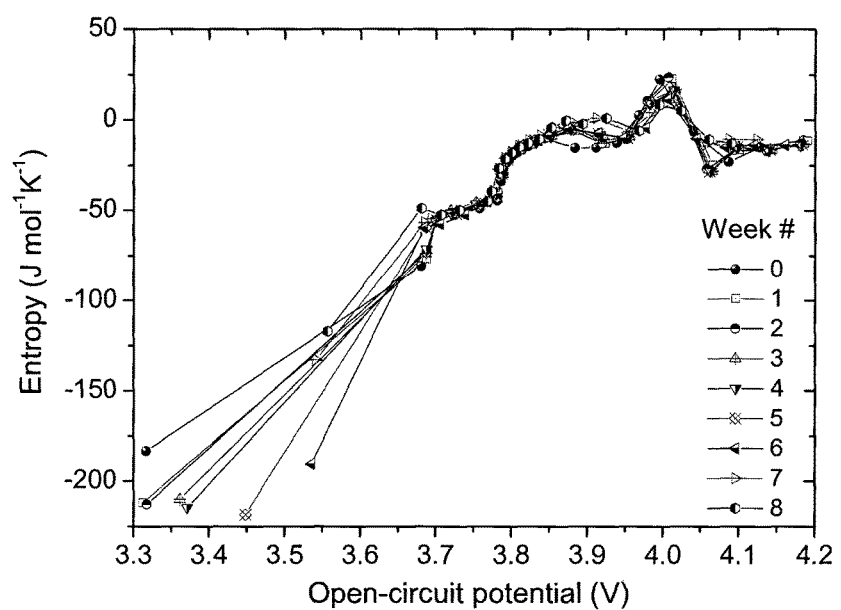
FIG. 19B shows entropy profiles of LIB cells aged at 70° C. vs. OCP for 0-8 weeks.

FIG. 19B shows entropy profiles of LIB cells aged at 70° C. vs. OCP for 0-8 weeks.

Figure 20A:
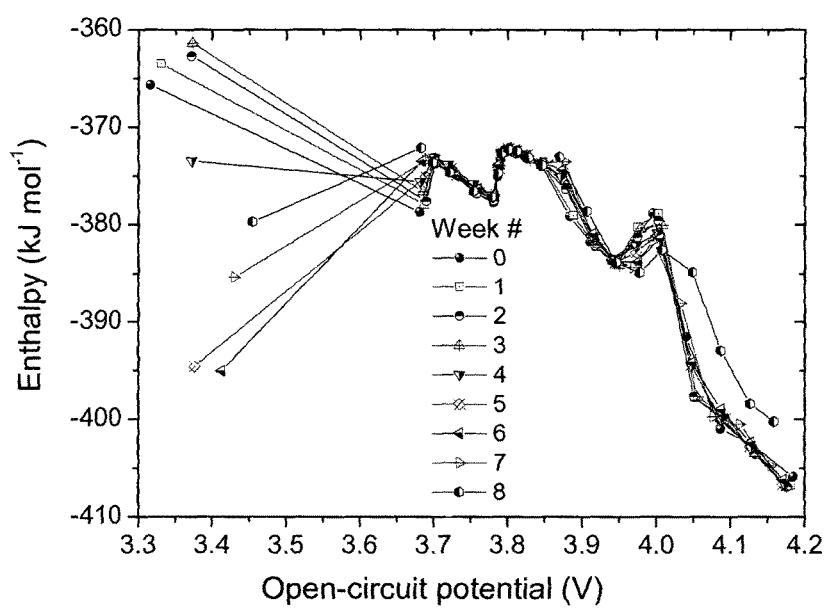
FIG. 20A shows enthalpy profiles of LIB cells aged at 60° C. vs. OCP for 0-8 weeks.

FIG. 20A shows enthalpy profiles of LIB cells aged at 60° C. vs. OCP for 0-8 weeks.

Figure 20B:
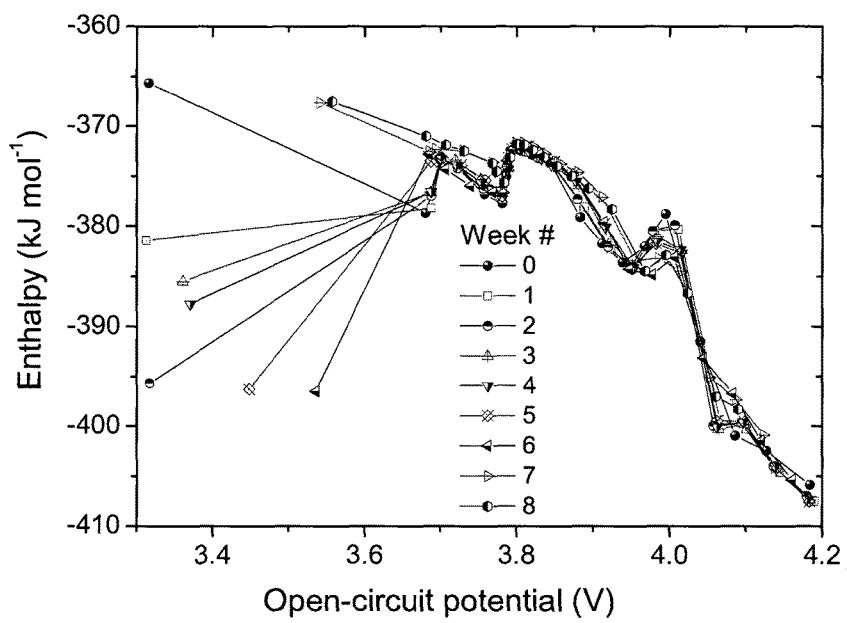
FIG. 20B shows enthalpy profiles of LIB cells aged at 70° C. vs. OCP for 0-8 weeks.

FIG. 20B shows enthalpy profiles of LIB cells aged at 70° C. vs. OCP for 0-8 weeks.

Entropy and enthalpy profiles of cells aged at 60° C. and 70° C. plotted vs. SOC are displayed in FIG. 17A and FIG. 17B (60° C.) and FIG. 18A and FIG. 18B (70° C.), respectively. Entropy and enthalpy profiles plotted vs. OCP are shown in FIG. 19A and FIG. 19B and FIG. 20A and FIG. 20B, respectively. As discussed earlier with reference to the overcharge ageing, entropy and enthalpy profiles vs. SOC show more differences with aging time then OCP ones. The SOC areas were differences in entropy and enthalpy are more noticeable are 5%, 80% and 85%.

Figure 21A:
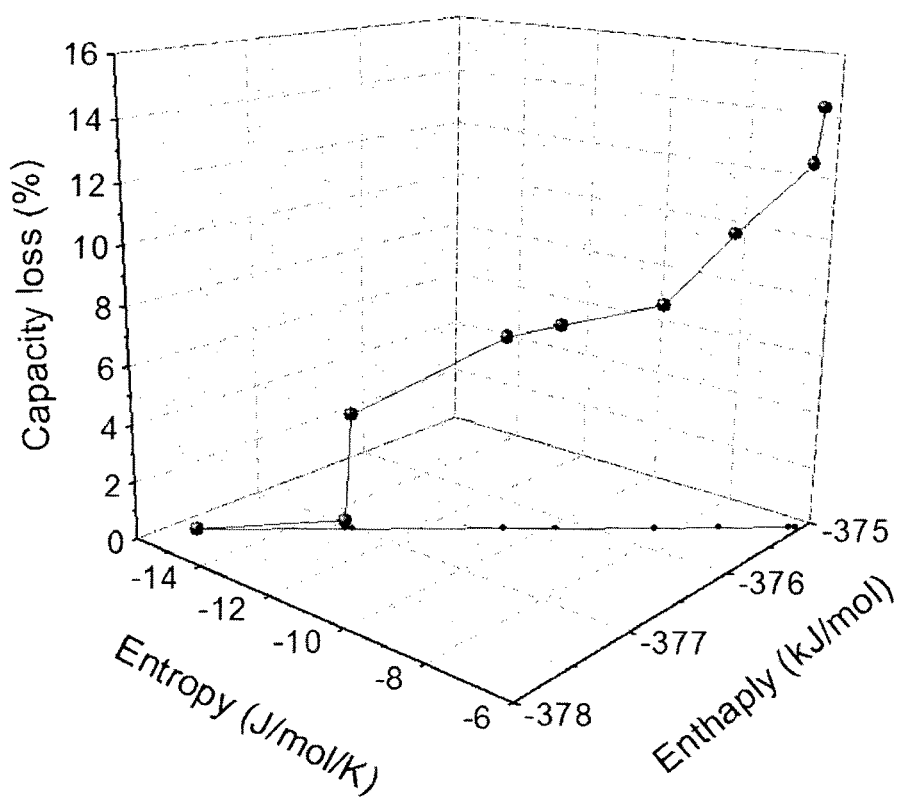
FIG. 21A shows a 3D ($\Delta S$, $\Delta H$, $q_{CL}$) plot at 3.87V OCP of LIB cells aged at 60° C. for 0-8 weeks.

FIG. 21A shows a 3D ($\Delta S$, $\Delta H$, $q_{CL}$) plot at 3.87V OCP of LIB cells aged at 60° C. for 0-8 weeks.

Figure 21B:
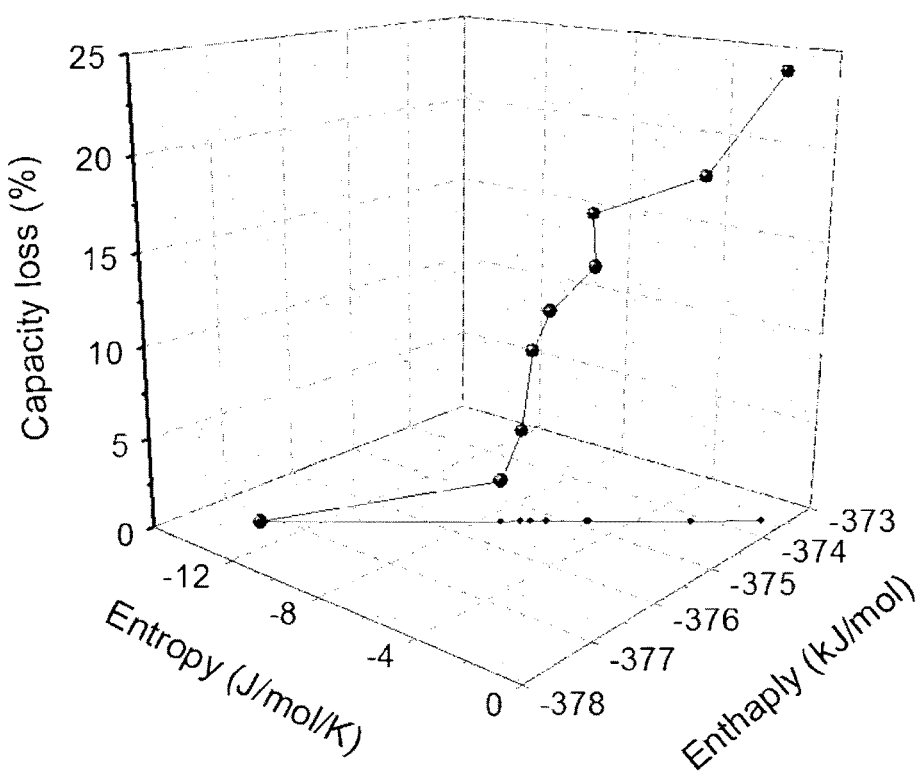
FIG. 21B shows a 3D ($\Delta S$, $\Delta H$, $q_{CL}$) plot at 3.87V OCP of LIB cells aged at 70° C. for 0-8 weeks.

FIG. 21B shows a 3D ($\Delta S$, $\Delta H$, $q_{CL}$) plot at 3.87V OCP of LIB cells aged at 70° C. for 0-8 weeks.

Figure 22A:
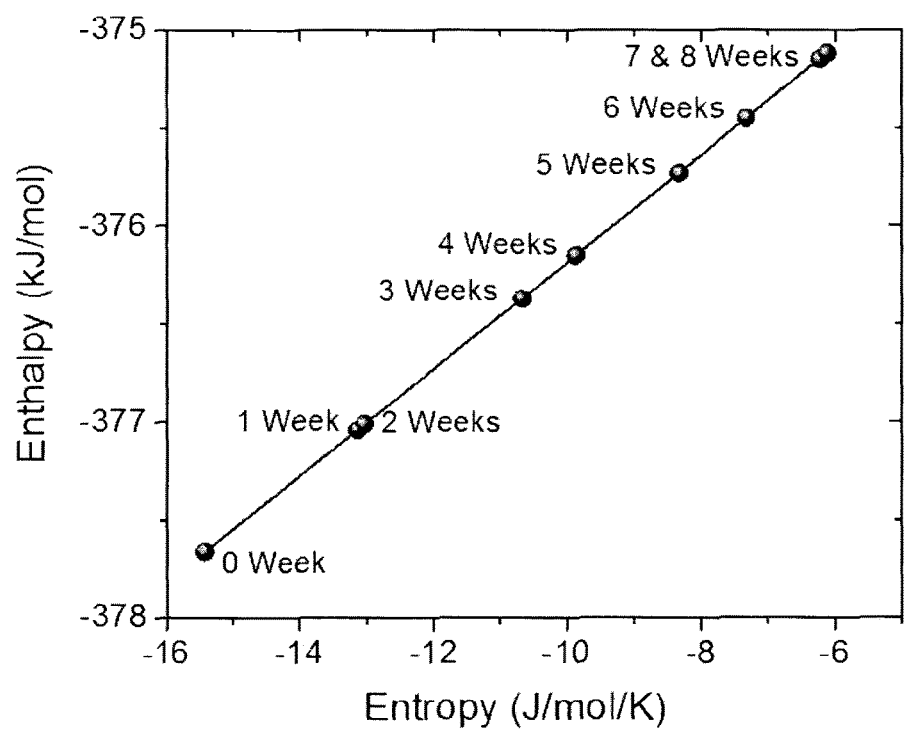
FIG. 22A shows a 2D projected curve on the ($\Delta S$, $\Delta H$) plane at 3.87V OCP of LIB cells aged at 60° C. for 0-8 weeks.

FIG. 22A shows a 2D projected curve on the ($\Delta S$, $\Delta H$) plane at 3.87V OCP of LIB cells aged at 60° C. for 0-8 weeks.

Figure 22B:
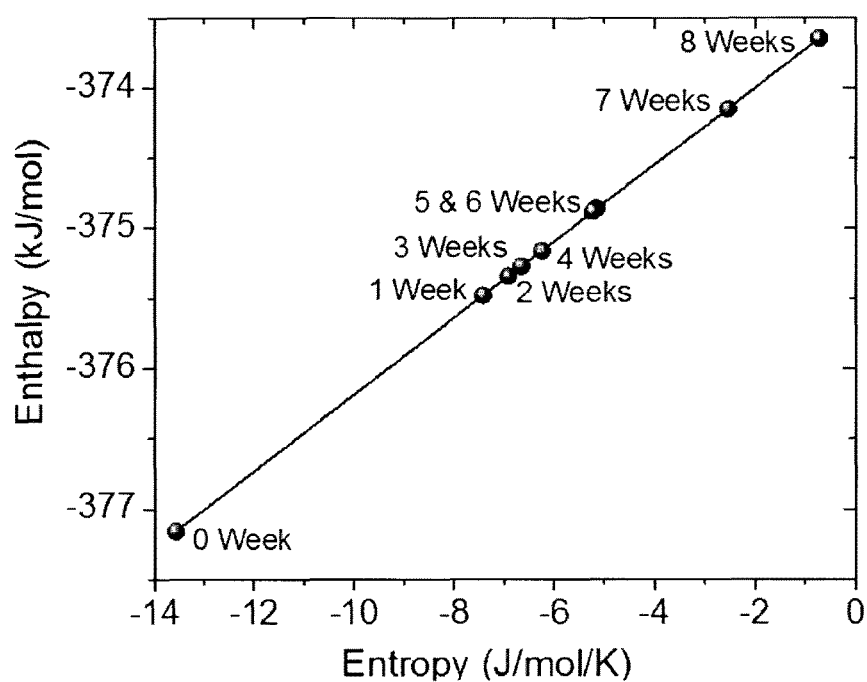
FIG. 22B shows a 2D projected curve on the ($\Delta S$, $\Delta H$) plane at 3.87V OCP of LIB cells aged at 70° C. for 0-8 weeks.

FIG. 22B shows a 2D projected curve on the ($\Delta S$, $\Delta H$) plane at 3.87V OCP of LIB cells aged at 70° C. for 0-8 weeks.

Figure 23A:
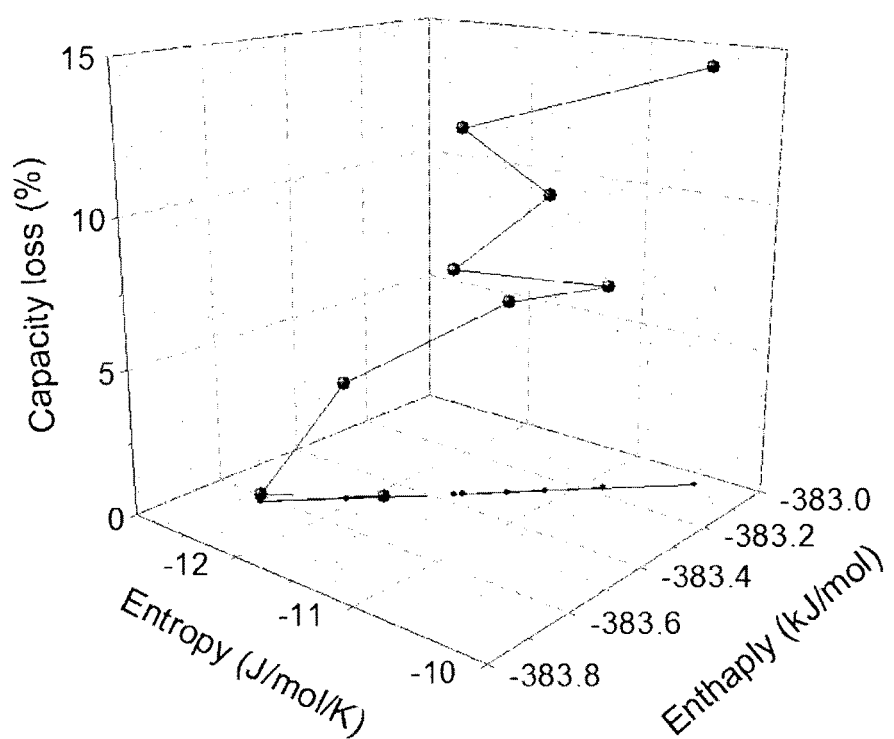
FIG. 23A shows a 3D ($\Delta S$, $\Delta H$, $q_{CL}$) plot at 3.94V OCP of LIB cells aged at 60° C. for 0-8 weeks.

FIG. 23A shows a 3D ($\Delta S$, $\Delta H$, $q_{CL}$) plot at 3.94V OCP of LIB cells aged at 60° C. for 0-8 weeks.

Figure 23B:
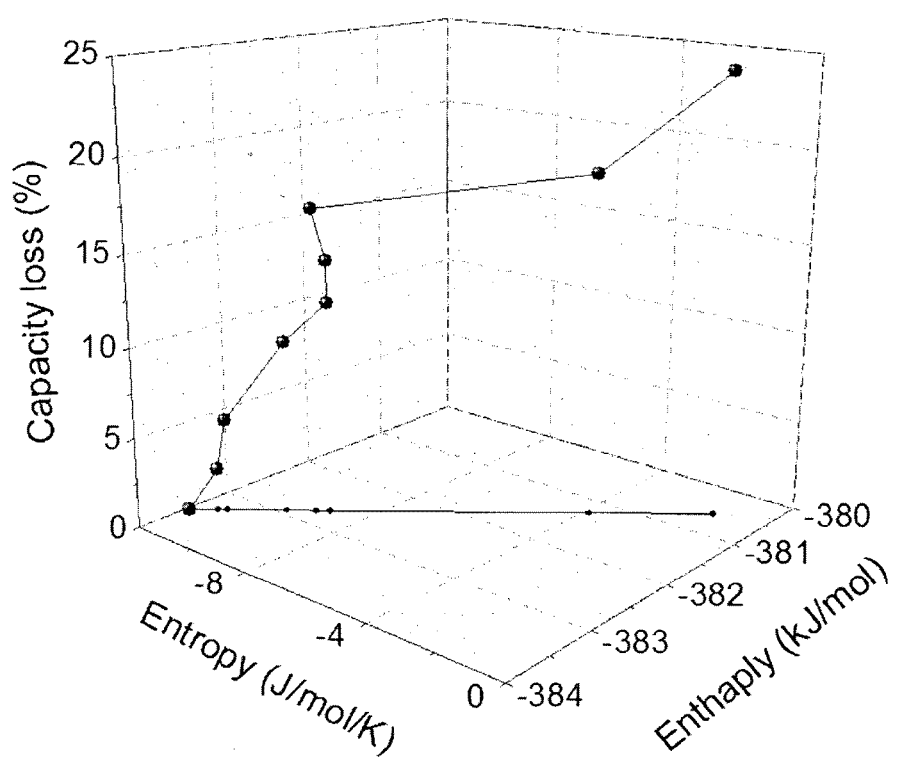
FIG. 23B shows a 3D ($\Delta S$, $\Delta H$, $q_{CL}$) plot at 3.94V OCP of LIB cells aged at 70° C. for 0-8 weeks.

FIG. 23B shows a 3D ($\Delta S$, $\Delta H$, $q_{CL}$) plot at 3.94V OCP of LIB cells aged at 70° C. for 0-8 weeks.

Figure 24A:
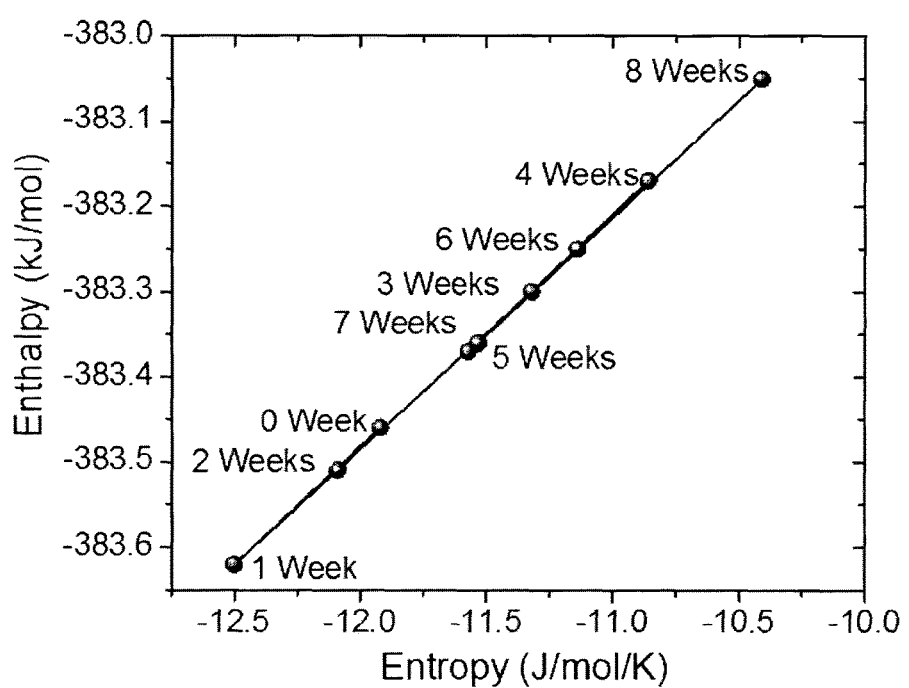
FIG. 24A shows a 2D projected curve on the (ΔS, ΔH) plane at 3.94V OCP of LIB cells aged at 60° C. for 0-8 weeks.

FIG. 24A shows a 2D projected curve on the ($\Delta S$, $\Delta H$) plane at 3.94V OCP of LIB cells aged at 60° C. for 0-8 weeks.

Figure 24B:
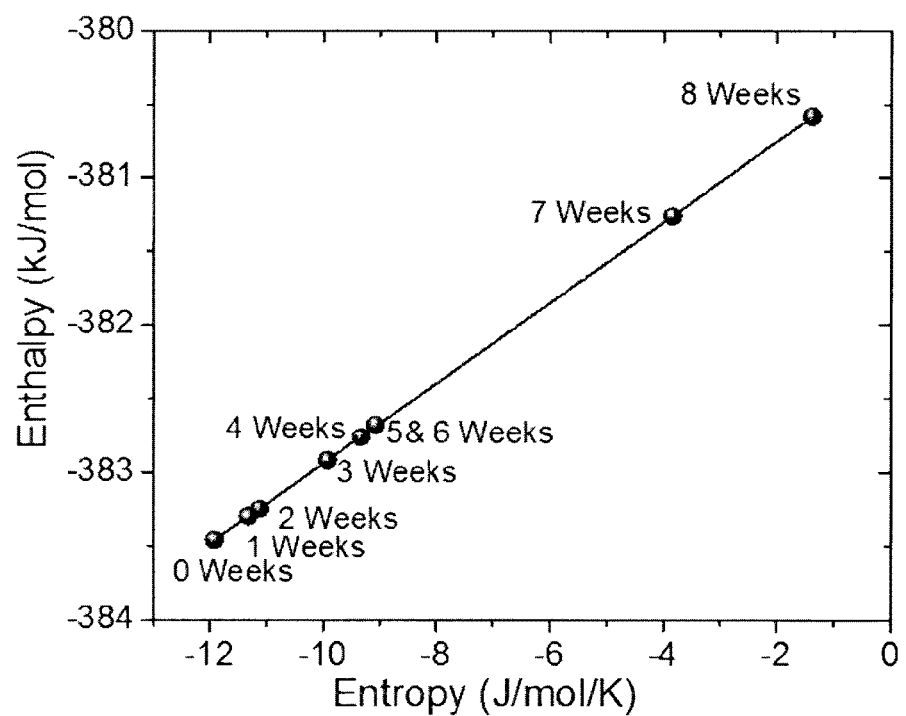
FIG. 24B shows a 2D projected curve on the (ΔS, ΔH) plane at 3.94V OCP of LIB cells aged at 70° C. for 0-8 weeks.

FIG. 24B shows a 2D projected curve on the ($\Delta S$, $\Delta H$) plane at 3.94V OCP of LIB cells aged at 70° C. for 0-8 weeks.

Here also we found entropy and enthalpy data at OCP of 3.87 V and 3.94 V to show larger differences with ageing time. The 3D ($\Delta S$, $\Delta H$, $q_{CL}$) profiles at 60° C. and 70° C. are shown in FIG. 21A and FIG. 21B (3.87 V) and FIG. 23A and FIG. 23B (3.94 V), respectively, the corresponding projection in the ($\Delta S$, $\Delta H$) plane is displayed in FIG. 22A and FIG. 22B (3.87 V) and FIG. 24A and FIG. 24B (3.94 V), respectively. The four projected plots show highly resolved ageing time dependence, enabling one to clearly distinguish between cells aged St 60° C. and 70° C. for a determined period of time. Here also we found a good linearity of the data in the curves at 3.87 V (anode) and at 3.94 V (cathode) as can be seen in FIG. 24A and FIG. 24B.

As stated above, 3.94V relates to a phase transition in the LCO cathode. By comparing the entropy scale in FIG. 24A and FIG. 24B it becomes obvious that the data are strongly ageing temperature dependent. Consequently, our thermal ageing study gives further support to the point that thermodynamics methods do allow distinguishing between cells aged at different temperatures for different durations of time.

In the following, thermodynamics of (long-)cycled cells will be described.

Long term cycling is the most natural ageing mode of rechargeable batteries. It results in both lower discharge potential and lower discharge capacity with increasing cycle number; 'N' but also with overdischarge and as discussed above with overcharge with charge and discharge rate.

Cell performances decay upon cycling results from the following causes: a) anode crystal structure degradation, b) cathode crystal structure degradation, c) electrode/electrolyte interface properties degradation, d) metal dissolution, e) electrolyte decomposition, and f) surface film formation.

In the following, it will be described how LiB cells were cycled gavanostatically for up to 1000 cycles and analyzed after each completed 100 cycles. The cells discharge performance and on thermodynamics properties evolution upon cycle ageing will be described.

In the following, the ageing method will be described.

Four cells were cycled gavanostatically at 20 mA (~C/2 rate) between 2.75 V and 4.2 V at ambient temperature. After each completed 100 cycles; the cells were analyzed by galvanostatic cycling and by thermodynamics methods. The same cells were then cycled again for an additional 100 cycles until reaching 1000 cycles.

In the following, discharge characteristics will be described.

Figure 25:
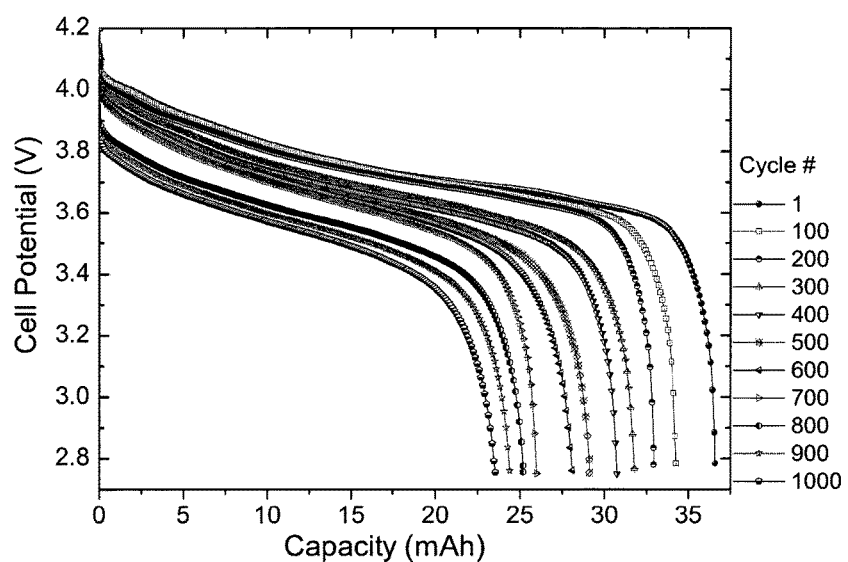
FIG. 25 shows discharge profiles for a LiB cell after every completed 100 cycles.

FIG. 25 shows discharge profiles for a LiB cell after every completed 100 cycles.

Table 4 described discharge data of LiB cells cycled up to 1000 cycles vs. cycle number; $q_d$, $q_{CL}$, $<e_d>$ and $\varepsilon_d$ refer to discharge capacity, discharge capacity loss, average discharge voltage and discharge energy, respectively.

TABLE 4

| Cycle number | $q_d$(mAh) | $q_{CL}$ (%) | $<e_d>$ (V) | $\varepsilon_d$ (mWh) |
|---|---|---|---|---|
| 1 | 36.58 | — | 3.72 | 136 |
| 100 | 34.28 | 6.3 | 3.73 | 128 |
| 200 | 32.92 | 10 | 3.72 | 122 |
| 300 | 31.78 | 13.1 | 3.68 | 117 |
| 400 | 30.75 | 15.9 | 3.67 | 113 |
| 500 | 29.11 | 20.4 | 3.65 | 106 |
| 600 | 28.10 | 23.2 | 3.65 | 103 |
| 700 | 25.99 | 28.9 | 3.65 | 95 |
| 800 | 25.19 | 31.1 | 3.58 | 90 |
| 900 | 24.40 | 33.3 | 3.56 | 87 |
| 1000 | 23.55 | 35.62 | 3.54 | 83 |

FIG. 25 shows the discharge profile after each completed 100 cycles and Table 4 displays the corresponding discharge characteristics. Capacity loss after 500 cycles and 1000 cycles is 20.4% and 35.6%, respectively. This converts to an average capacity loss rate of 0.094% per cycle. Moreover, we found that the cells' energy output decreases linearly with cycle number N according to:

$$\varepsilon_d(N)(mWh)=133.6-0.0527-N \quad (11)$$

In the following, OCP profiles will be described.

Figure 26:
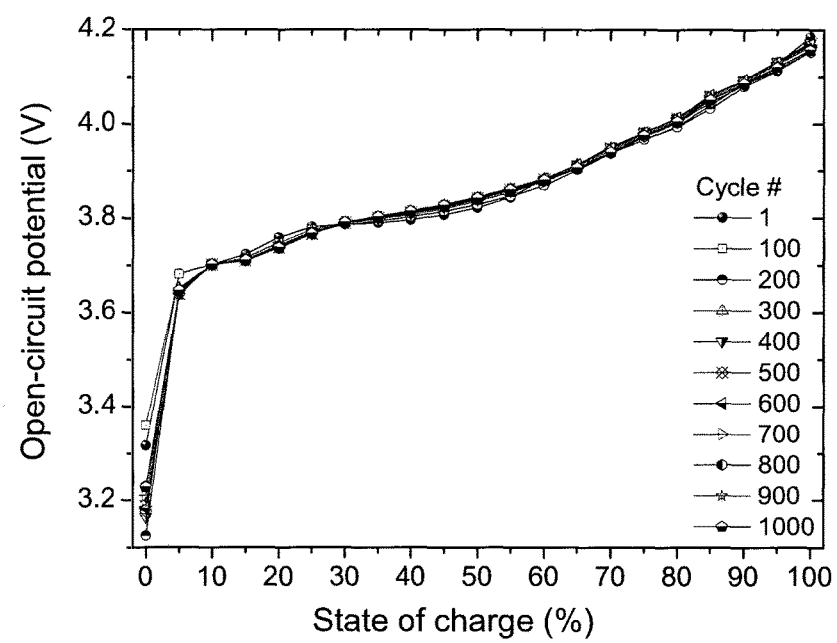
FIG. 26 shows OCP profiles of LIB cells vs. SOC. Cells were subjected to 1 to 1000 cycles.

FIG. 26 shows OCP profiles of LIB cells vs. SOC. Cells were subjected to 1 to 1000 cycles.

FIG. 26 shows the OCP vs. SOC profiles of cells aged N=100n cycles (n=1-10), together with a fresh cell (N=1). The OCO vs. SOC data points lay on top of each other indicating no significant effect of cycling on OCP vs. SOC profiles has taken place. Since the discharge capacity and the discharge potential decreased with the cycle number, the OCP results suggest the galvanostatic cycling gradually converts active anode and cathode material into less active material. The conversion of active into less active (or inactive) material upon ageing does not affect much the corresponding electrode potential as function of the SOC, since the later normalizes the active material to 100%.

In the following, entropy and enthalpy profiles will be described.

Figure 27:
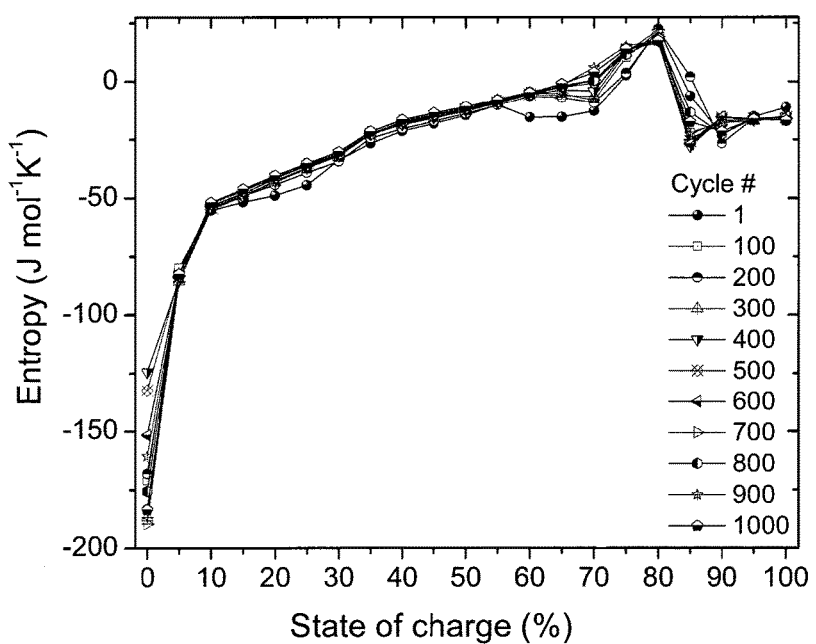
FIG. 27 shows entropy profiles of LIB cycled 1 to 1000 cycles vs. SOC.

FIG. 27 shows entropy profiles of LIB cycled 1 to 1000 cycles vs. SOC.

Figure 28:
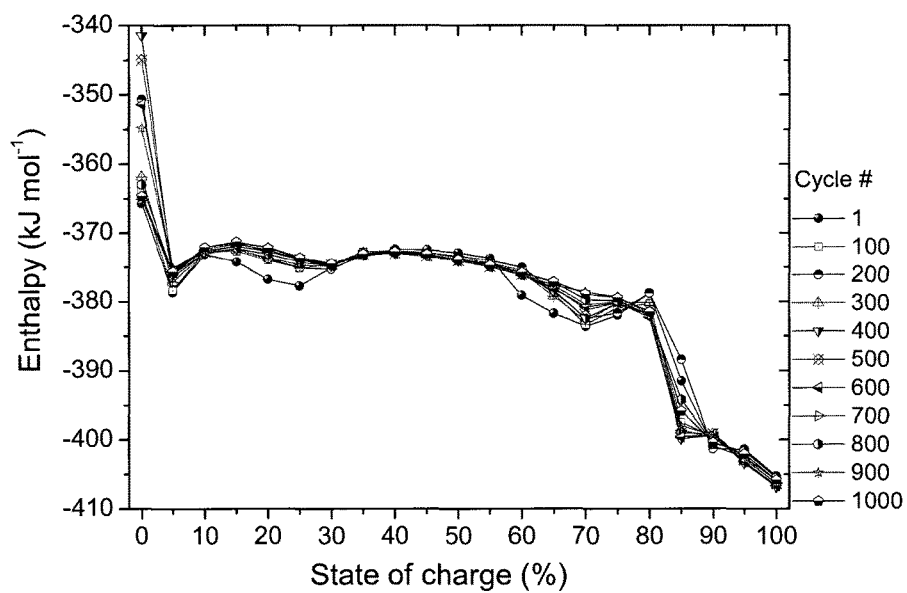
FIG. 28 shows enthalpy profiles of LIB cycled 1 to 1000 cycles vs. SOC.

FIG. 28 shows enthalpy profiles of LIB cycled 1 to 1000 cycles vs. SOC.

Figure 29:
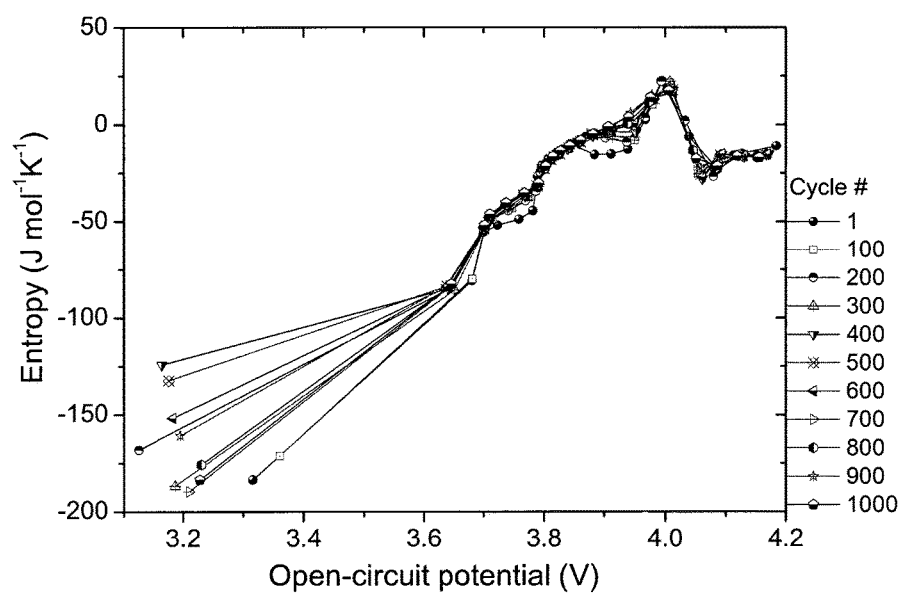
FIG. 29 shows entropy profiles of LIB cycled 1 to 1000 cycles vs. OCP.

FIG. 29 shows entropy profiles of LIB cycled 1 to 1000 cycles vs. OCP.

Figure 30:
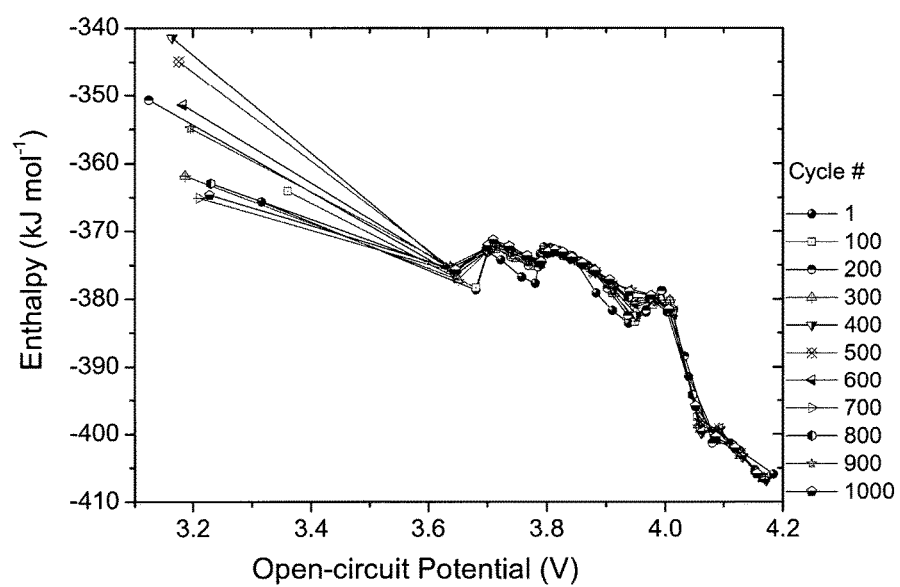
FIG. 30 shows enthalpy profiles of LIB cycled 1 to 1000 cycles vs. OCP.

FIG. 30 shows enthalpy profiles of LIB cycled 1 to 1000 cycles vs. OCP.

FIG. 27 and FIG. 28 show the entropy and enthalpy profiles vs. SOC at different N values, respectively. The corresponding entropy and enthalpy curves traced vs. OCP are displayed in FIG. 29 and FIG. 30, respectively.

Figure 31:
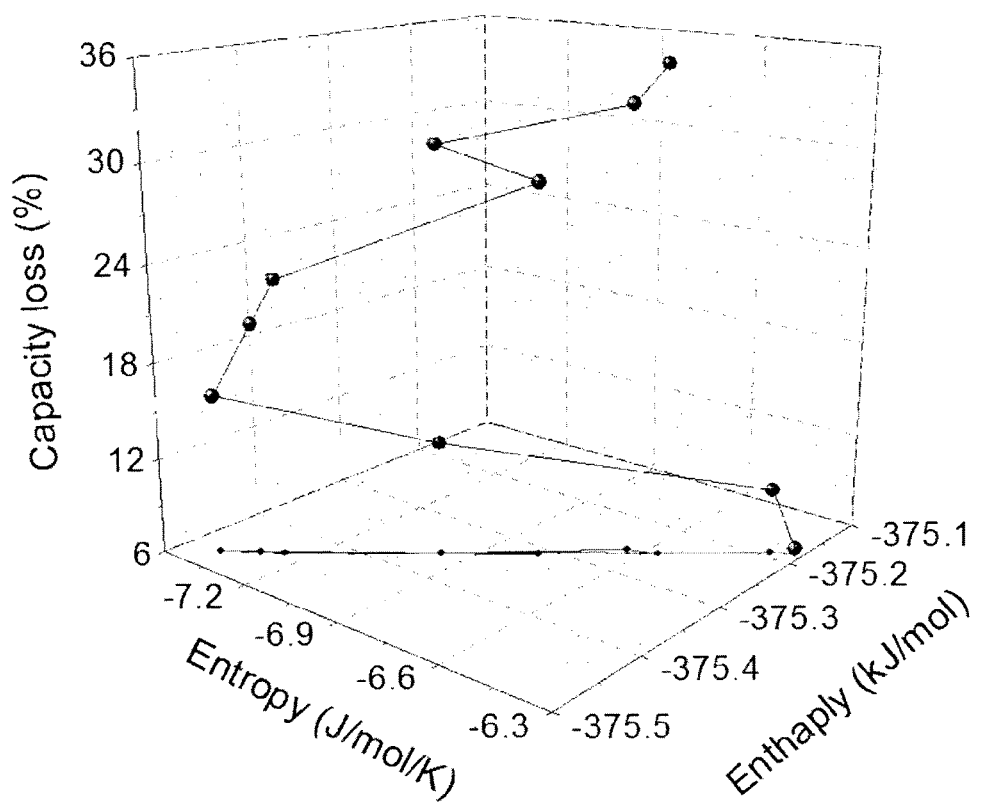
FIG. 31 shows a 3D (ΔS, ΔH, N) plot at 3.87V OCP of LIB cells cycled 1 to 1000 cycles.

FIG. 31 shows a 3D ($\Delta$S, $\Delta$H, N) plot at 3.87V OCP of LIB cells cycled 1 to 1000 cycles.

Figure 32:
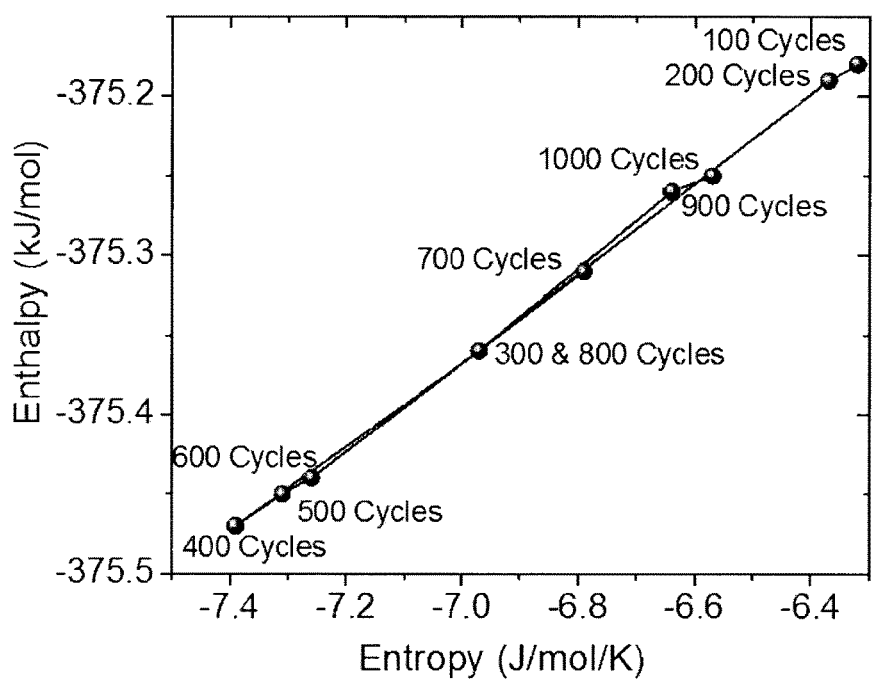
FIG. 32 shows a 2D projected curve on the (ΔS, ΔH) plane at 3.87 V OCP of LIB cells cycled 1 to 1000 cycles.

FIG. 32 shows a 2D projected curve on the ($\Delta$S, $\Delta$H) plane at 3.87 V OCP of LIB cells cycled 1 to 1000 cycles.

Figure 33:
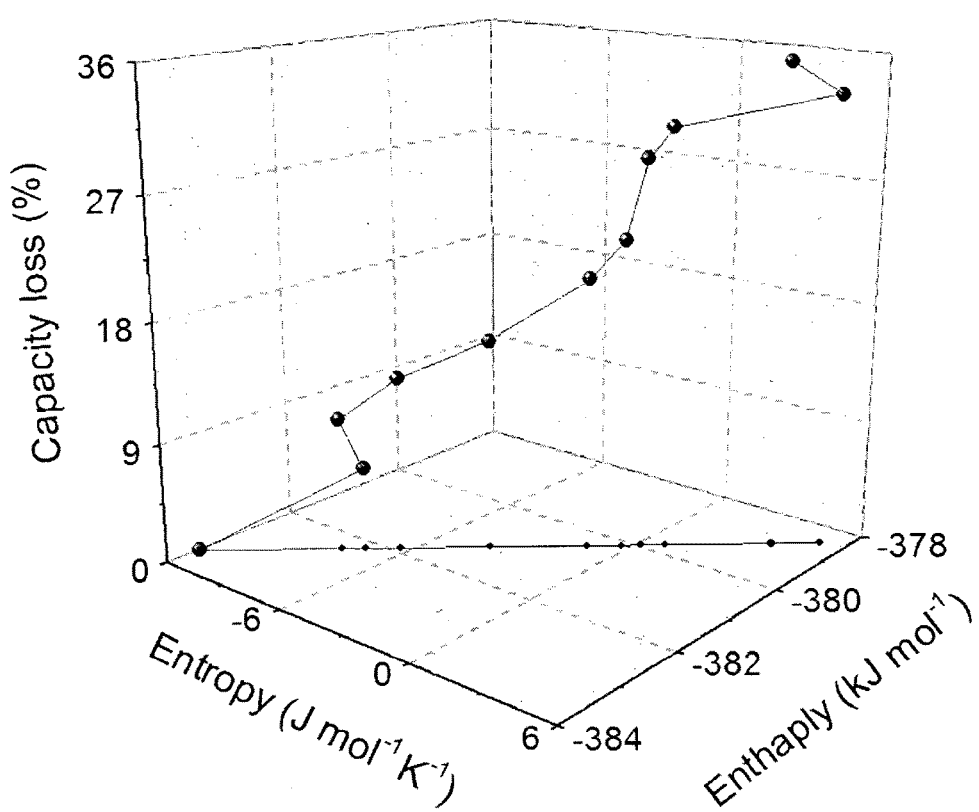
FIG. 33 shows a 3D (ΔS, ΔH, N) plot at 3.94V OCP of LIB cells cycled 1 to 1000 cycles.

FIG. 33 shows a 3D ($\Delta$S, $\Delta$H, N) plot at 3.94V OCP of LIB cells cycled 1 to 1000 cycles.

Figure 34:
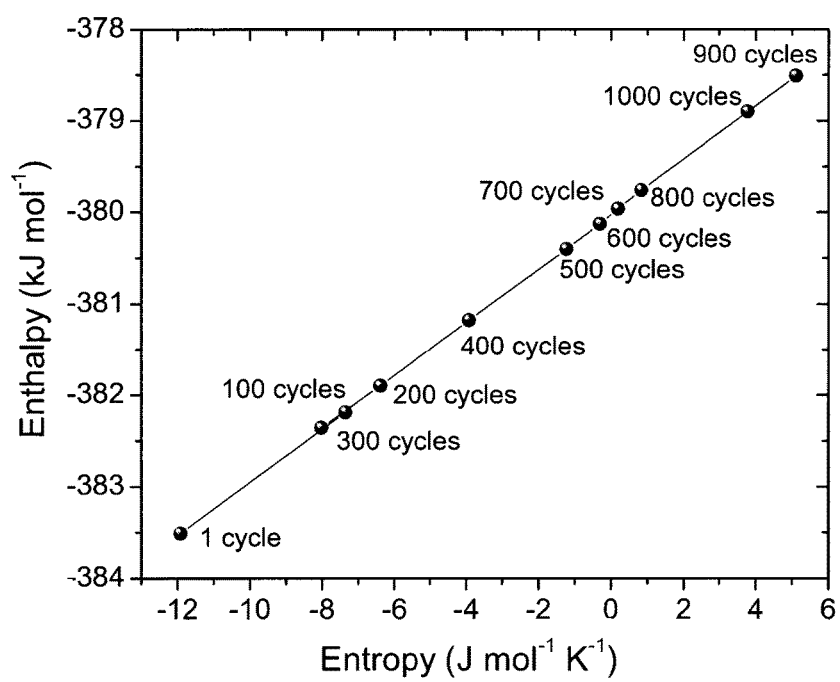
FIG. 34 shows a 2D projected curve on the (ΔS, ΔH) plane at 3.94V OCP of LIB cells cycled 1 to 1000 cycles.

FIG. 34 shows a 2D projected curve on the ($\Delta$S, $\Delta$H) plane at 3.94V OCP of LIB cells cycled 1 to 1000 cycles.

Similarly than in the previous sections 3D ($\Delta$S, $\Delta$H, $q_{CL}$) and projection curves at OCP=3.87 V and 3.94 V are showed in FIG. 31 and FIG. 32 (OCP=3.87 V) and in FIG. 33 and FIG. 34 (OCP=3.94 V).

FIG. 32 and FIG. 34 show a good alignment of the data points projected on the ($\Delta$S, $\Delta$H) plane. This is particularly true in FIG. 32 of data collected at 3.87 V suggesting a good sensitivity of thermodynamics to changes in the graphite anode, although we found that the graphite structure is not much affected by cycling. We also found by ex-situ analyses using XRD (X-ray diffraction) and Raman scattering that, surprisingly, the graphite crystal structure improved upon cycling.

In contrast, FIG. 34 of data points collected at 3.94 V show excellent resolution with regards to N. Such a finding opens for a new application of thermodynamics as a tool to assess cells cycle number.

The difference in data resolution at 3.87 V and 3.94 V comes from the fact that the LCO (for example $LiCoO_2$) cathode controls the cell capacity fading during galvanostatic cycling at ambient temperature. This statement is supported by post-mortem XRD and Raman scattering analyses performed on the graphite anode and LCO cathode, which unambiguously showed little, if any, changes in the graphite crystal structure after 1000 cycles, whereas, by contrast the LCO cathode structure was strongly affected by long cycling. Therefore, thermodynamics data collected at 3.94 V, which relate to a phase transition in the LCO cathode, are expected to exhibit more significant changes with the cycle number as compared to those collected at 3.87 V relating to the graphite anode.

In the following, the thermodynamics memory effect will be described.

Figure 35:
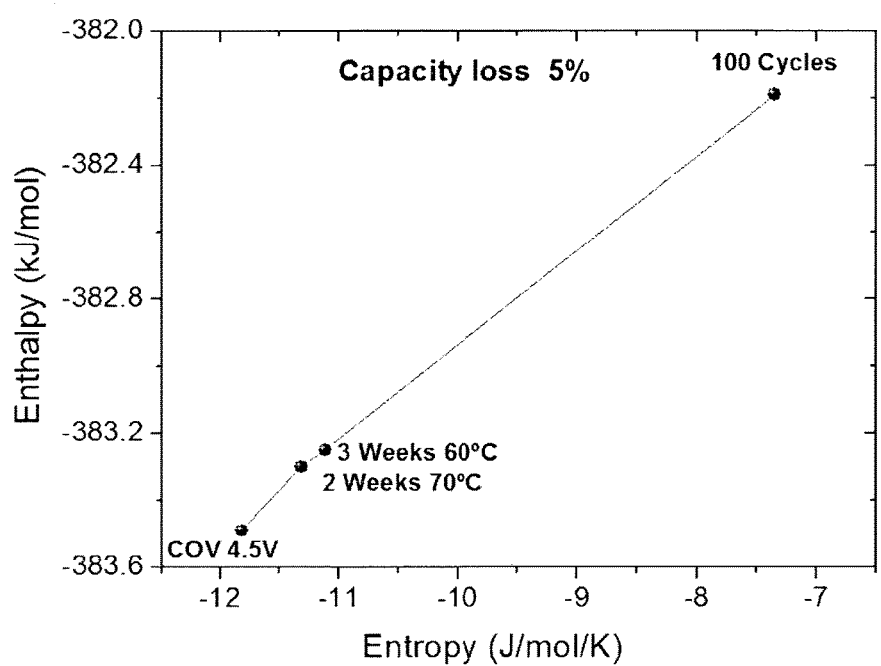
FIG. 35 shows a 2D projected curve on the (ΔS, ΔH) plane at 3.94V OCP of LIB cells having incurred a capacity loss of 5%.

FIG. 35 shows a 2D projected curve on the ($\Delta$S, $\Delta$H) plane at 3.94V OCP of LIB cells having incurred a capacity loss of 5%.

Figure 36:
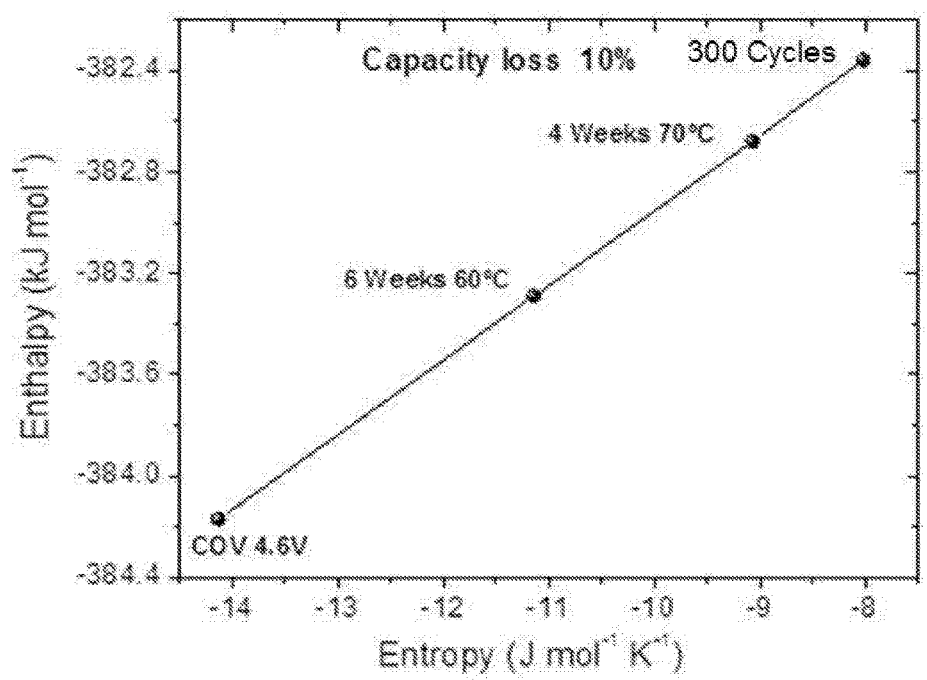
FIG. 36 shows a 2D projected curve on the (ΔS, ΔH) plane at 3.94V OCP of LIB cells having incurred a capacity loss of 10%.

FIG. 36 shows a 2D projected curve on the ($\Delta$S, $\Delta$H) plane at 3.94V OCP of LIB cells having incurred a capacity loss of 10%.

Figure 37:
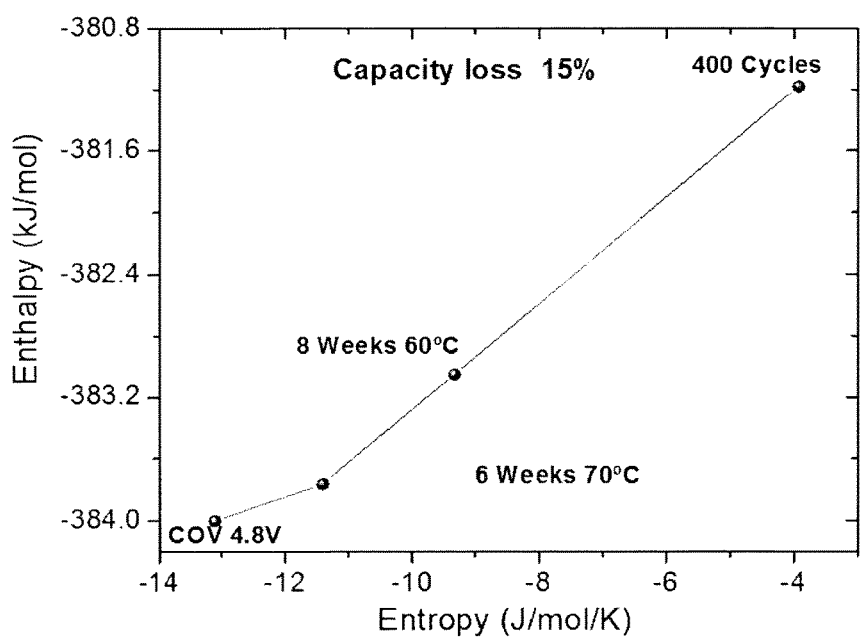
FIG. 37 shows a 2D projected curve on the (ΔS, ΔH) plane at 3.94V OCP of LIB cells having incurred a capacity loss of 15%.

FIG. 37 shows a 2D projected curve on the ($\Delta$S, $\Delta$H) plane at 3.94V OCP of LIB cells having incurred a capacity loss of 15%.

Figure 38:
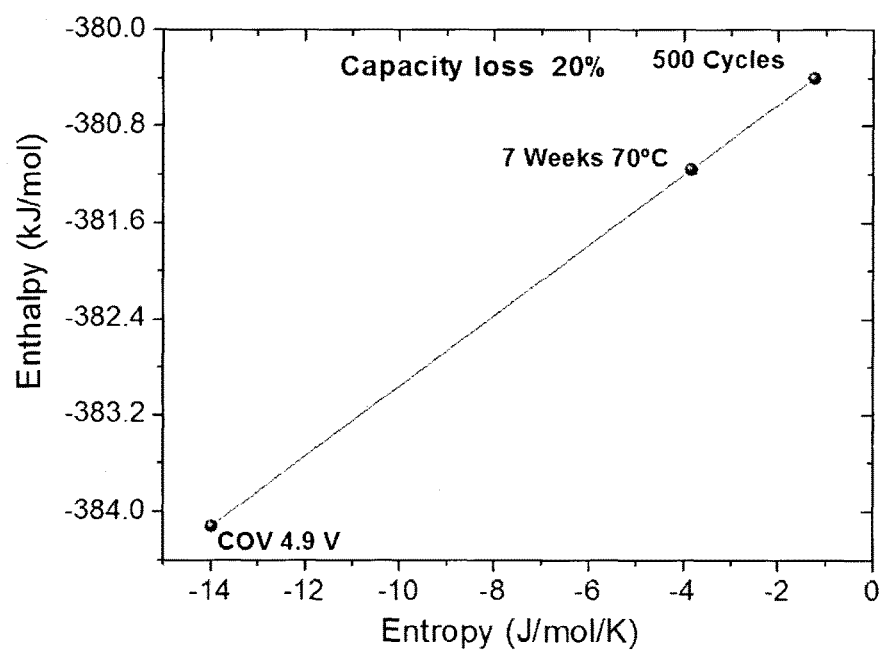
FIG. 38 shows a 2D projected curve on the (ΔS, ΔH) plane at 3.94V OCP of LIB cells having incurred a capacity loss of 20%.

FIG. 38 shows a 2D projected curve on the ($\Delta$S, $\Delta$H) plane at 3.94V OCP of LIB cells having incurred a capacity loss of 20%.

Figure 39:
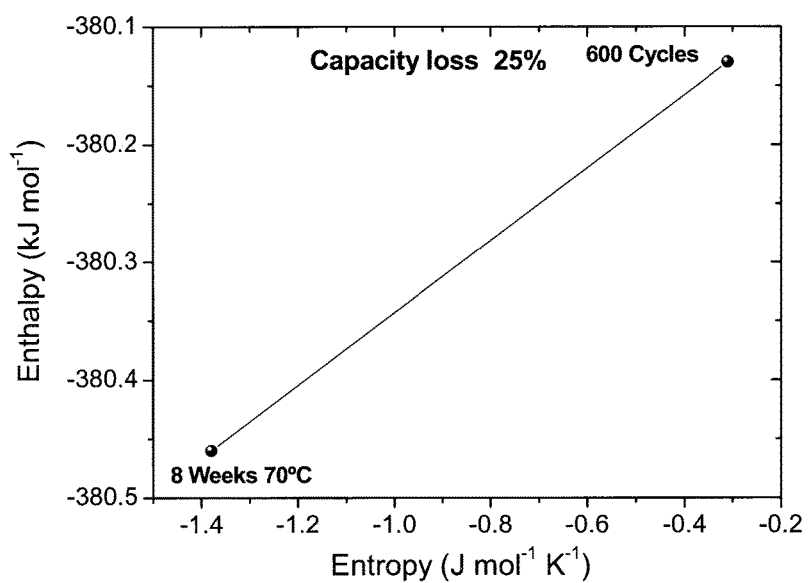
FIG. 39 shows a 2D projected curve on the (ΔS, ΔH) plane at 3.94V OCP of LIB cells having incurred a capacity loss of 25%.

FIG. 39 shows a 2D projected curve on the ($\Delta S$, $\Delta H$) plane at 3.94V OCP of LIB cells having incurred a capacity loss of 25%.

Table 5 describes ageing conditions under which LiB cells incurred a capacity loss of 5% to 25%.

TABLE 5

| Capacity loss (%) | Overcharge | Thermal | Cycling |
|---|---|---|---|
| 5 | 4.5 V | 60° C., 3 Weeks<br>70° C., 2 Weeks | 100 |
| 10 | 4.6 V | 60° C., 6 Weeks<br>70° C., 4 Weeks | 300 |
| 15 | 4.8 V | 60° C., 8 Weeks<br>70° C., 6 Weeks | 400 |
| 20 | 4.9 V | 70° C., 7 Weeks | 500 |
| 25 | — | 70° C., 8 Weeks | 600 |

As has been described above with reference to LiB ageing, thermodynamics techniques are affective in assessing 1) the COV of overcharged batteries, 2) the duration of thermal ageing, and 3) the cycle number of aged cells. In this section we will attempt to address the question whether a LiB keeps memory of the kind of ageing process that lead to a certain capacity fade. To achieve this task, we selected among the four ageing methods presented herein (overcharge, thermal at 60° C., thermal at 70° C. and long cycling) the conditions leading to the same capacity loss of the cells such as $q_a$ of 5%, 10%, 15%, 20% and 25%. The corresponding ageing conditions are exhibited in Table 5.

FIG. 35 to FIG. 39 show the coordinates location of the data points in the ($\Delta S$, $\Delta H$) plane corresponding to the ageing conditions which led to 5% to 25% capacity loss, respectively. The thermodynamics data showed in FIG. 35 (5%), FIG. 36 (10%), FIG. 37 (15%), FIG. 38 (20%) and FIG. 39 (25%) are collected at cells OCP value of 3.94 V. We can see that the data points in FIG. 35 to FIG. 39 are quite well scattered, except in FIG. 35 where the data points after 3 weeks ageing at 60° C. and 2 weeks at 70° C. are too close to make any unambiguous distinction between them.

Accordingly, the thermodynamics methods according to various embodiments do allow for clear recognition of the nature of the ageing mode together with the ageing conditions a LiB cell has experienced.

New approaches of thermodynamics studies of LiB before and after ageing have been presented and discussed herein. The thermodynamics path taken by a battery system strongly depends on the ageing conditions. Batteries keep traces or a memory of these ageing conditions, which have been unveiled for the first time using thermodynamics methods. For example, for LiB consisting of graphite anode and LCO cathode, we found two particular OCP were the changes in entropy and enthalpy are more pronounced. At OCP of 3.87 V information on changes in the graphite anode upon ageing can be obtained whereas at OCP=3.94 V those on the LCO cathode are concerned. Accordingly, by driving the potential of a LiB cell based on graphite anode and LCO cathode to 3.87 V and 3.94 V and changing the cell' temperature and monitoring the OCP vs. T, one can determine entropy and enthalpy at those particular OCP values and plot the data in the $\Delta S$, $\Delta H$ plane, thus unveiling the cell's SOC, capacity loss and ageing mode using calibration curves presented here. For other LiB chemistries a specific study is needed to uncover the particular cell potentials of interest which enable resolving the effect of ageing according to ageing parameters such as T, time, COV and N.

Some merits of thermodynamics measurements methods according to various embodiments may be summarized as follows:

(1) non-destructiveness (in-situ measurements);

(2) universality as they can apply to any primary and rechargeable battery chemistry, including alkaline and high temperature cells;

(3) high resolution in potential and SOC onsets assessment of phase transitions in half-cells and full-cells.

(4) versatility of applications such as in cells chemistry, SOC, SOH, SOS and ageing memory diagnosis, (5) high reproducibility, and (6) cost effectiveness compared to other techniques based on in-situ or ex-situ diffractometry and physical spectrometry.

Unveiling the battery ageing history and memory through thermodynamics is a breakthrough in the battery science and technology.

Figure 40:
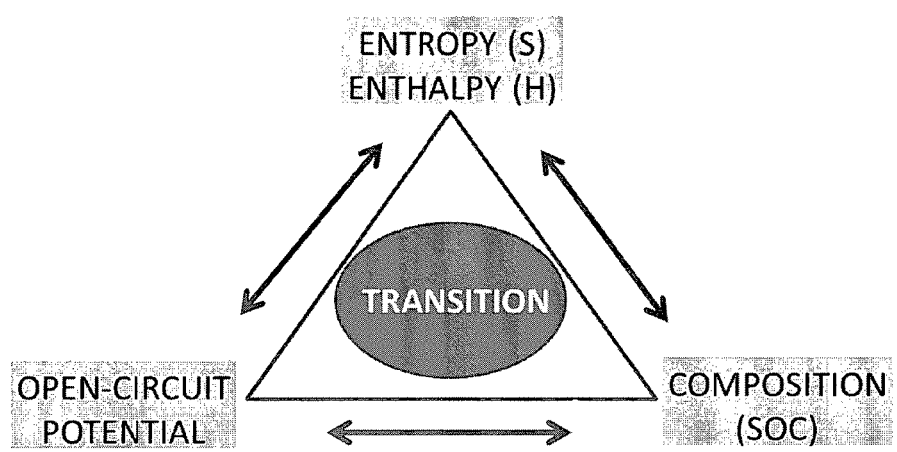
FIG. 40 shows an illustration of the values determined according to various embodiments.

FIG. 40 shows an illustration of the values determined according to various embodiments. At phase transition or change which takes place at specific SOC and OCV, there is a feature in the S and H profile. This is schematized in FIG. 40.

The devices and methods according to various embodiments may be:

1. Universal (i.e. may be applied to any battery chemistry);

2. Independent of the battery size, i. e. use directly measurable intensive parameters such:

Voltage;

Temperature

Chemistry (can be assessed independently if not known).

In the following, the physics behind the devices and methods according to various embodiments will be described.

During ageing, a battery will follow a path downhill on the free energy surfaces.

The path may depend on the physical parameters of the ageing mode (driving force) and can be unique.

Accordingly, even though two batteries may experience same free energy loss, the path to that loss may be different according to the ageing mode.

Each energy loss bears a memory of the ageing mode, including in the thermodynamics characteristics.

This "thermodynamic memory" can be used retroactively to assess the ageing mode.

Devices and methods according to various embodiments may work as follows: Take a battery of known chemistry (If battery chemistry is not known, the latter can be assessed using thermodynamics methods) and unknown history and apply the following steps:

1. Drive the battery voltage to a particular well defined value E* by either charging or discharging it depending on the initial battery OCV $E_i$.

(charge if $E_i$<E*, discharge if $E_i$>E*)

2. Apply E* for a certain period of time to stabilize OCV

3. At initial E*, change the battery temperature by 2 to 10 degrees by cooling or by heating the battery so as to determine S and H.

4. Use the calibration curve (H, S) to locate the actual data point (Calibration curves may be drawn from thermodynamics tests performed on the same type of batteries).

5. Determine the battery history from the calibration curve.

It is to be noted that in some battery chemistries, there is a plurality of particular OCV values ($E^*_1$, $E^*_2$, $E^*_3$, . . . ) which can be used to refine the battery history assessment.

These particular OCV values may be associated to phase transitions and changes in anode and cathode.

The experimental procedure according to various embodiments will be described. We measured the effects of battery ageing on the performance characteristics of lithium ion batteries, including:

Discharge capacity;
Discharge voltages;
Discharge Energy;
Open-circuit voltage (or potential) (OCV, OCP);
Entropy profile; and
Enthalpy profile.

Batteries were aged using three methods:
High voltage ageing; overcharge up to 4.9V;
High temperature ageing (60° C. and 70° C.);
Long galvanostatic cycling (up to 1000 cycles under C/2 rate).

In the following, for each kind of battery ageing, the following results will be presented:
discharge profiles (between 4.2V and 2.75V, under C/4 rate);
OCV profiles vs SOC;
Entropy (S) vs. SOC and OCV;
Enthalpy (H) vs. SOC and OCV;
3D plots (S, H, SOC and S, H, capacity loss); and
2D calibration plots from the above in the (S, H) coordinates.

In the following, overcharge ageing will be described.

In the following, experimental steps for overcharge ageing will be described.

Lithium ion coin cells (LIR 2032) rated ~44 mAh were subjected to the following test steps:

1. High voltage ageing: A first set of cells were cycled with battery cycler at the ambient temperatures: discharge under 10 mA constant current (~C/4) to 2.75 V and charge to a set COV under 10 mA constant current (~C/4), constant COV was maintained for 1 hour. For each test the COV was incremented by 100 mV from 4.2 V to 4.9 V. The cells where then charged to 4.2V and discharged to 2.75V at C/4 rate using again the Arbin cycler, a step in which the cells' capacity loss was determined.

2. Thermodynamics measurements: Thereafter, cells where then transferred to the Electrochemical Thermodynamics Measurement System (ETMS, BA-1000®, KVI PTE LTD, Singapore).

Cells undergo a formation cycle "Conditioning" in which they are charged to 4.2V and discharged to 2.75V to determine their actual capacity. Then they may go through an Electrochemical Thermodynamics Measurements (ETM) test in which the cells are charges at C/6 rate step by step up to 4.2V, at each increment the state of charge (SOC) was increased by 5% and open circuit potential (OCP) was measured.

At each (SOC) the cells temperature T was decreased from the ambient temperature (~25° C.) to 10° C. by 5° C. steps while the OCP was monitored until it stabilized at a set T. The ETMS converts OCP ($E_o(x)$) data to $\Delta S(x)$ and $\Delta H(x)$ using Eq. (12) and (13), respectively:

$$\Delta S(x) = F \frac{\partial E_0(x)}{\partial T} \quad (12)$$

$$\Delta H(x) = -F\left(E_0 + T\frac{\partial E_0(x)}{\partial T}\right) \quad (13)$$

Figure 41:
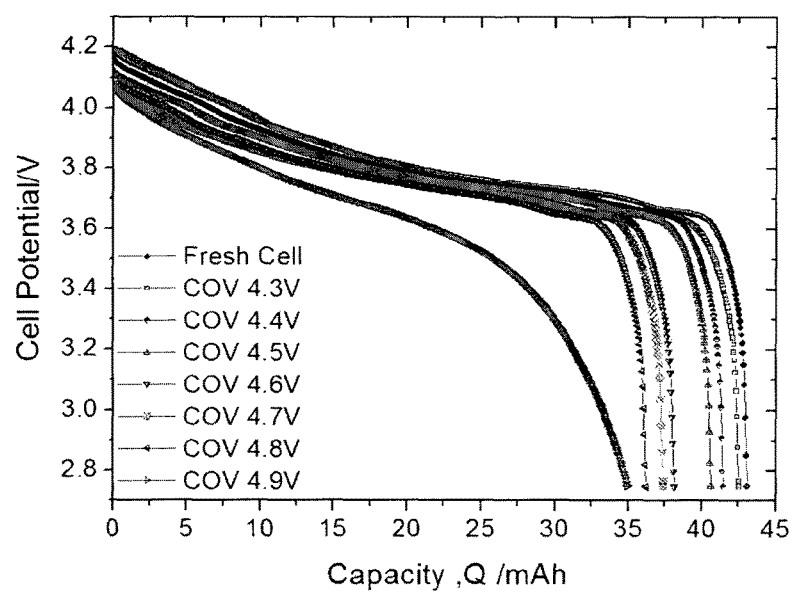
FIG. 41 shows discharge profiles of LiB cells subjected to different charge cut-off voltages (COV)
Figure 42:
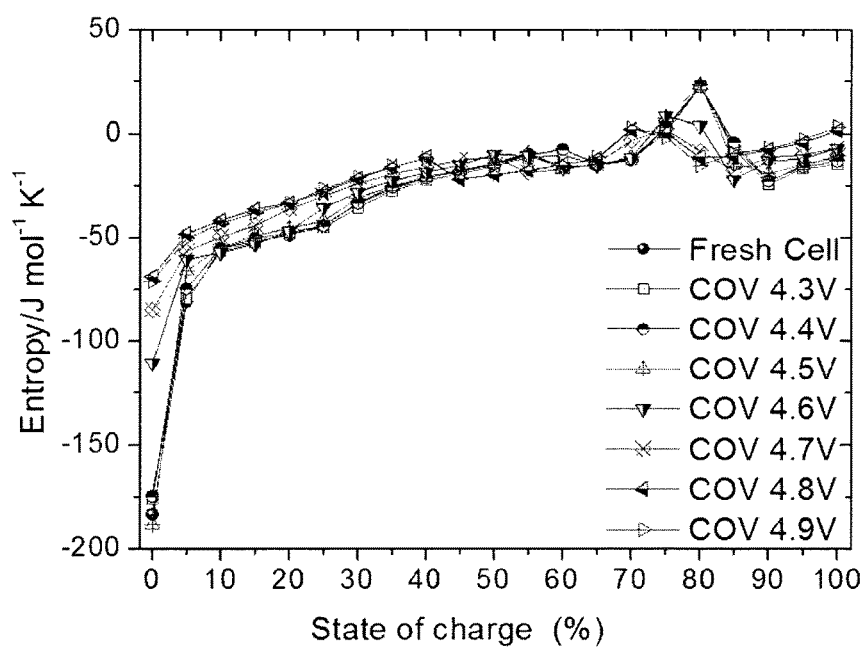
FIG. 42 shows entropy profiles of overcharged LiB cells vs. SOC.
Figure 43:
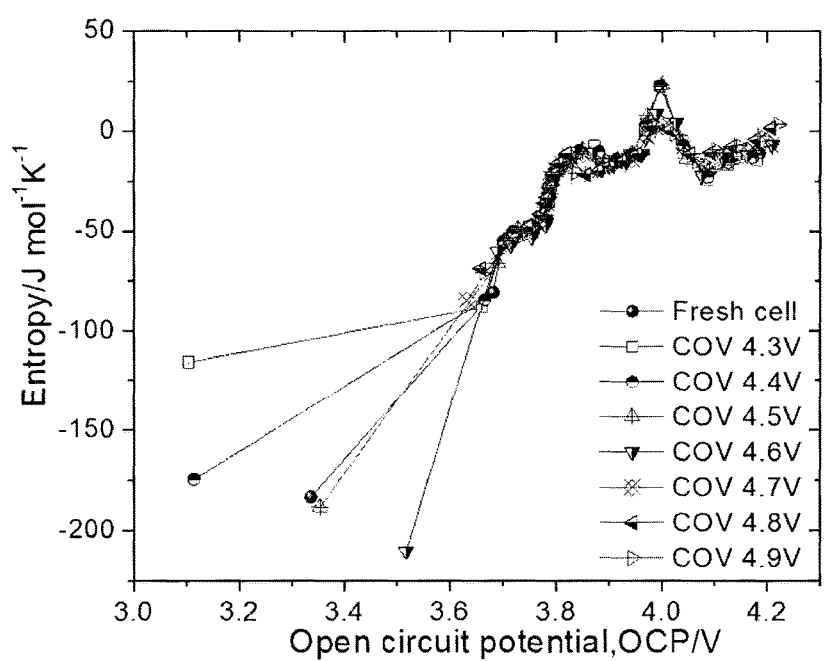
FIG. 43 shows entropy profiles of overcharged LIB cells vs. OCP.
Figure 44:
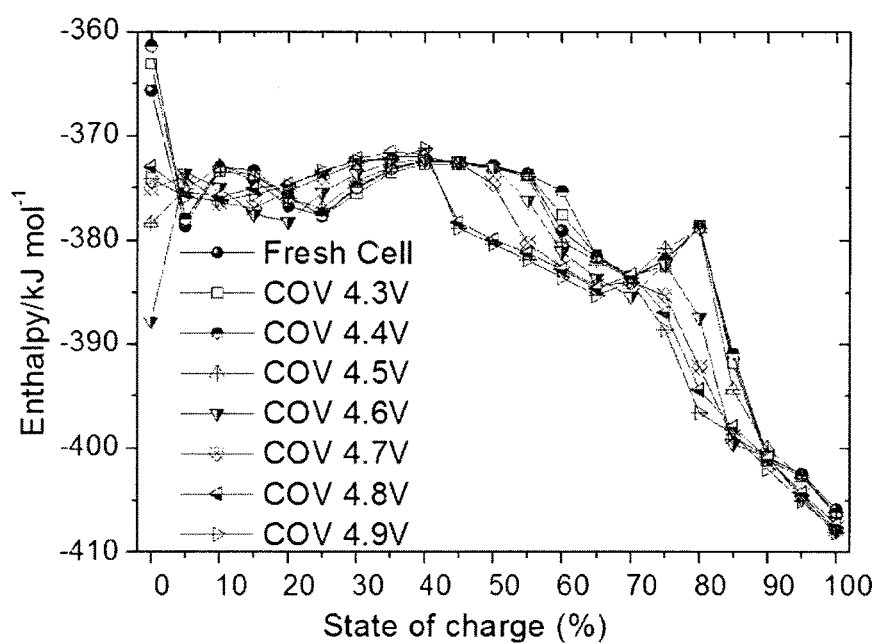
FIG. 44 shows enthalpy profiles of overcharged LIB cells vs. SOC.
Figure 45:
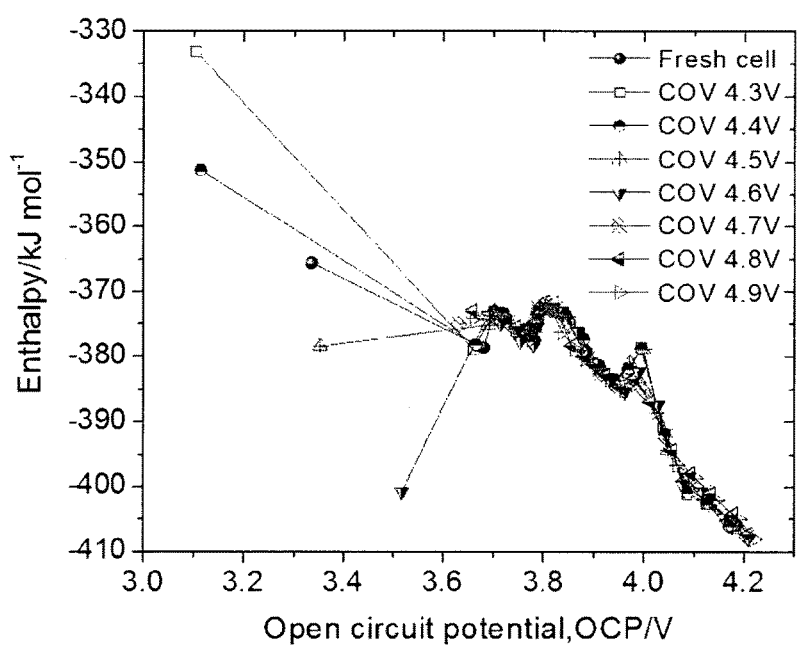
FIG. 45 shows enthalpy profiles of overcharged LIB cells vs. OCP.
Figure 46:
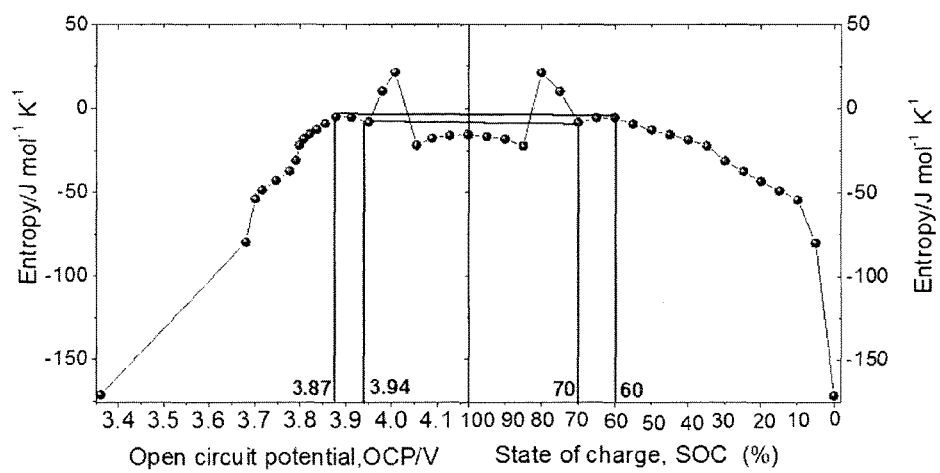
FIG. 46 shows entropy profiles vs. OCP and SOC.
Figure 47:
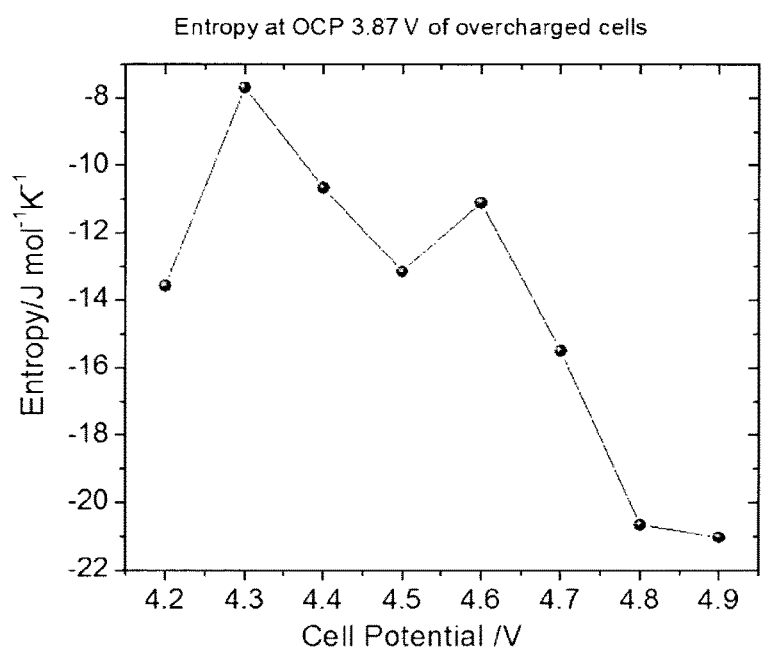
FIG. 47 shows entropy intensity at 3.87 V of overcharged LIB cells vs. COV.
Figure 48:
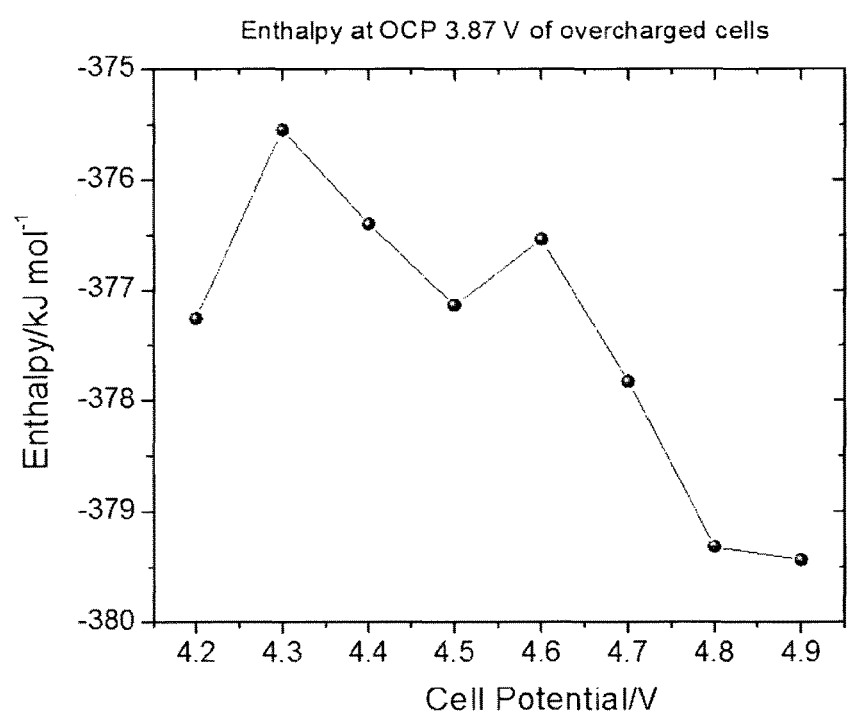
FIG. 48 shows enthalpy intensity at 3.87 V of overcharged LiB vs. COV.
Figure 49:
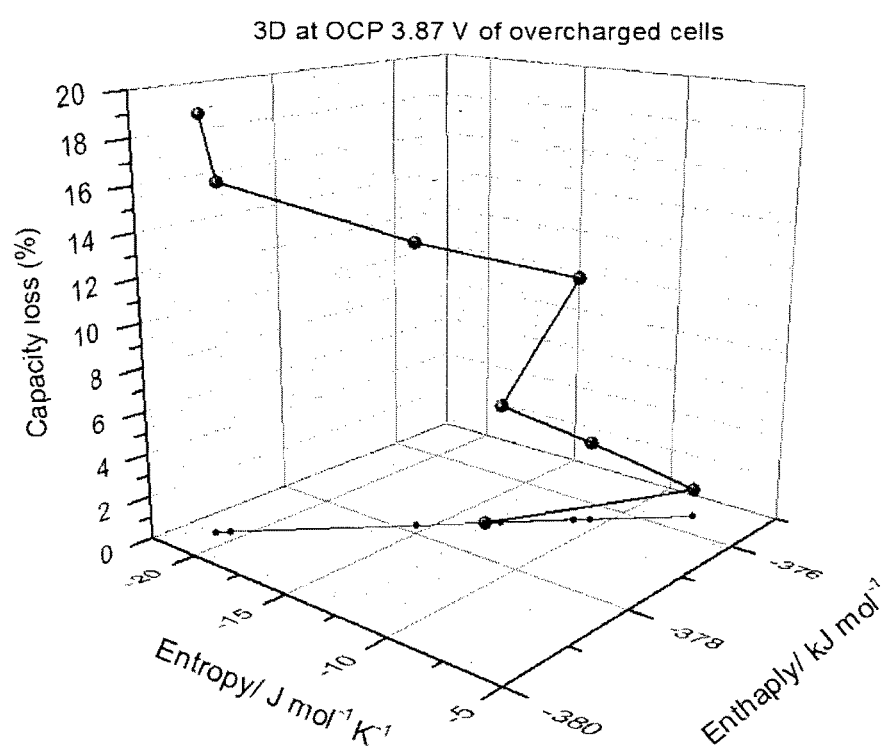
FIG. 49 shows a 3D profile at 3.87 V OCP of LIB overcharged cells.
Figure 50:
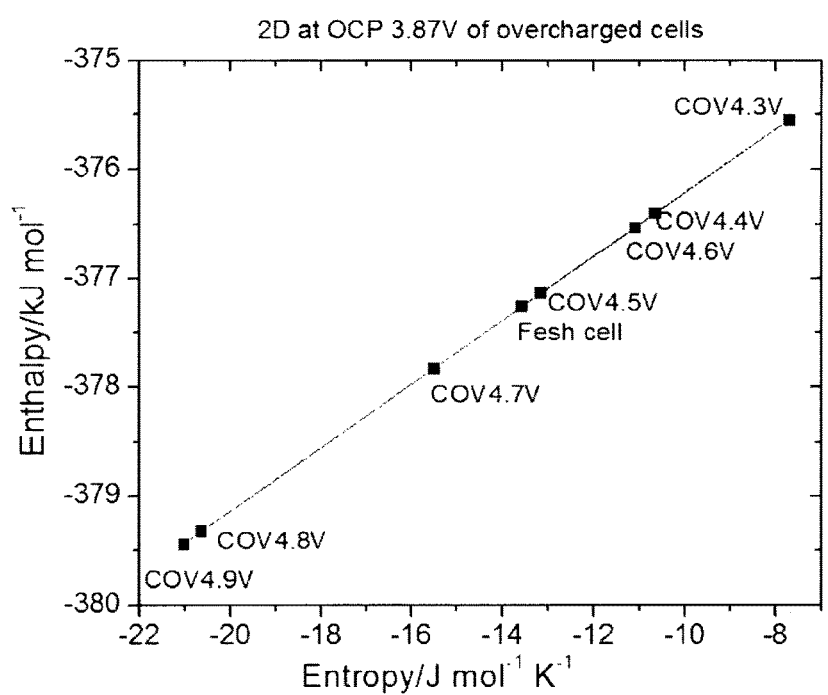
FIG. 50 shows a 2D profile at 3.87 V OCP of LIB overcharged cells.
Figure 51:
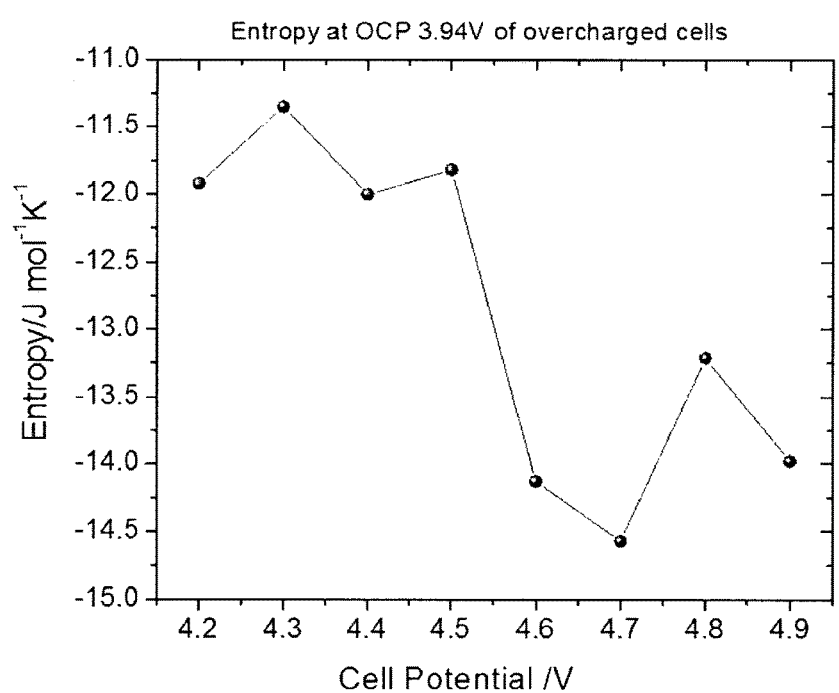
FIG. 51 shows entropy intensity at 3.94 V of overcharged LIB cells vs. COV.
Figure 52:
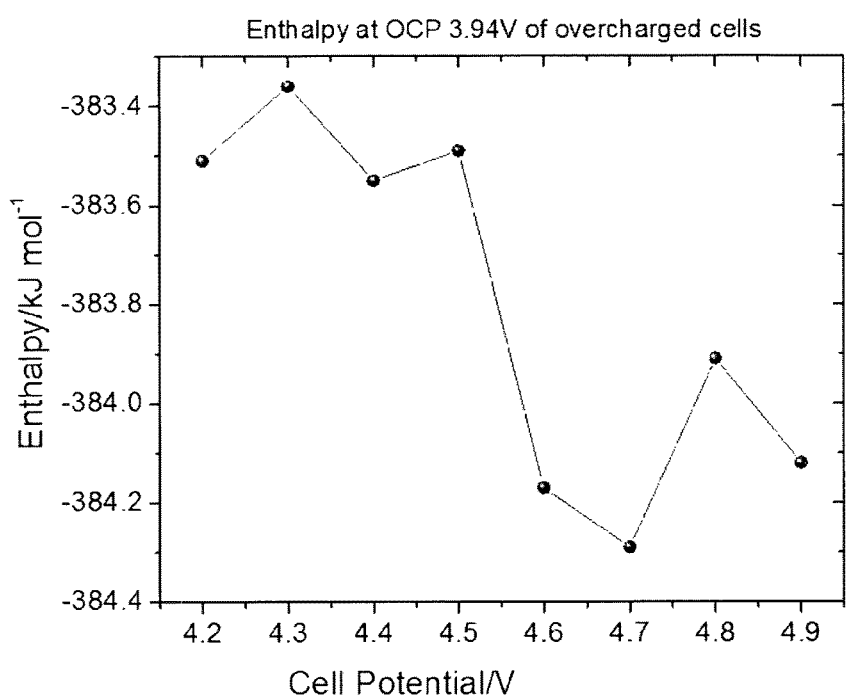
FIG. 52 shows enthalpy intensity 3.94 V of overcharged LiB vs. COV.
Figure 53:
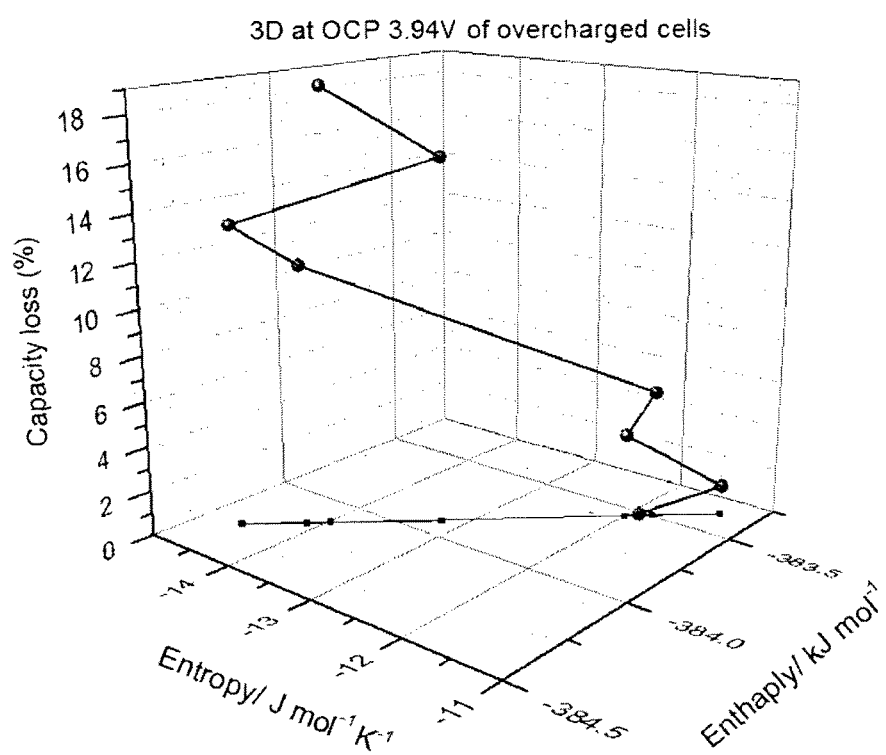
FIG. 53 shows a 3D profile at 3.94 V OCP of LIB overcharged cells.
Figure 54:
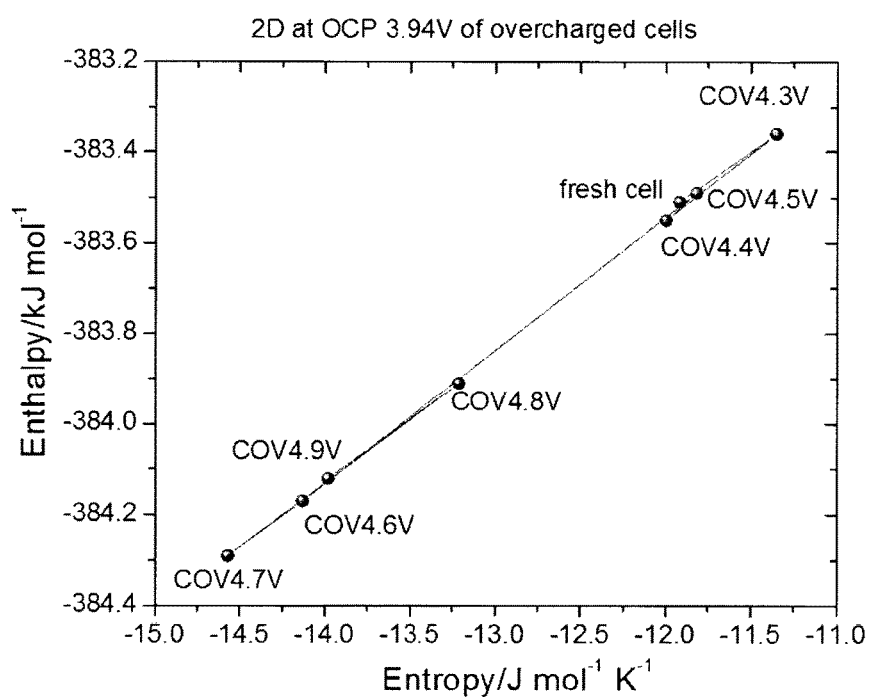
FIG. 54 shows a 2D profile at 3.94 V OCP of LIB overcharged cells.

FIG. 41 shows discharge profiles of LiB cells subjected to different charge cut-off voltages (COV).
FIG. 42 shows entropy profiles of overcharged LiB cells vs. SOC.
FIG. 43 shows entropy profiles of overcharged LIB cells vs. OCP.
FIG. 44 shows enthalpy profiles of overcharged LIB cells vs. SOC.
FIG. 45 shows enthalpy profiles of overcharged LIB cells vs. OCP.
FIG. 46 shows entropy profiles vs. OCP and SOC.
FIG. 47 shows entropy intensity of overcharged LIB cells vs. SOC.
FIG. 48 shows enthalpy intensity of overcharged LiB vs. COV.
FIG. 49 shows a 3D profile at 3.87 V OCP of LIB overcharged cells.
FIG. 50 shows a 2D profile at 3.87 V OCP of LIB overcharged cells.
FIG. 51 shows entropy intensity of overcharged LIB cells vs. COV.
FIG. 52 shows enthalpy intensity of overcharged LiB vs. COV.
FIG. 53 shows a 3D profile at 3.94 V OCP of LIB overcharged cells.
FIG. 54 shows a 2D profile at 3.94 V OCP of LIB overcharged cells.

In the following, thermal ageing will be described.

In the following, experimental steps for thermal ageing will be described.

LiB in coin-cells form factor (2032) rated ~44 mAh were tested according to the following steps:

1. Thermal ageing: A charge to 4.2V under 10 mA constant current (~C/4-rate) at the ambient temperature using an Arbin battery cycler. A thermal storage at initial charged state of 4.2V in an oven set at storage temperature of 60° C.±1° C. and 70° C.±1° C. for a period of time up to 8 weeks. Four cells were taken from the oven at the end of each week and were left to cool to ambient temperatures of ~25° C. The cells where then charged to 4.2V and discharged to 2.75V at C/4 rate using again the Arbin cycler, a step in which the cells' capacity loss was determined.

2. Thermodynamics measurements: The measurements may be the same or similar to the measurements described above for overcharge ageing.

In the following, thermal ageing at 60° C. will be described.

Figure 55:
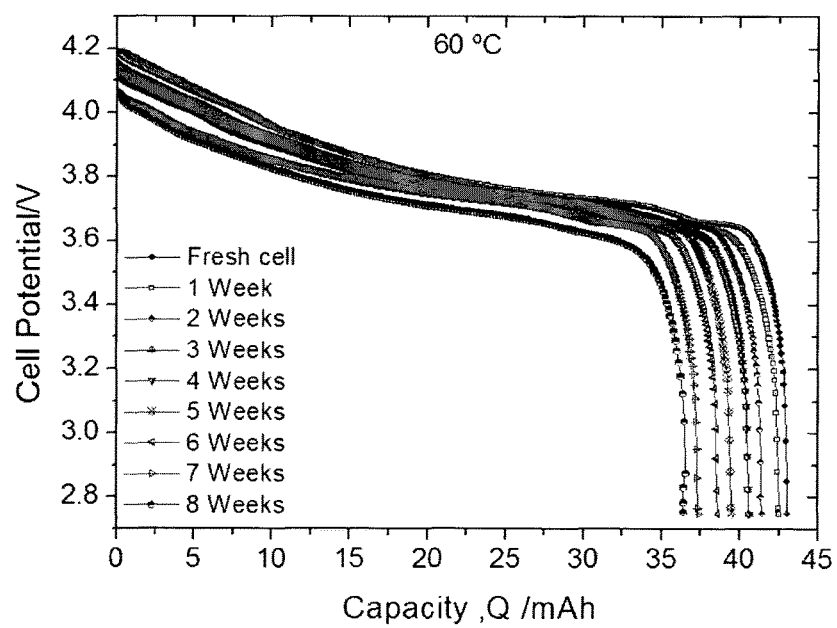
FIG. 55 shows discharge profiles of LiB cells subjected to thermal ageing at 60° C.
Figure 56:
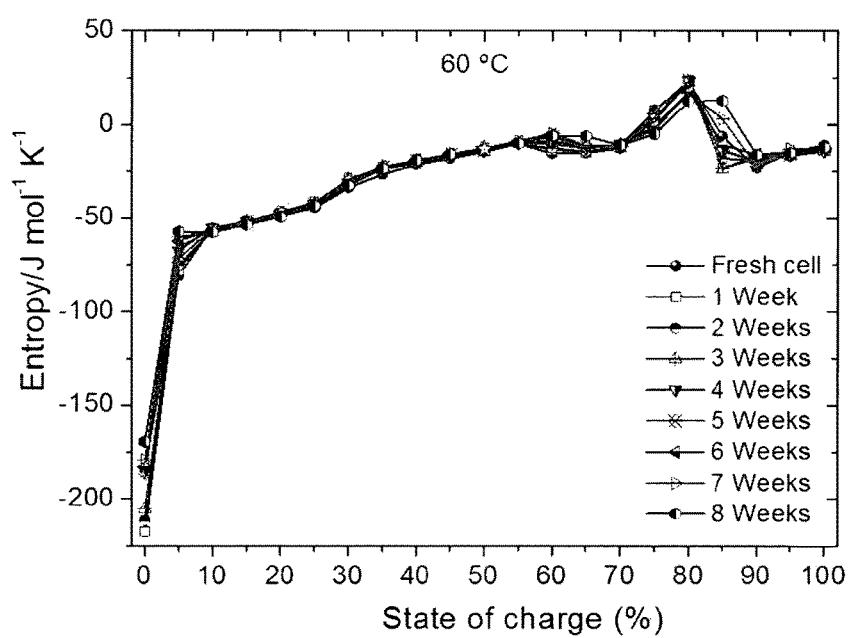
FIG. 56 shows entropy profiles of LIB cells aged at 60° C. vs. SOC.
Figure 57:
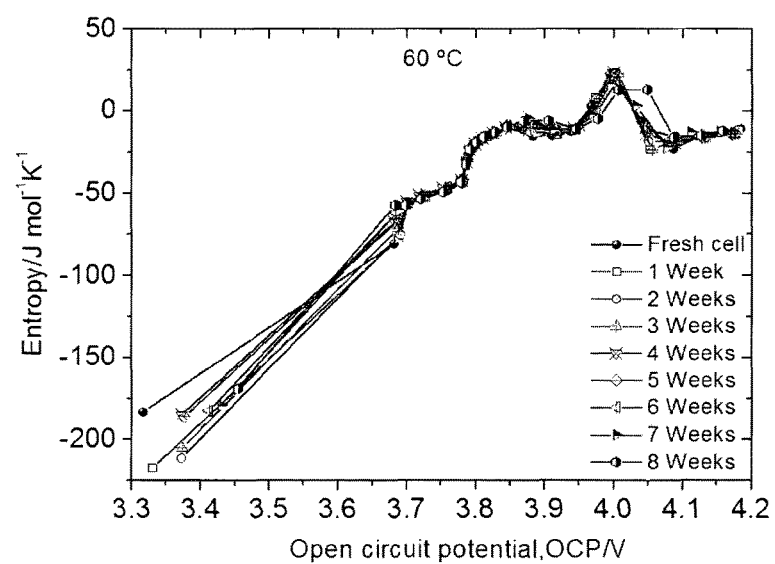
FIG. 57 shows entropy profiles vs. OCP of LIB cells aged at 60° C. vs. OCP.
Figure 58:
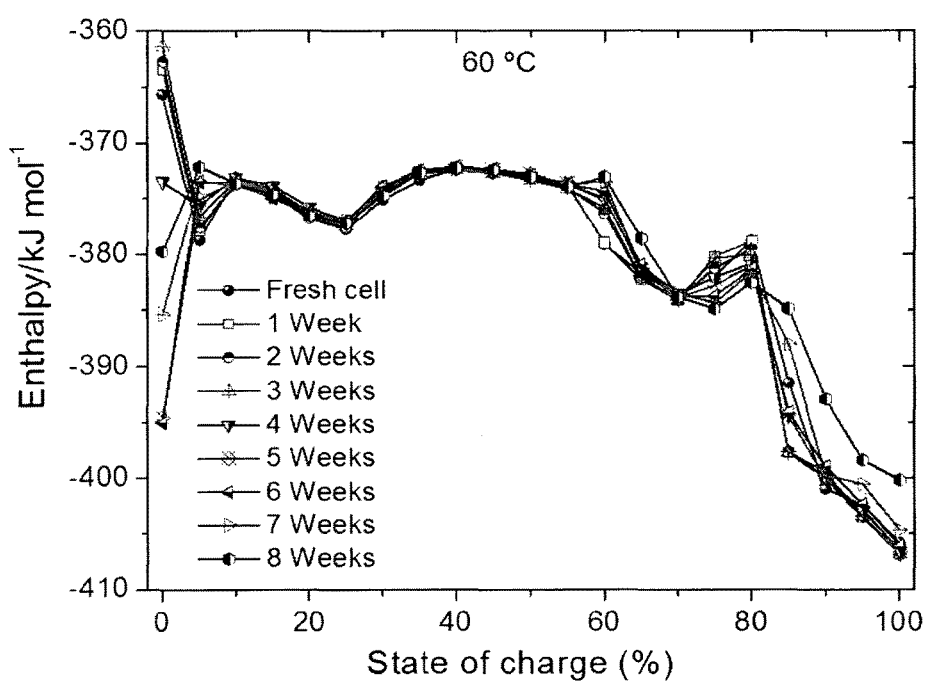
FIG. 58 shows enthalpy profiles of LIB cells aged at 60° C. vs. SOC.
Figure 59:
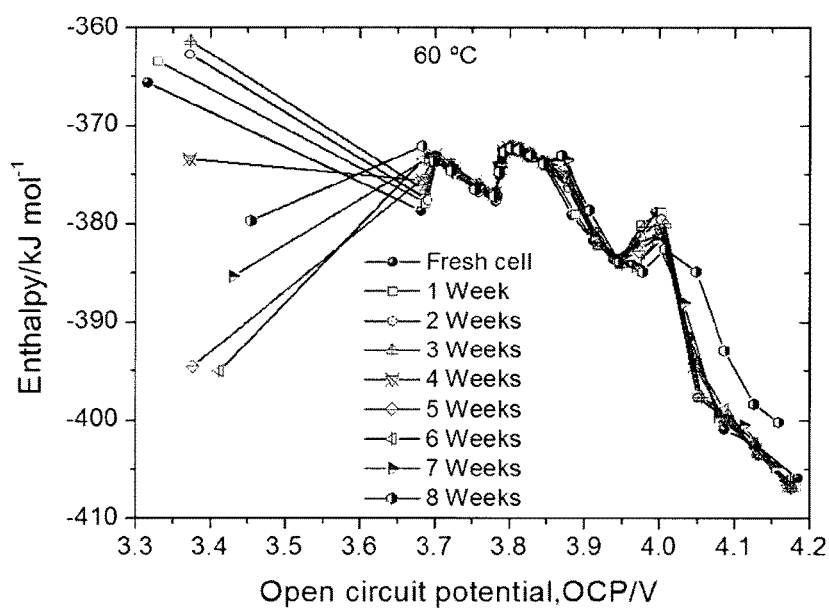
FIG. 59 shows enthalpy profiles of LIB cells aged at 60° C. vs. OCP.
Figure 60:
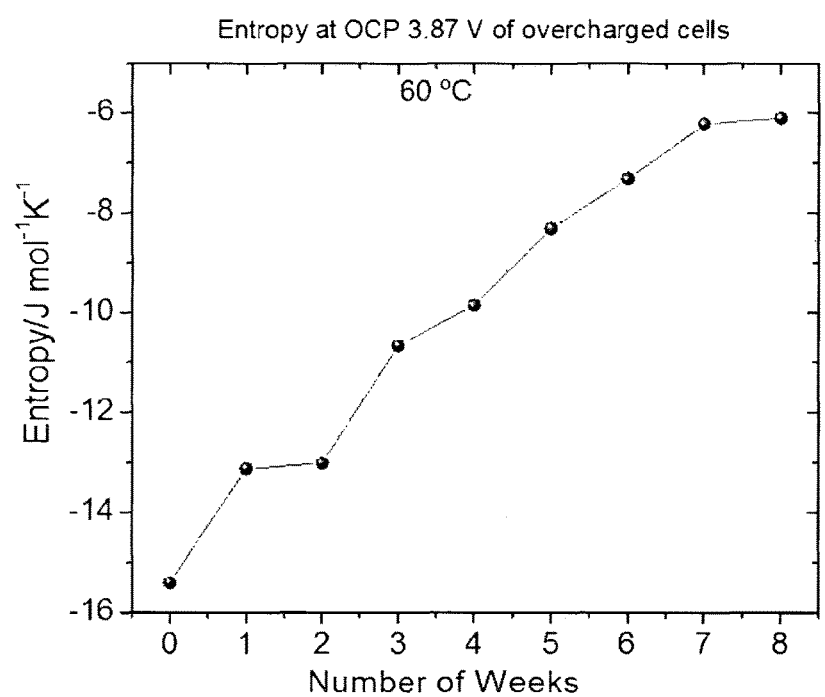
FIG. 60 shows entropy intensity at 3.87 V of aged LIB cells at 60° C. vs. number of weeks.
Figure 61:
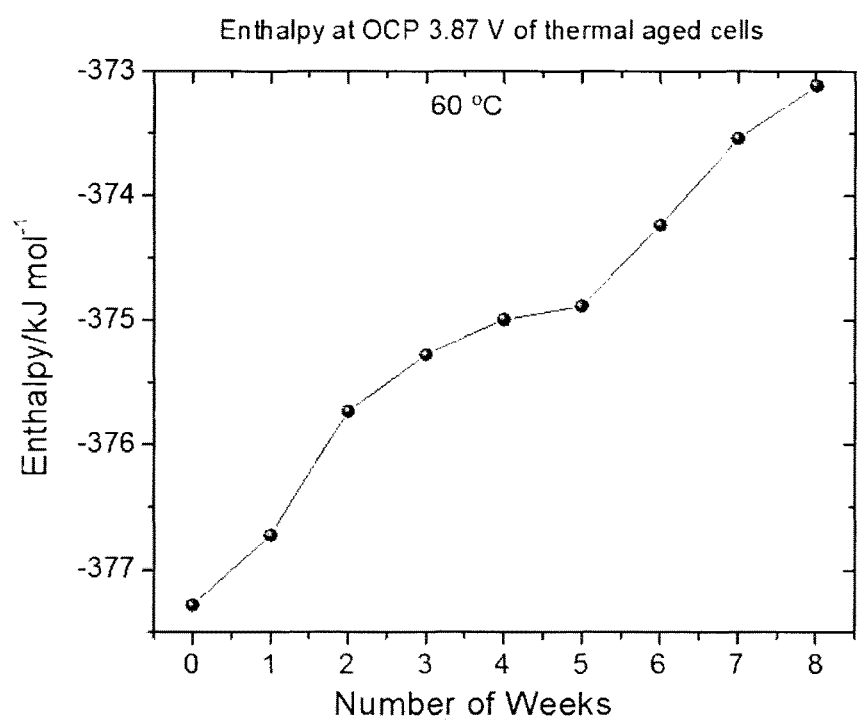
FIG. 61 shows enthalpy intensity at 3.87 V of aged LIB cells at 60° C. vs. number of weeks.
Figure 62:
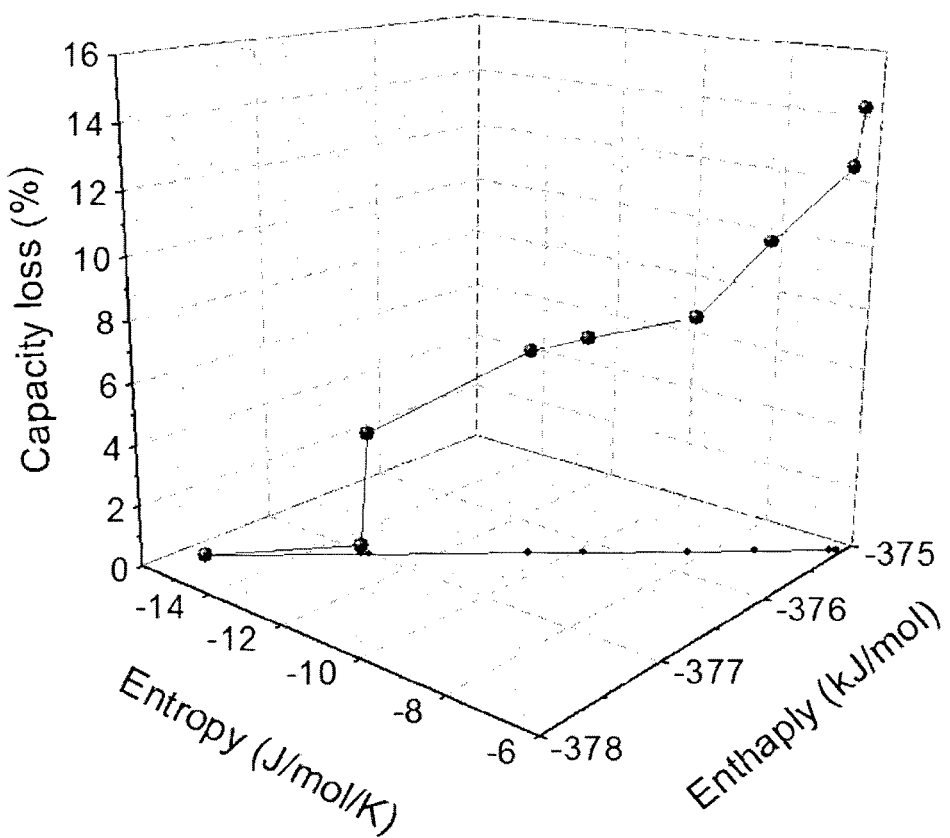
FIG. 62 shows a 3D profile at 3.87 V of LIB cells aged at 60° C.
Figure 63:
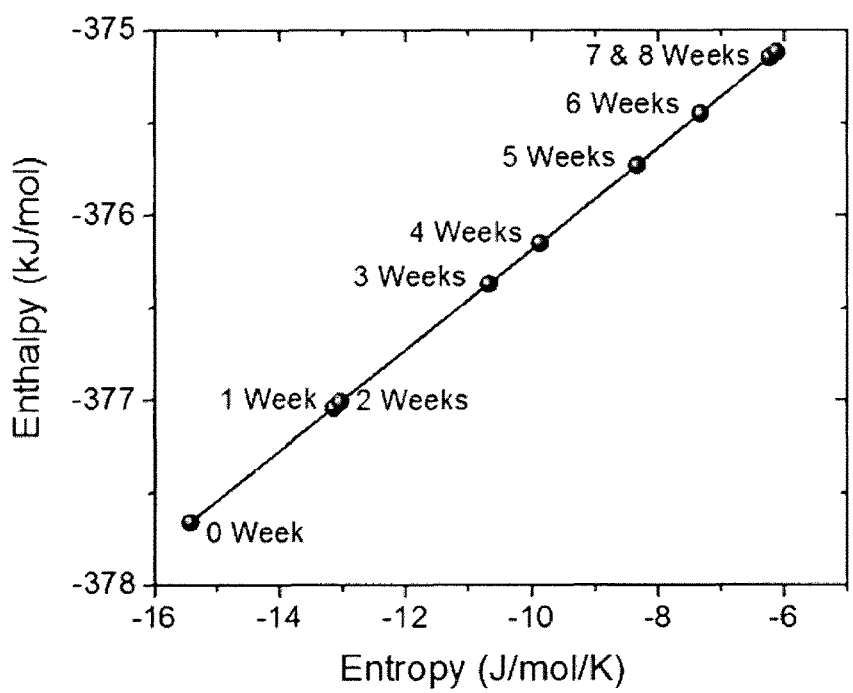
FIG. 63 shows a 2D profile at 3.87 V of LIB cells aged at 60° C.
Figure 64:
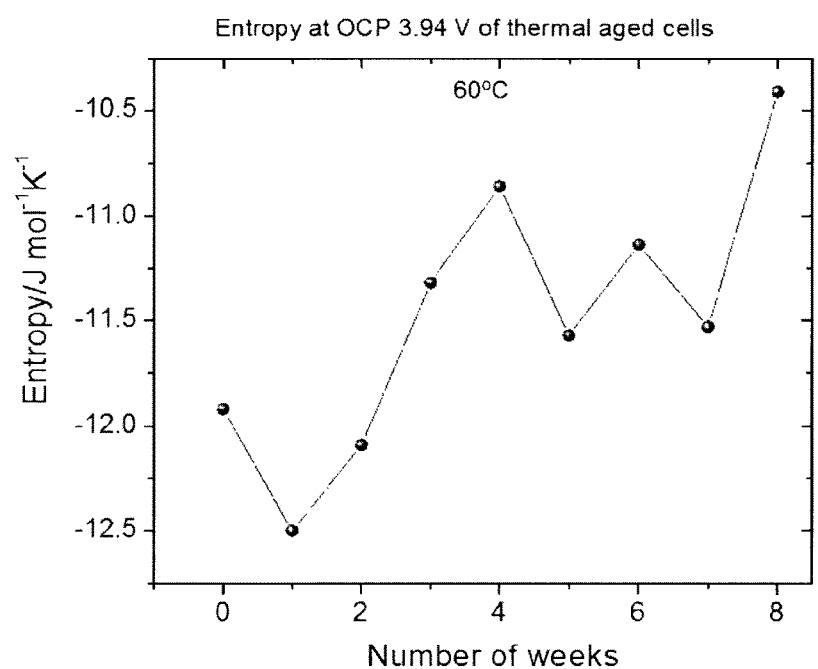
FIG. 64 shows entropy intensity at 3.94 V of aged LIB cells at 60° C. vs. number of weeks.

FIG. 55 shows discharge profiles of LiB cells subjected to thermal ageing at 60° C.
FIG. 56 shows entropy profiles of LIB cells aged at 60° C. vs. SOC.
FIG. 57 shows entropy profiles vs. OCP.
FIG. 58 shows enthalpy profiles of LIB cells aged at 60° C. vs. SOC.
FIG. 59 shows enthalpy profiles of LIB cells aged at 60° C. vs. OCP.
FIG. 60 shows entropy intensity at 3.87 V of aged LIB cells at 60° C. vs. number of weeks.
FIG. 61 shows enthalpy intensity at 3.87 V of aged LIB cells at 60° C. vs. number of weeks.
FIG. 62 shows a 3D profile at 3.87 V of LIB cells aged at 60° C.
FIG. 63 shows a 2D profile at 3.87 V of LIB cells aged at 60° C.
FIG. 64 shows entropy intensity at 3.94 V of aged LIB cells at 60° C. vs. number of weeks.

Figure 65:
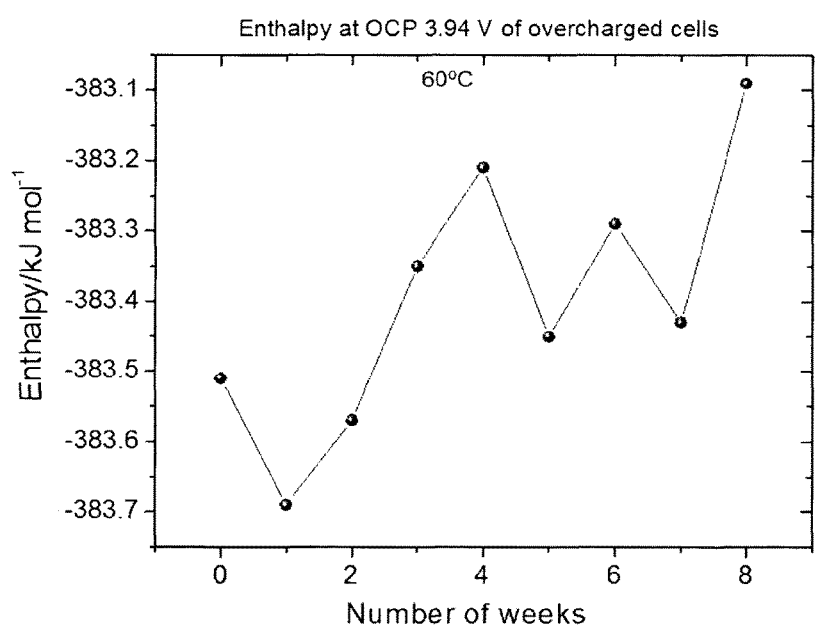
FIG. 65 shows enthalpy intensity at 3.94 V of aged LIB cells at 60° C. vs. number of weeks.

FIG. 65 shows enthalpy intensity at 3.94 V of aged LIB cells at 60° C. vs. number of weeks.

Figure 66:
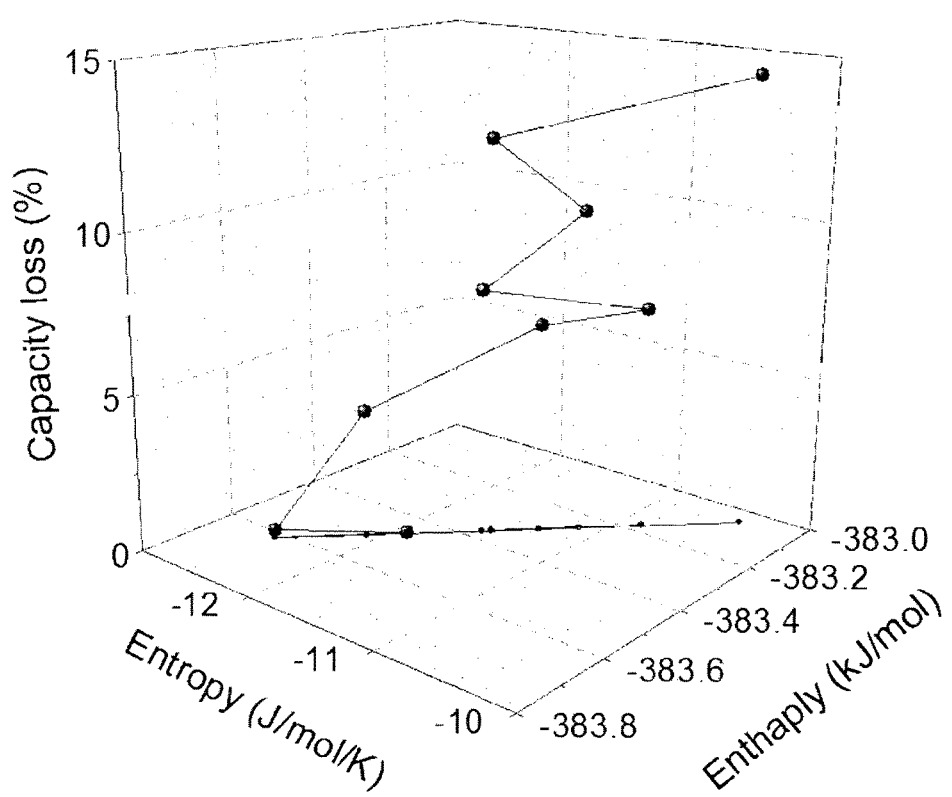
FIG. 66 shows a 3D profile at 3.94 V OCP of LIB cells aged at 60° C.

FIG. 66 shows a 3D profile at 3.94 V OCP of LIB cells aged at 60° C.

Figure 67:
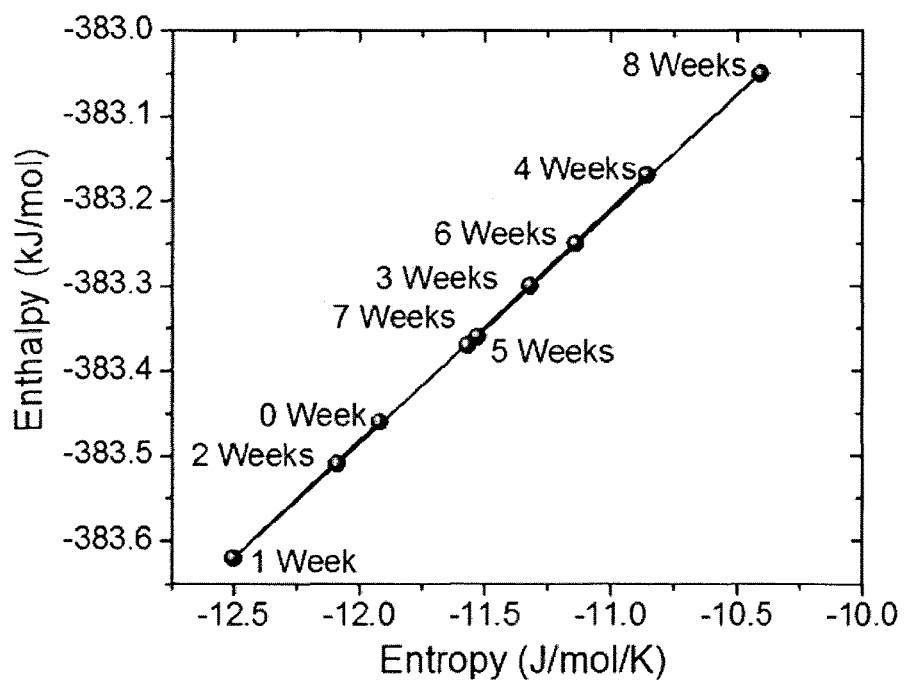
FIG. 67 shows a 2D profile at 3.94 V OCP of LIB cells aged at 60° C.

FIG. 67 shows a 2D profile at 3.94 V OCP of LIB cells aged at 60° C.

In the following, thermal ageing at 70° C. will be described.

Figure 68:
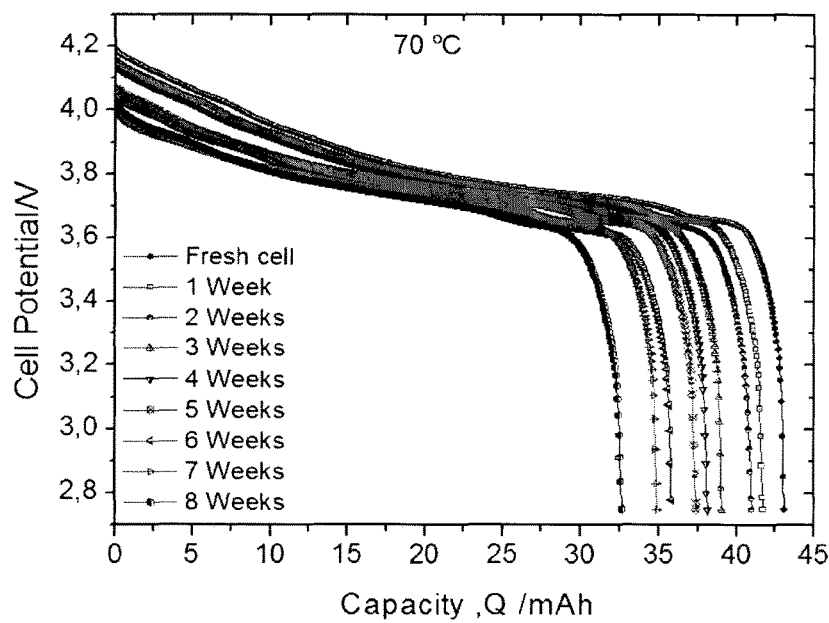
FIG. 68 shows discharge profiles of LiB cells subjected to thermal ageing at 70° C.

FIG. 68 shows discharge profiles of LiB cells subjected to thermal ageing at 70° C.

Figure 69:
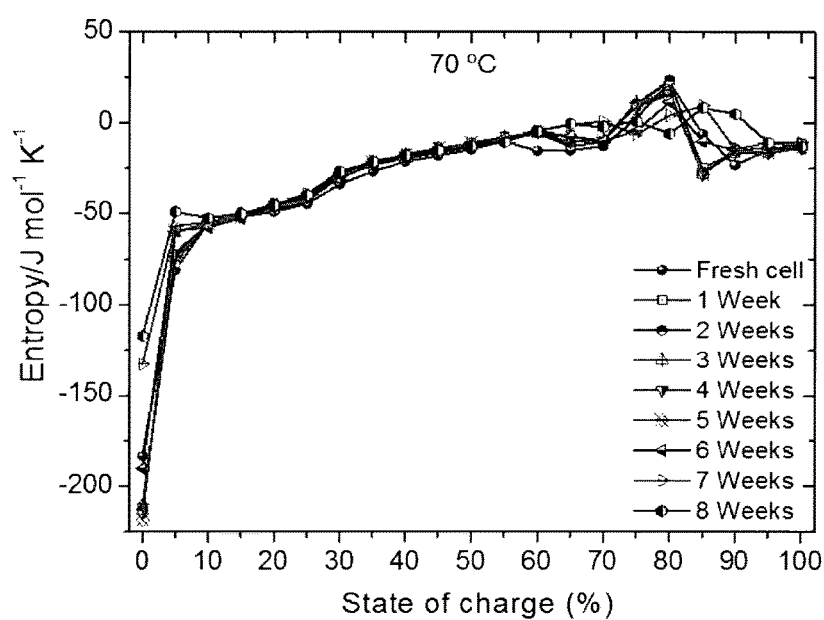
FIG. 69 shows entropy profiles of LIB cells aged at 70° C. vs. SOC.

FIG. 69 shows entropy profiles of LIB cells aged at 70° C. vs. SOC.

Figure 70:
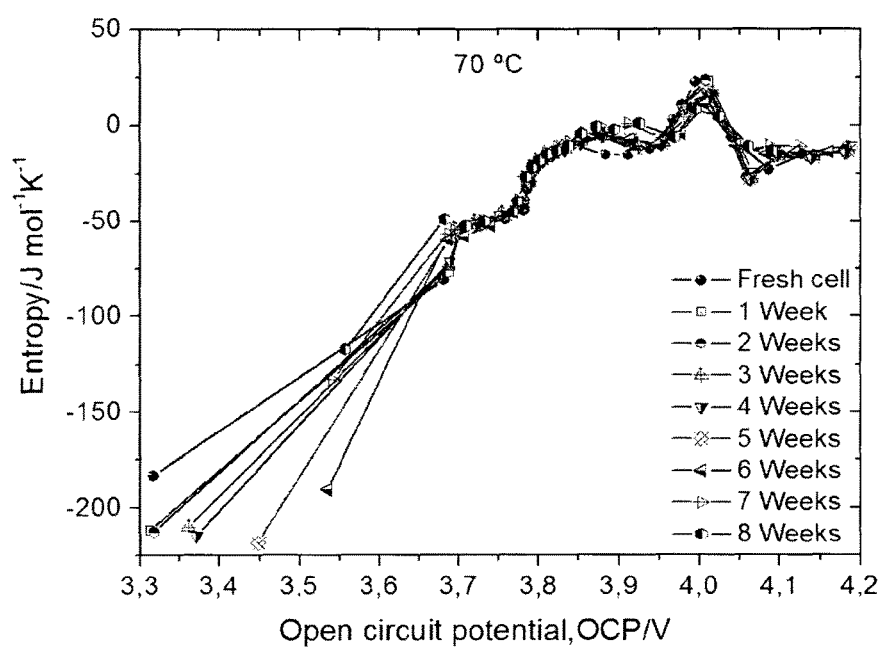
FIG. 70 shows entropy profiles of LIB cells aged at 70° C. vs. OCP.

FIG. 70 shows entropy profiles of LIB cells aged at 70° C. vs. OCP.

Figure 71:
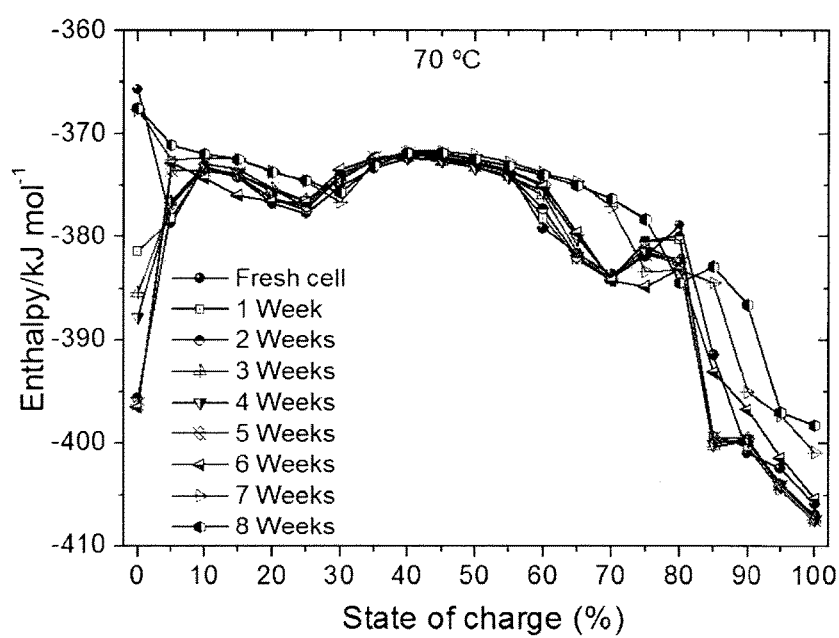
FIG. 71 shows enthalpy profiles of LIB cells aged at 70° C. vs. SOC.

FIG. 71 shows enthalpy profiles of LIB cells aged at 70° C. vs. SOC.

Figure 72:
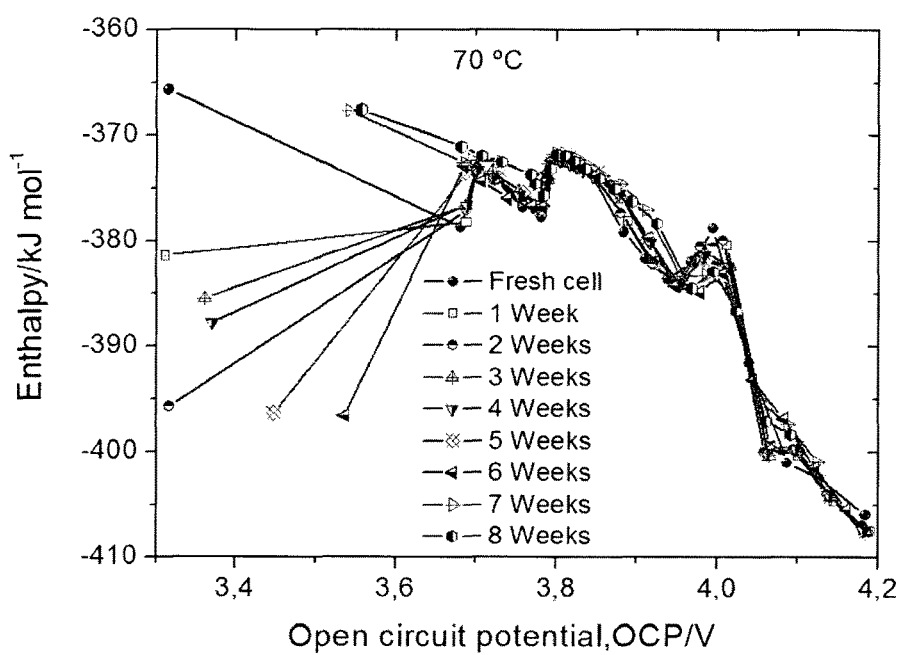
FIG. 72 shows enthalpy profiles of LIB cells aged at 70° C. vs. OCP.

FIG. 72 shows enthalpy profiles of LIB cells aged at 70° C. vs. OCP.

Figure 73:
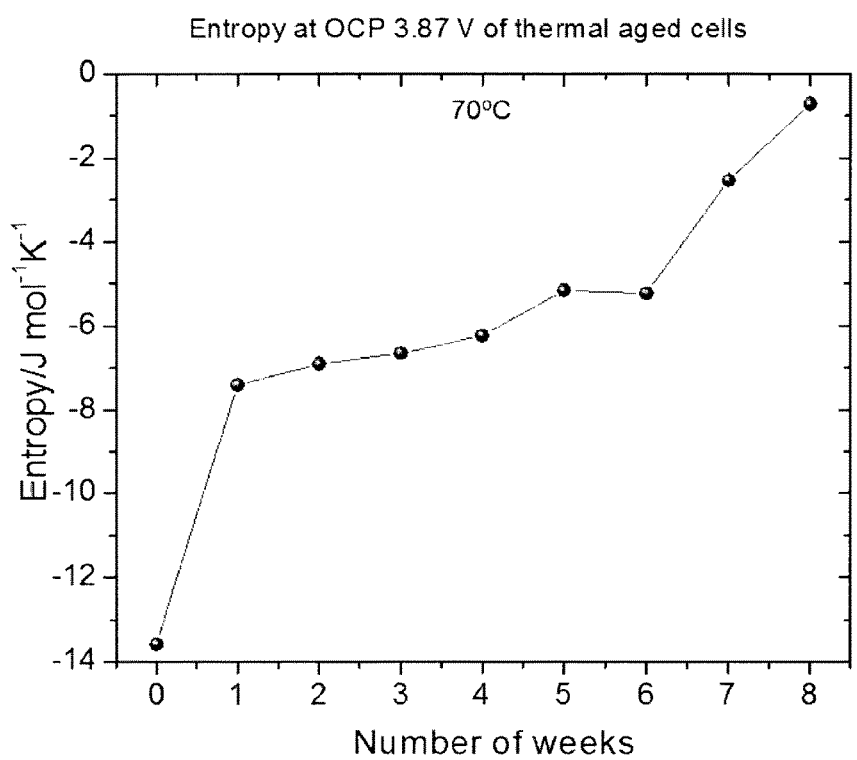
FIG. 73 shows entropy intensity at 3.87 V of aged LIB cells at 70° C. vs. number of weeks.

FIG. 73 shows entropy intensity at 3.87 V of aged LIB cells at 70° C. vs. number of weeks.

Figure 74:
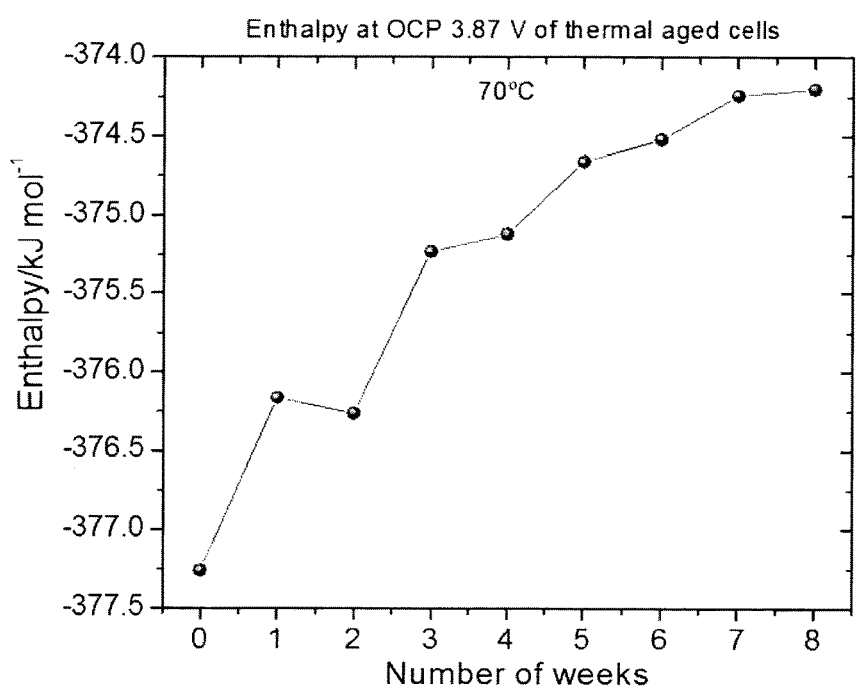
FIG. 74 shows enthalpy intensity at 3.87 V of aged LIB cells at 70° C. vs. number of weeks.

FIG. 74 shows enthalpy intensity at 3.87 V of aged LIB cells at 70° C. vs. number of weeks.

Figure 75:
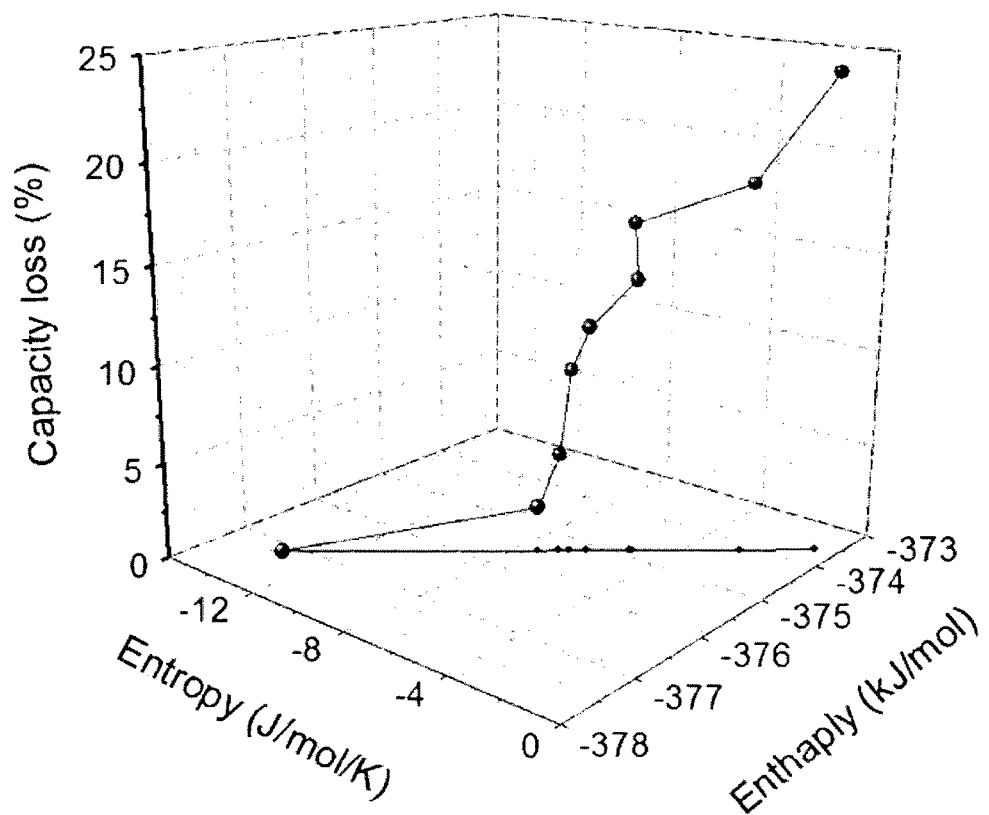
FIG. 75 shows a 3D profile at 3.87 V of LIB cells aged at 70° C.

FIG. 75 shows a 3D profile at 3.87 V of LIB cells aged at 70° C.

Figure 76:
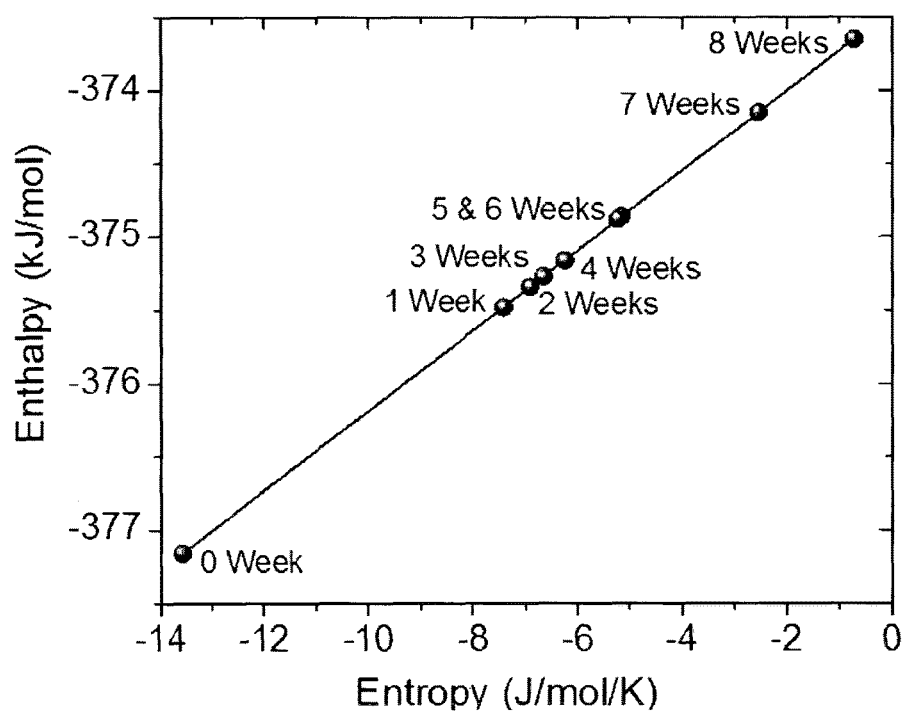
FIG. 76 shows a 2D profile at 3.87 V of LIB cells aged at 70° C.

FIG. 76 shows a 2D profile at 3.87 V of LIB cells aged at 70° C.

Figure 77:
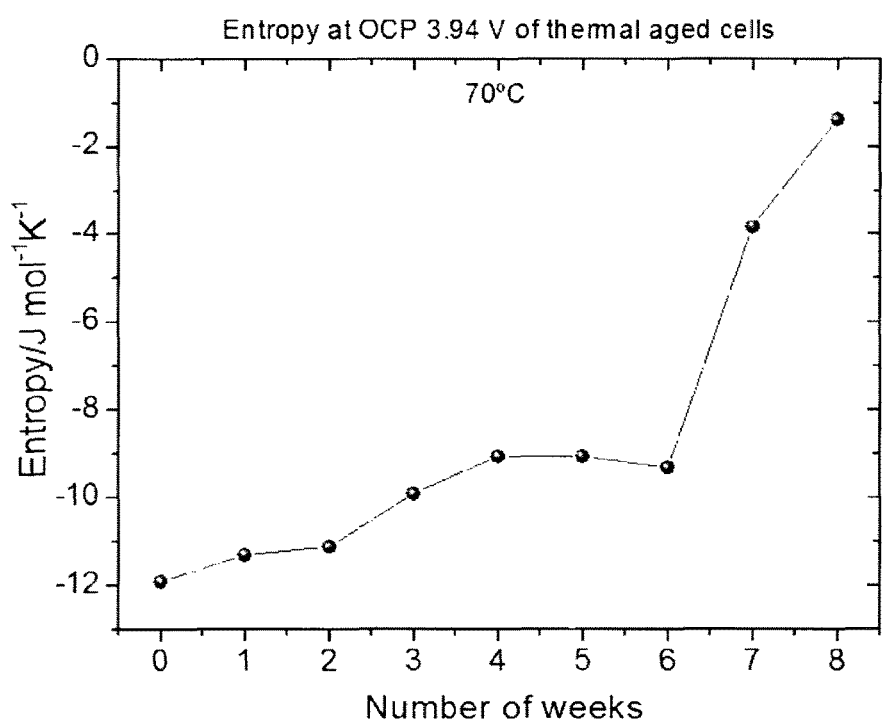
FIG. 77 shows entropy intensity at 3.94 V of aged LIB cells at 70° C. vs. number of weeks.

FIG. 77 shows entropy intensity at 3.94 V of aged LIB cells at 70° C. vs. number of weeks.

Figure 78:
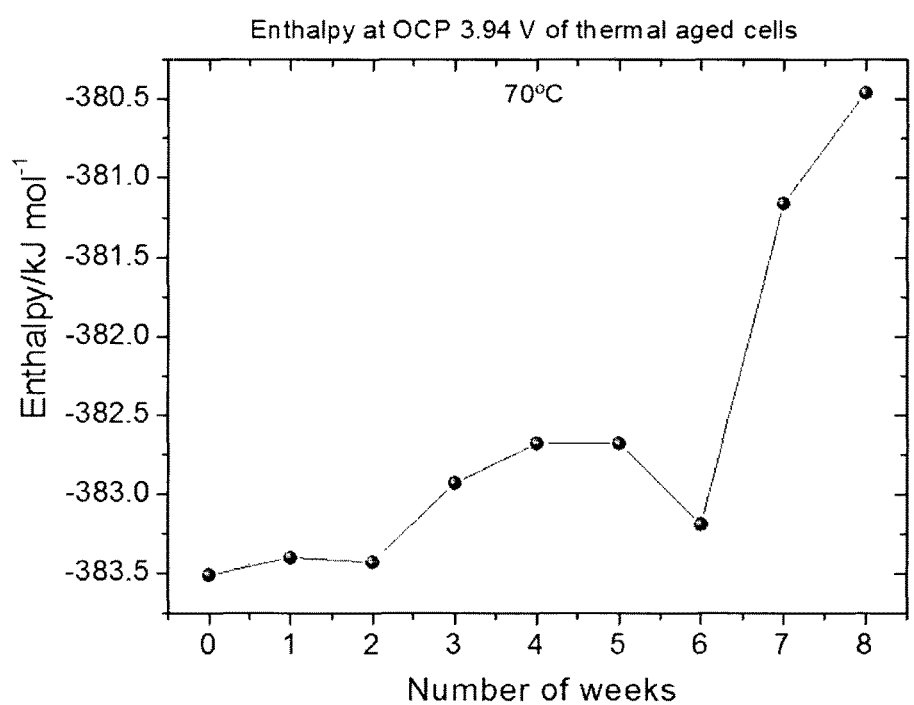
FIG. 78 shows enthalpy intensity at 3.94 V of aged LIB cells at 70° C. vs. number of weeks.

FIG. 78 shows enthalpy intensity at 3.94 V of aged LIB cells at 70° C. vs. number of weeks.

Figure 79:
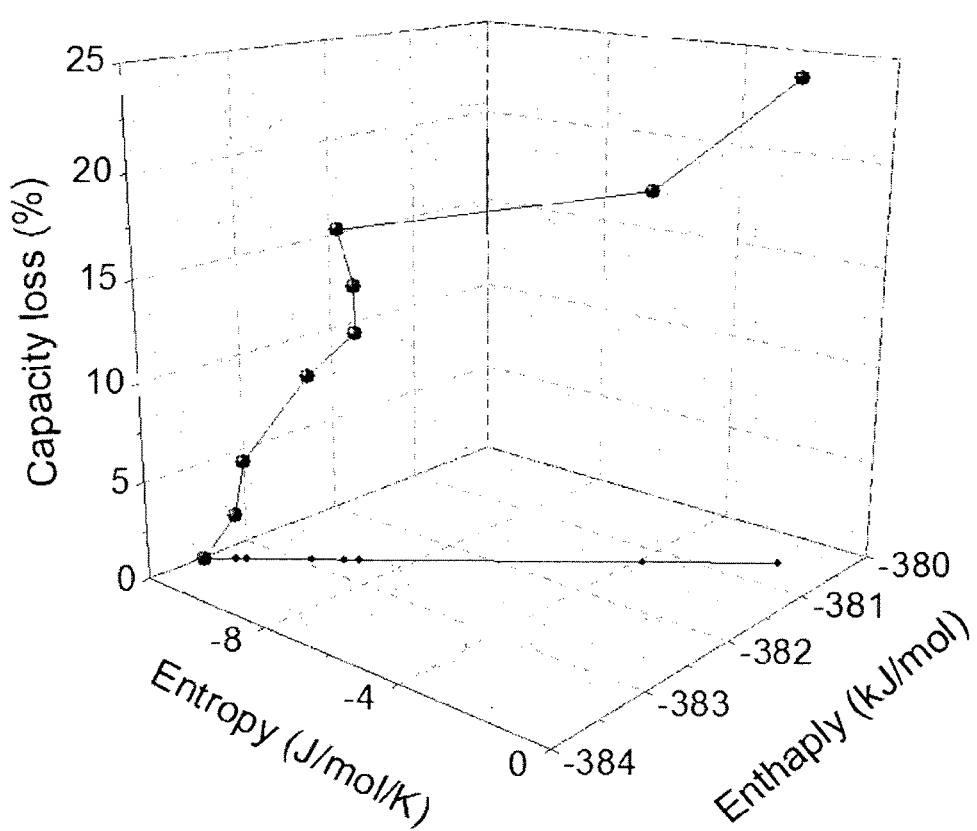
FIG. 79 shows a 3D profile at 3.94 V OCP of LIB cells aged at 70° C.

FIG. 79 shows a 3D profile at 3.94 V OCP of LIB cells aged at 70° C.

Figure 80:
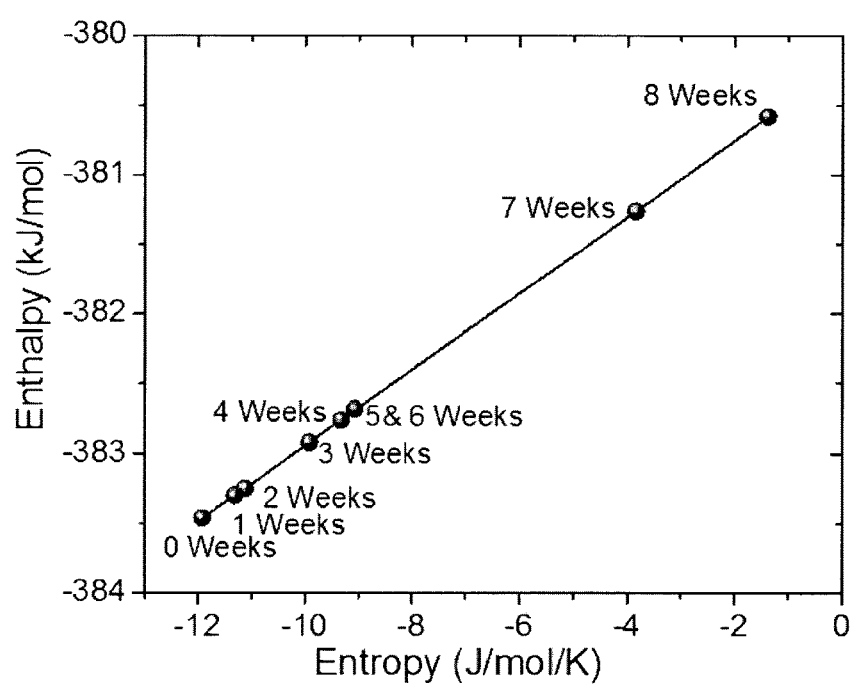
FIG. 80 shows a 2D profile at 3.94 V OCP of LIB cells aged at 70° C.

FIG. 80 shows a 2D profile at 3.94 V OCP of LIB cells aged at 70° C.

In the following, long cycling ageing will be described.

In the following, experimental steps for cycling ageing will be described.

LiB in coin-cells form factor (2032) rated 44 mAh were tested according to the following steps:

1. Cycling ageing: The cells were charged to 4.2 V under 20 mA constant current (~C/2) at ambient temperature. Discharge was carried out at the same current of 20 mA to 2.75 V using Arbin battery cycler. The cells were cycled up to 1000 cycles.

2. Thermodynamics measurements: After each 100 cycles, cells where then transferred to the Electrochemical Thermodynamics Measurement System (ETMS) (the measurements may be similar to or the same as described above for overcharge ageing).

Figure 81:
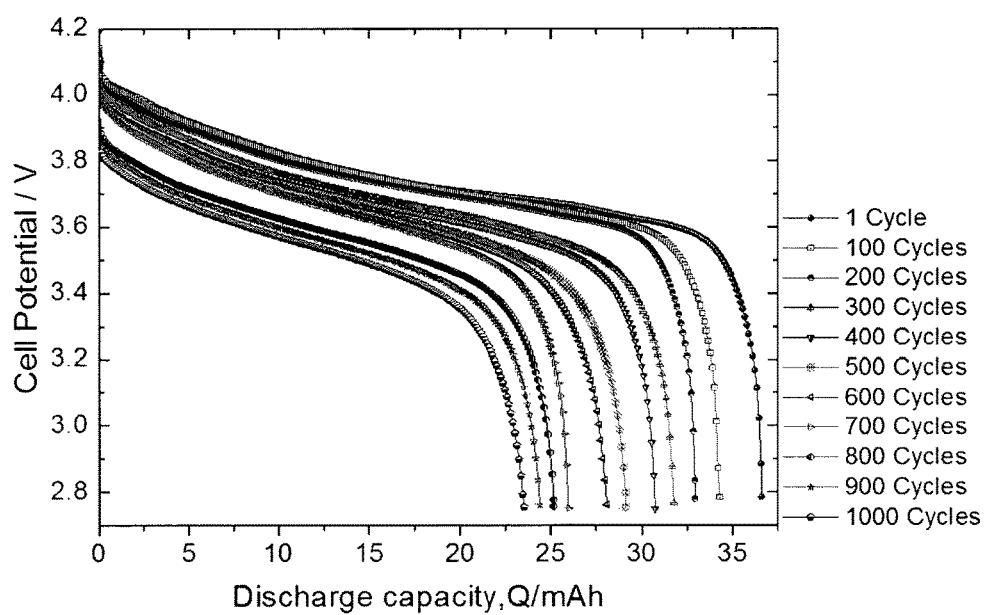
FIG. 81 shows discharge profiles for a LiB cell after every 100 cycles.

FIG. 81 shows discharge profiles for a LiB cell after every 100 cycles.

Figure 82:
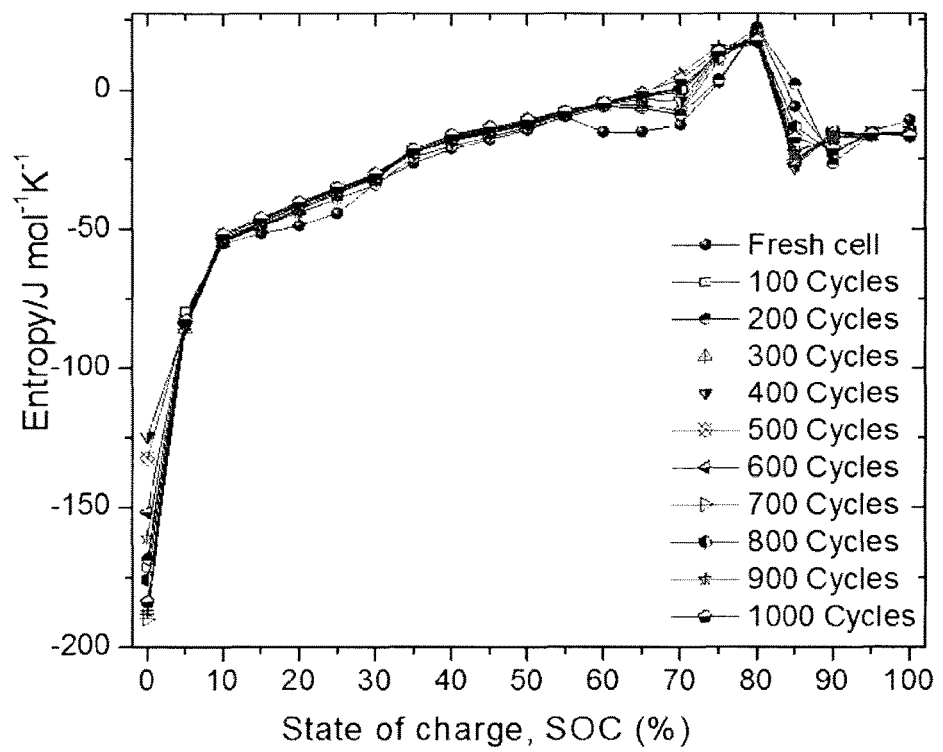
FIG. 82 shows entropy profiles of LIB cycled up to 1000 cycles vs. SOC.

FIG. 82 shows entropy profiles of LIB cycled up to 1000 cycles vs. SOC.

Figure 83:
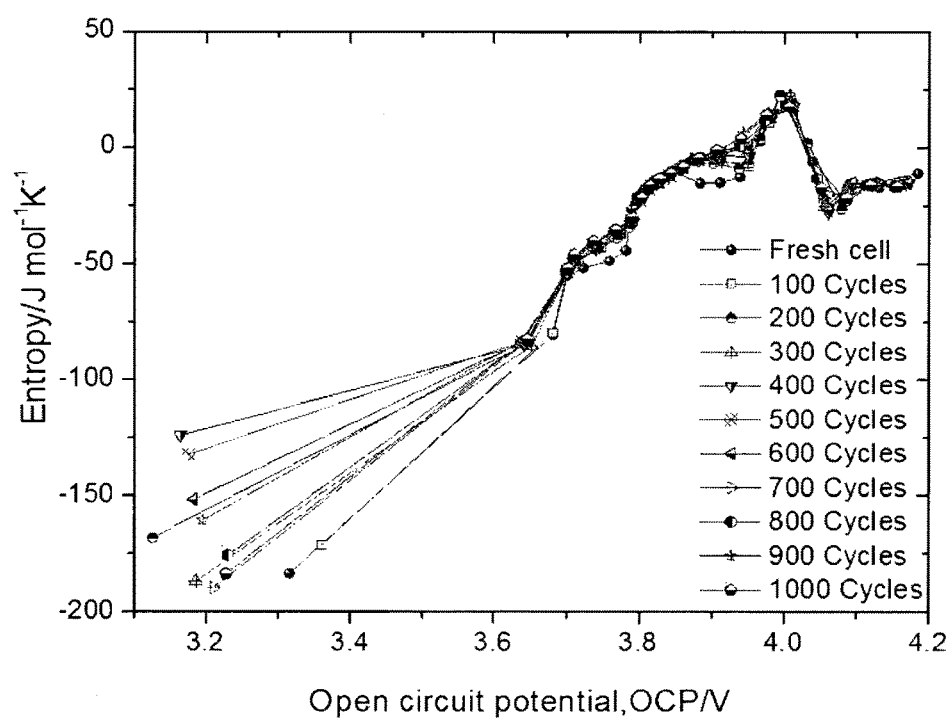
FIG. 83 shows entropy profiles of LIB cycled up to 1000 cycles vs. OCP.

FIG. 83 shows entropy profiles of LIB cycled up to 1000 cycles vs. OCP.

Figure 84:
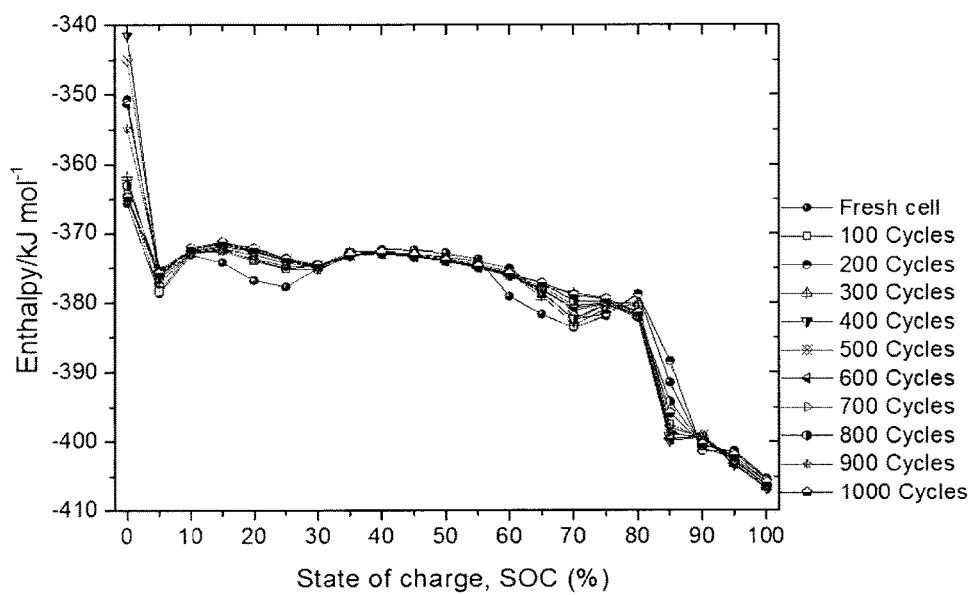
FIG. 84 shows enthalpy profiles of LIB cycled up to 1000 cycles vs. SOC.

FIG. 84 shows enthalpy profiles of LIB cycled up to 1000 cycles vs. SOC.

Figure 85:
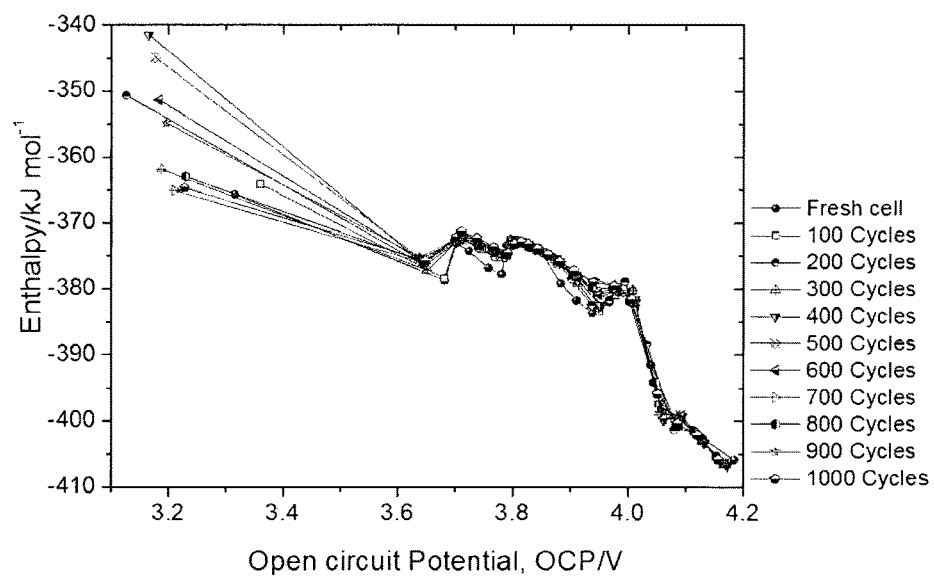
FIG. 85 shows enthalpy profiles of LIB cycled up to 1000 cycles vs. OCP.

FIG. 85 shows enthalpy profiles of LIB cycled up to 1000 cycles vs. OCP.

Figure 86:
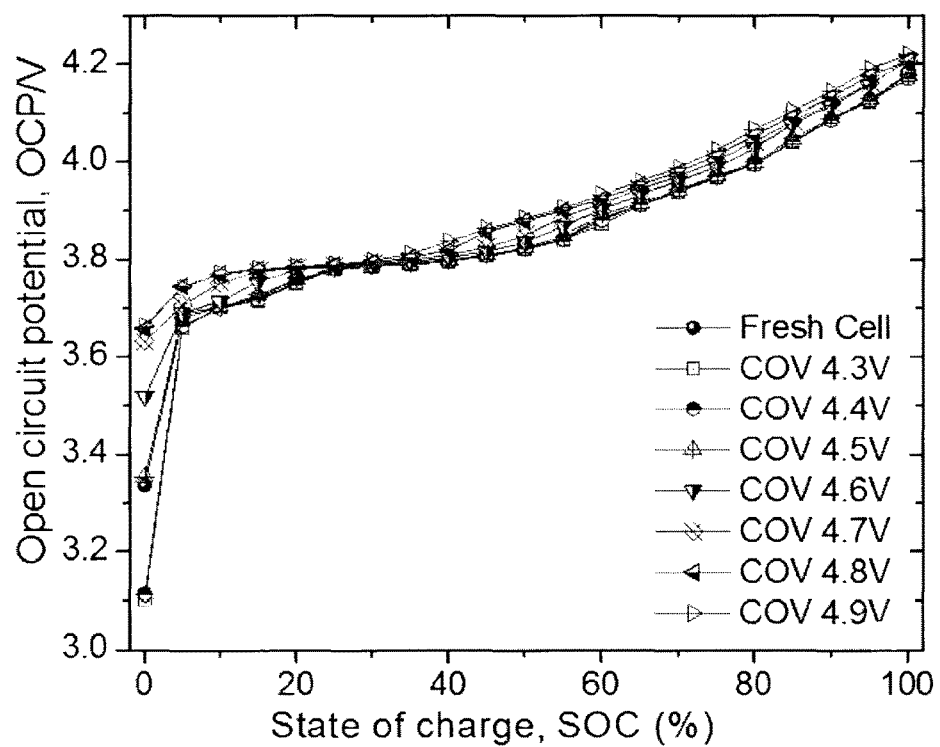
FIG. 86 shows OCP profiles of LIB cells vs. SOC, wherein cells were subjected to different COV.

FIG. 86 shows OCP profiles of LIB cells vs. SOC, wherein cells were subjected to different COV.

Figure 87:
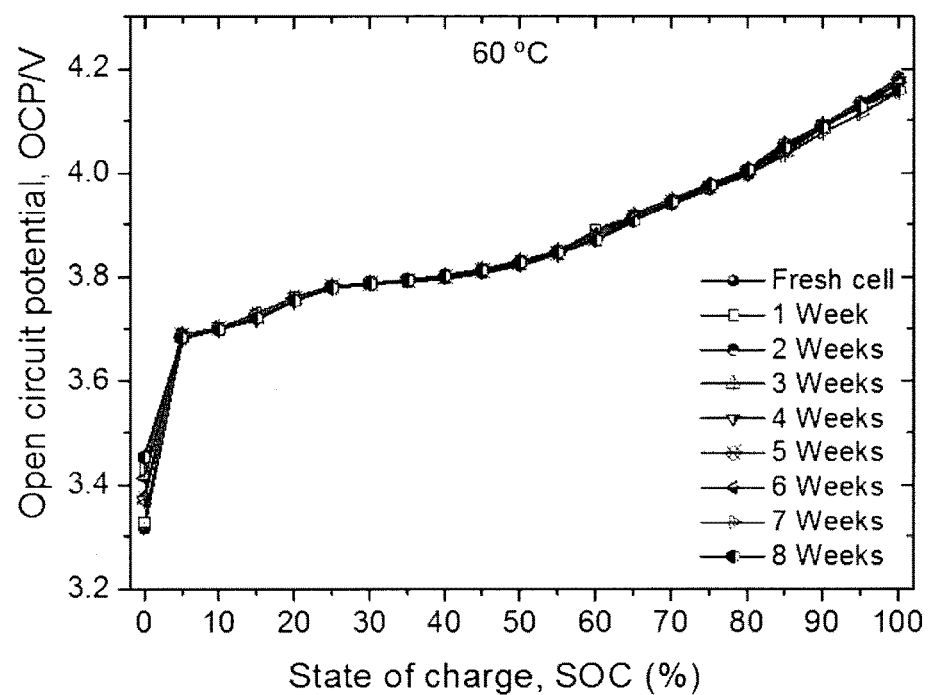
FIG. 87 shows OCP profiles of LIB cells vs. SOC, wherein cells were subjected to thermal ageing at 60° C.

FIG. 87 shows OCP profiles of LIB cells vs. SOC, wherein cells were subjected to thermal ageing at 60° C.

Figure 88:
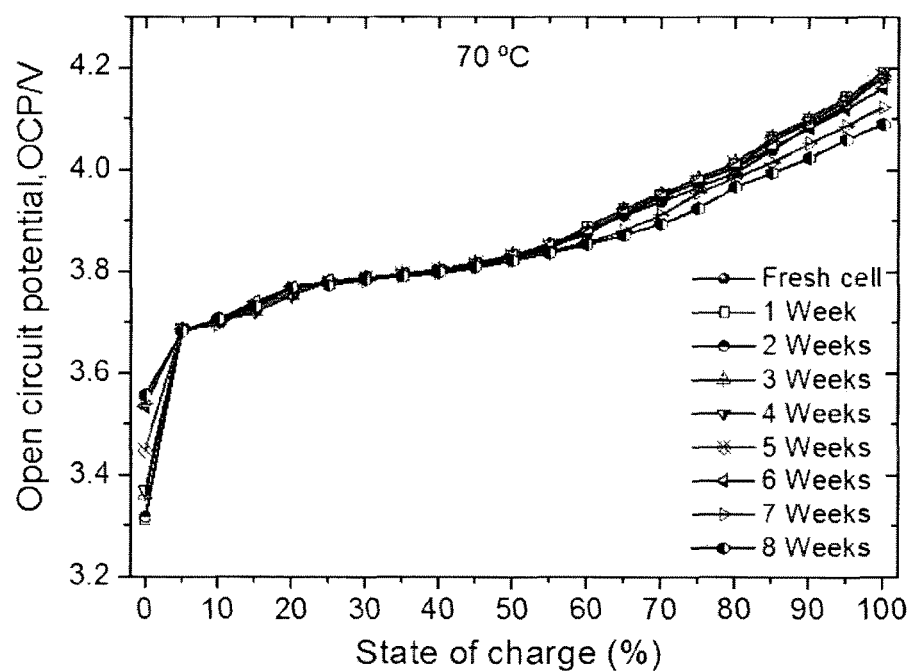
FIG. 88 shows OCP profiles of LIB cells vs. SOC, wherein cells were subjected to thermal ageing at 70° C.

FIG. 88 shows OCP profiles of LIB cells vs. SOC, wherein cells were subjected to thermal ageing at 70° C.

Figure 89:
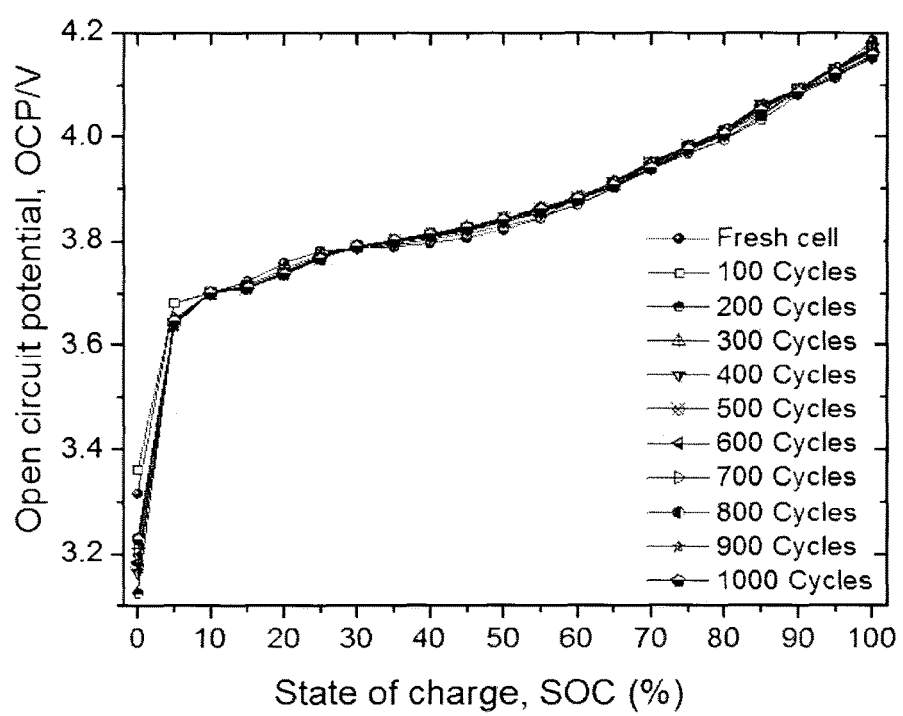
FIG. 89 shows OCP profiles of LIB cells vs. SOC, wherein cells were subjected to long cycling ageing.

FIG. 89 shows OCP profiles of LIB cells vs. SOC, wherein cells were subjected to long cycling ageing.

Figure 90:
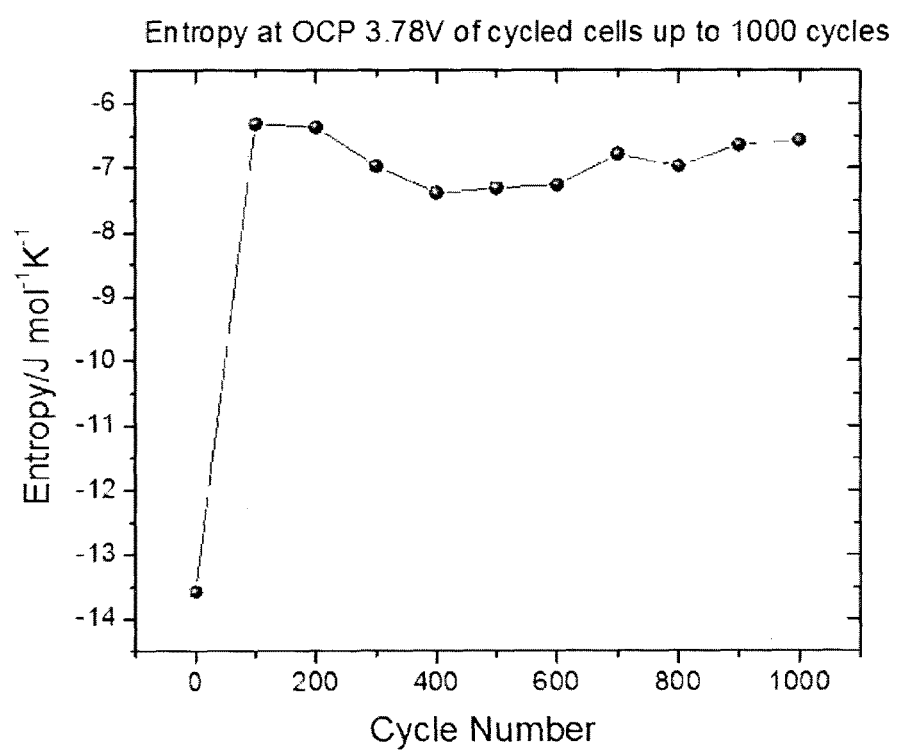
FIG. 90 shows entropy intensity at 3.87 V of cycled LIB cells vs. cycle number.

FIG. 90 shows entropy intensity at 3.87 V of cycled LIB cells vs. cycle number.

Figure 91:
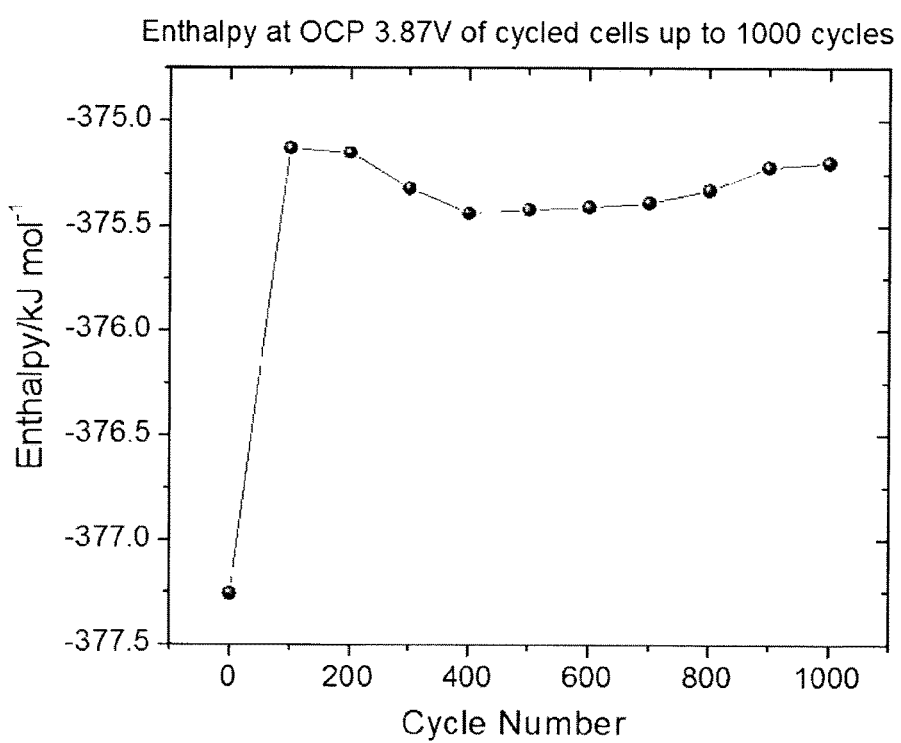
FIG. 91 shows enthalpy intensity at 3.87 V of cycled LIB cells vs. cycle number.

FIG. 91 shows enthalpy intensity at 3.87 V of cycled LIB cells vs. cycle number.

Figure 92:
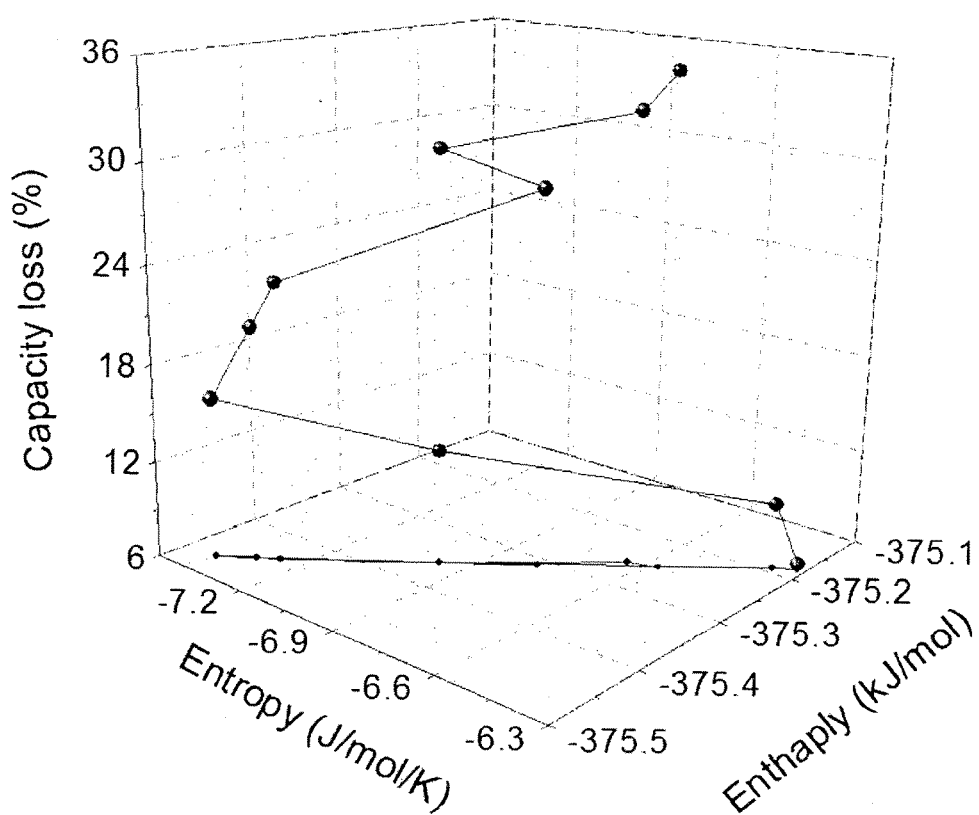
FIG. 92 shows a 3D profile at 3.87 V OCP of LIB cells cycled up to 1000 cycles.

FIG. 92 shows a 3D profile at 3.87 V OCP of LIB cells cycled up to 1000 cycles.

Figure 93:
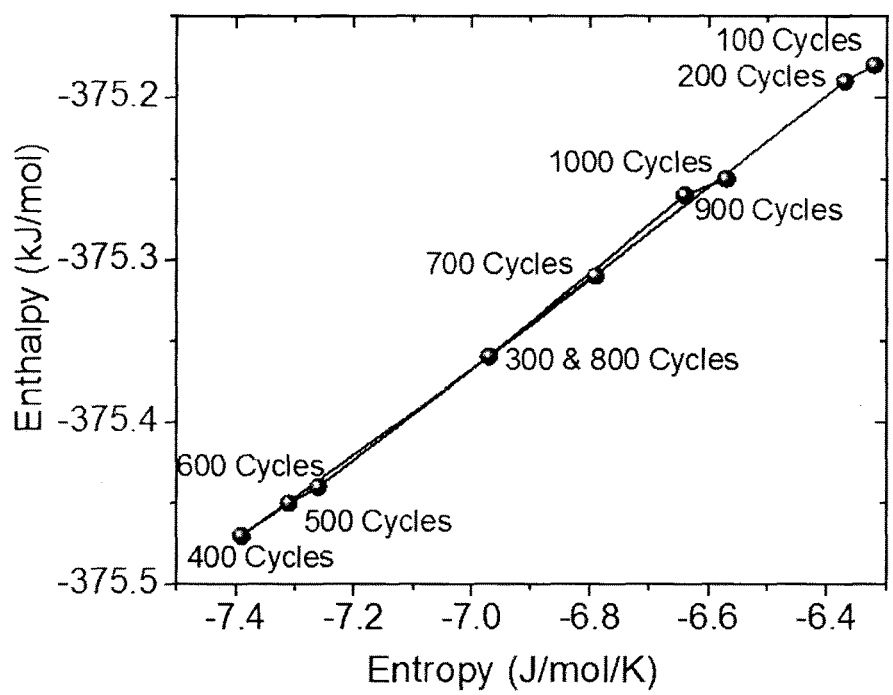
FIG. 93 shows a 2D profile at 3.87 V OCP of LIB cells cycled up to 1000 cycles.

FIG. 93 shows a 2D profile at 3.87 V OCP of LIB cells cycled up to 1000 cycles.

Figure 94:
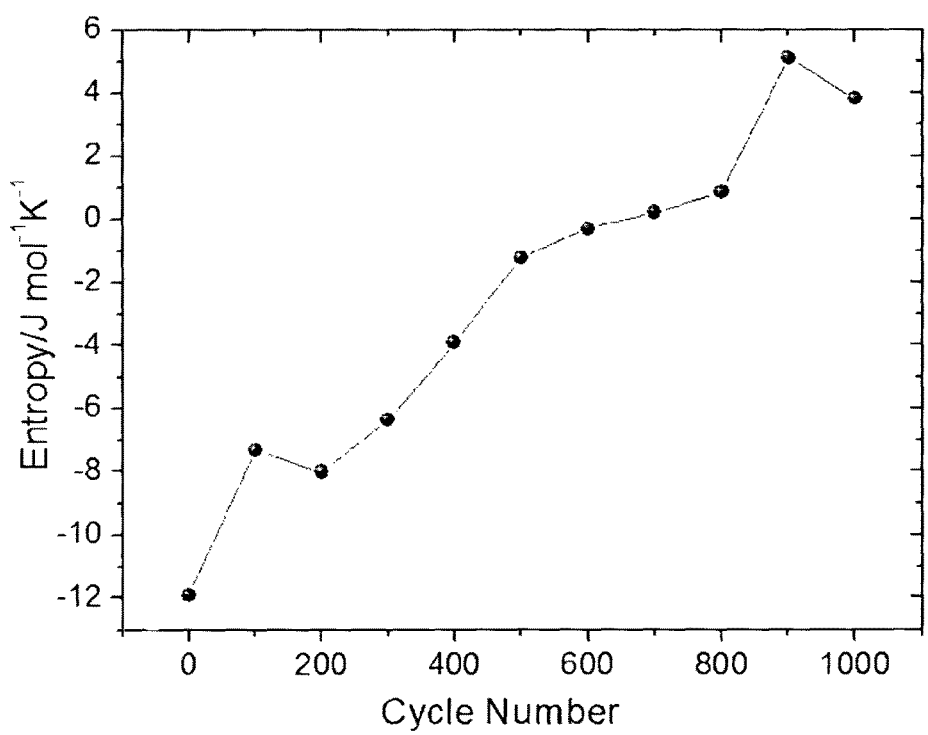
FIG. 94 shows entropy intensity 3.94 V of cycled LIB cells vs. cycle number.

FIG. 94 shows entropy intensity at 3.94 V of cycled LIB cells vs. cycle number.

Figure 95:
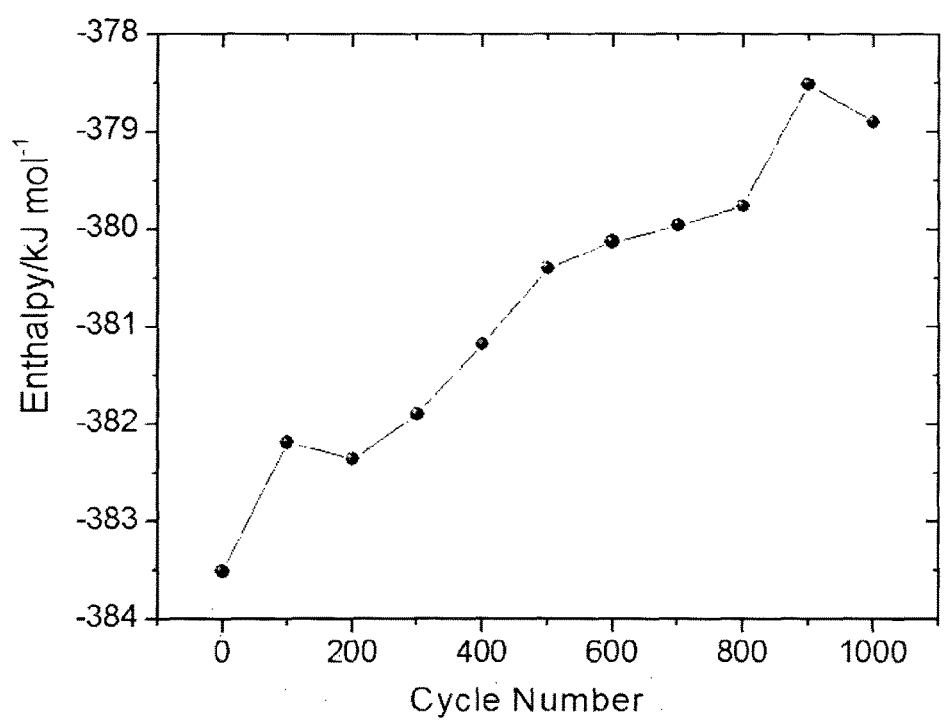
FIG. 95 shows enthalpy intensity 3.94 V of cycled LIB cells vs. cycle number.

FIG. 95 shows enthalpy intensity at 3.94 V of cycled LIB cells vs. cycle number.

Figure 96:
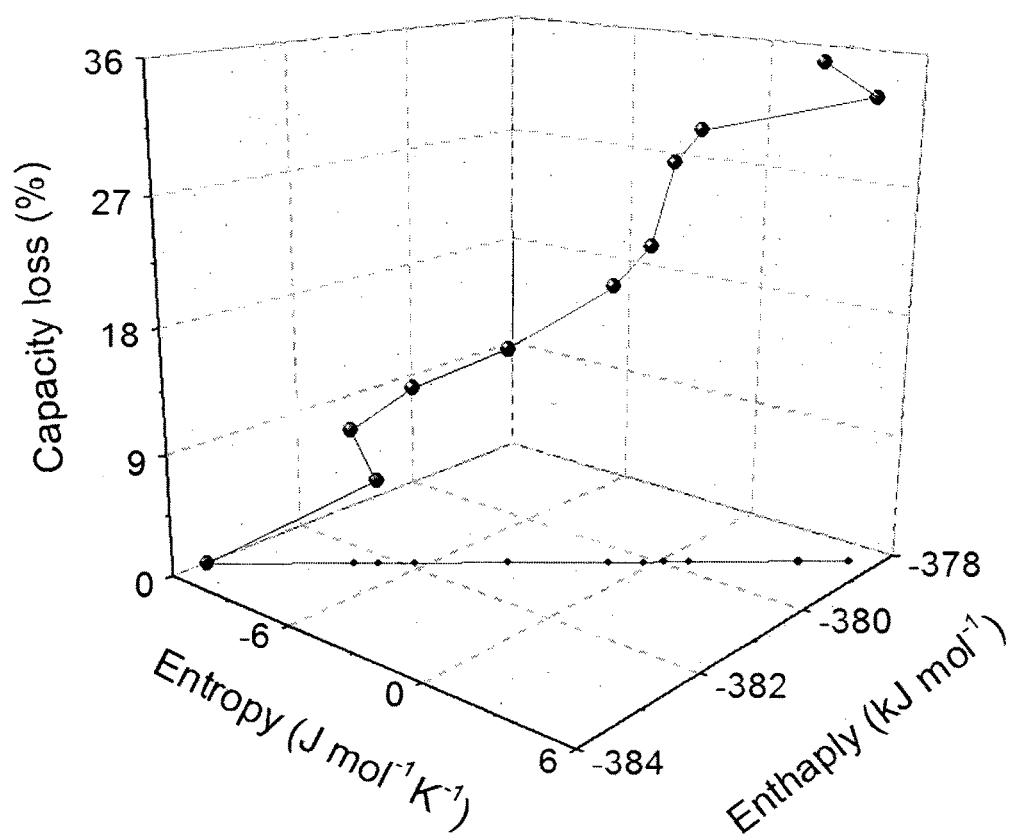
FIG. 96 shows a 3D profile at 3.94 V OCP of LIB cells cycled up to 1000 cycles.

FIG. 96 shows a 3D profile at 3.94 V OCP of LIB cells cycled up to 1000 cycles.

Figure 97:
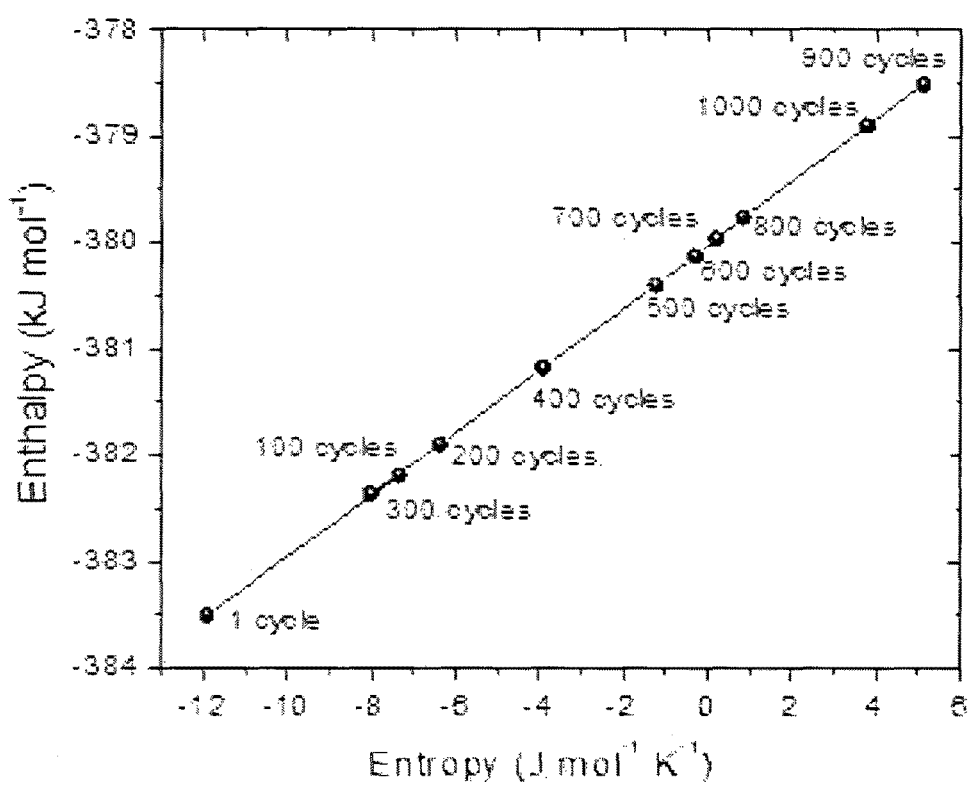
FIG. 97 shows a 2D profile at 3.94 V OCP of LIB cells cycled up to 1000 cycles.

FIG. 97 shows a 2D profile at 3.94 V OCP of LIB cells cycled up to 1000 cycles.

According to various embodiments, the memory effect on aged batteries with same capacity loss may be determined.

Here we compare thermodynamic characteristics of batteries having experienced same amounts of capacity loss during ageing under different ageing modes: overcharge, thermal and cycling.

We found that batteries with same capacity loss have different thermodynamic characteristics pending their ageing mode.

Accordingly batteries with different history have different thermodynamic characteristics even when they have same capacity loss a result addressed to as "battery memory".

Figure 98:
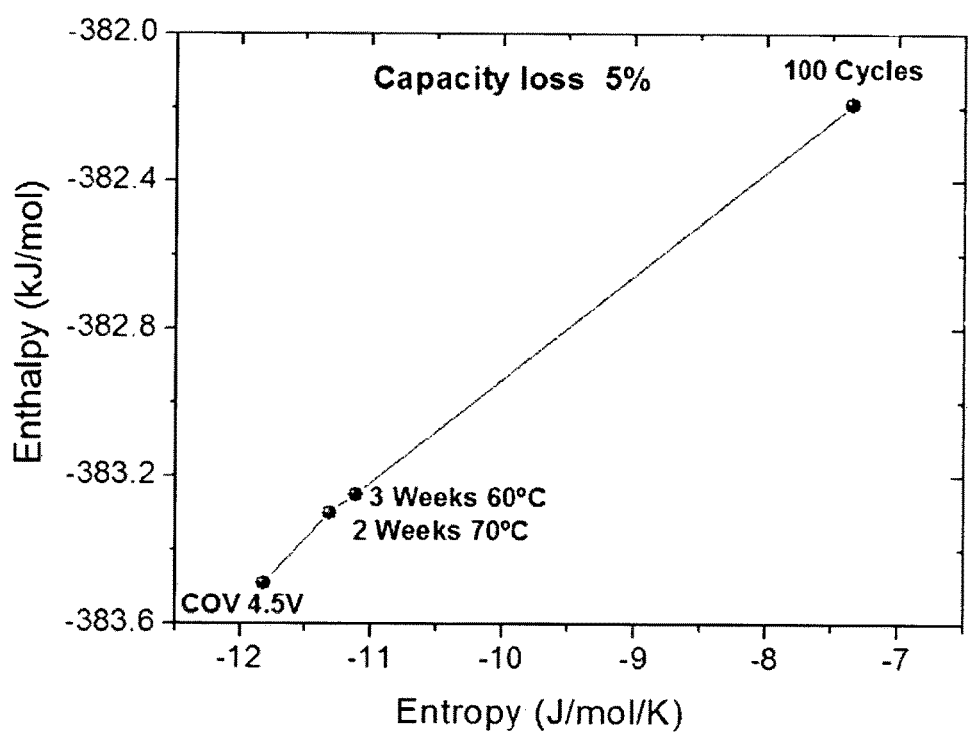
FIG. 98 shows a diagram for a battery with 5% capacity loss, showing a 2D projected curve on the ($\Delta S$, $\Delta H$) plane at 3.94V OCP of LIB cells having incurred a capacity loss of 5%.

FIG. 98 shows a diagram for a battery with 5% capacity loss.

Figure 99:
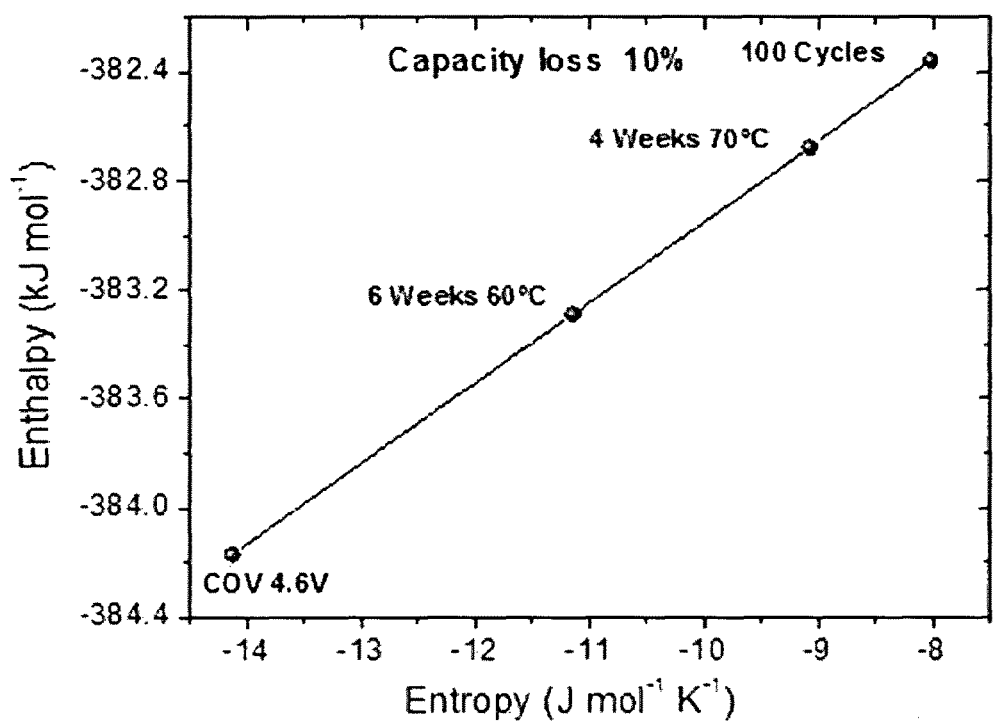
FIG. 99 shows a diagram for a battery with 10% capacity loss, showing a 2D projected curve on the ($\Delta S$, $\Delta H$) plane at 3.94V OCP of LIB cells having incurred a capacity loss of 10%.

FIG. 99 shows a diagram for a battery with 10% capacity loss.

Figure 100:
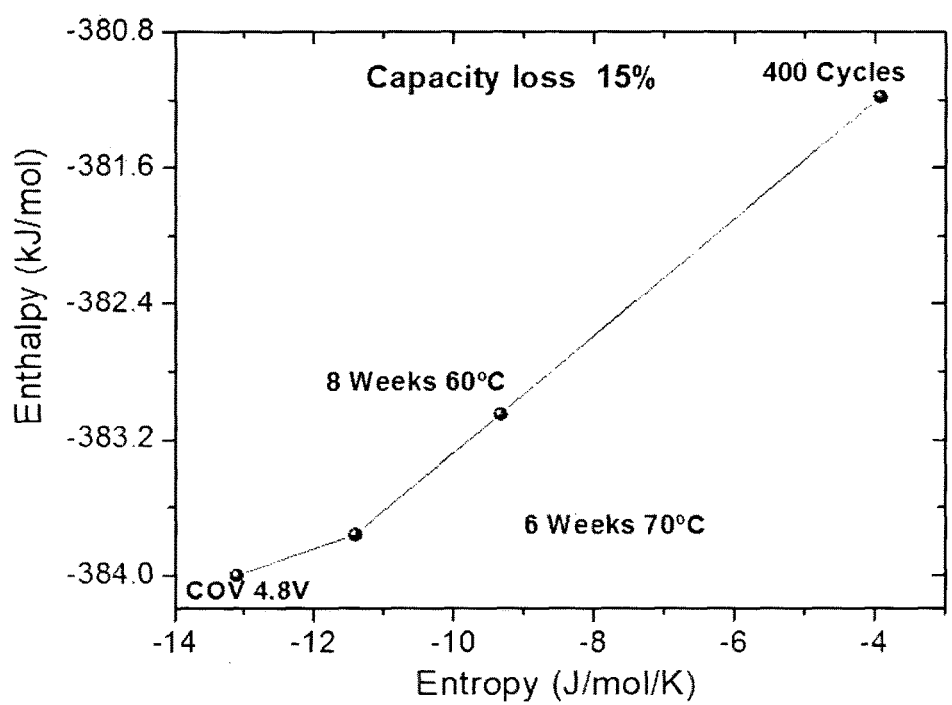
FIG. 100 shows a diagram for a battery with 15% capacity loss, showing a 2D projected curve on the ($\Delta S$, $\Delta H$) plane at 3.94V OCP of LIB cells having incurred a capacity loss of 15%.

FIG. 100 shows a diagram for a battery with 15% capacity loss.

Figure 101:
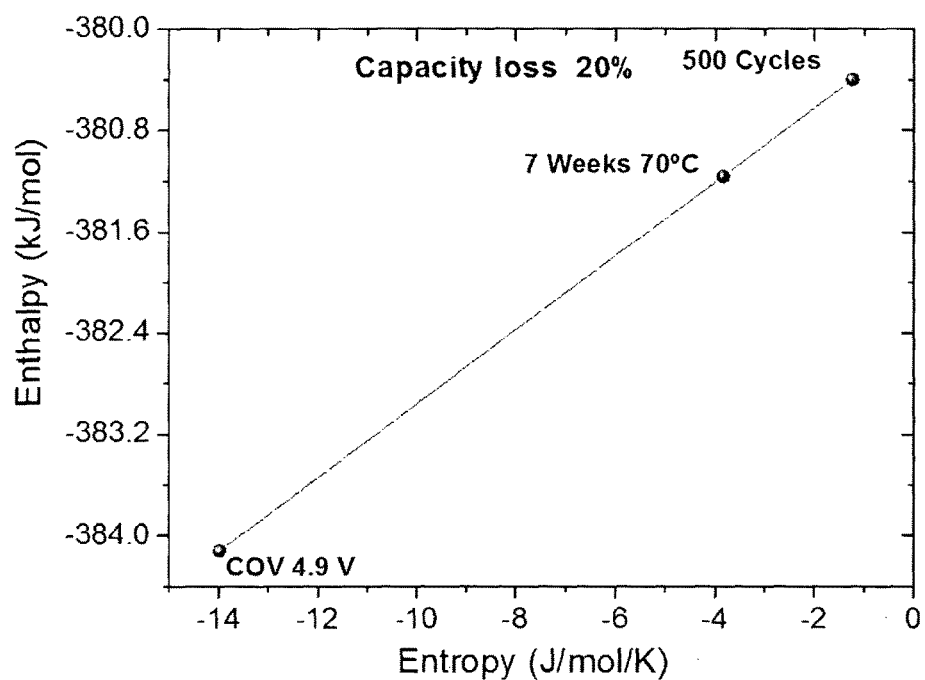
FIG. 101 shows a diagram for a battery with 20% capacity loss, showing a 2D projected curve on the ($\Delta S$, $\Delta H$) plane at 3.94V OCP of LIB cells having incurred a capacity loss of 20%.

FIG. 101 shows a diagram for a battery with 20% capacity loss.

Figure 102:
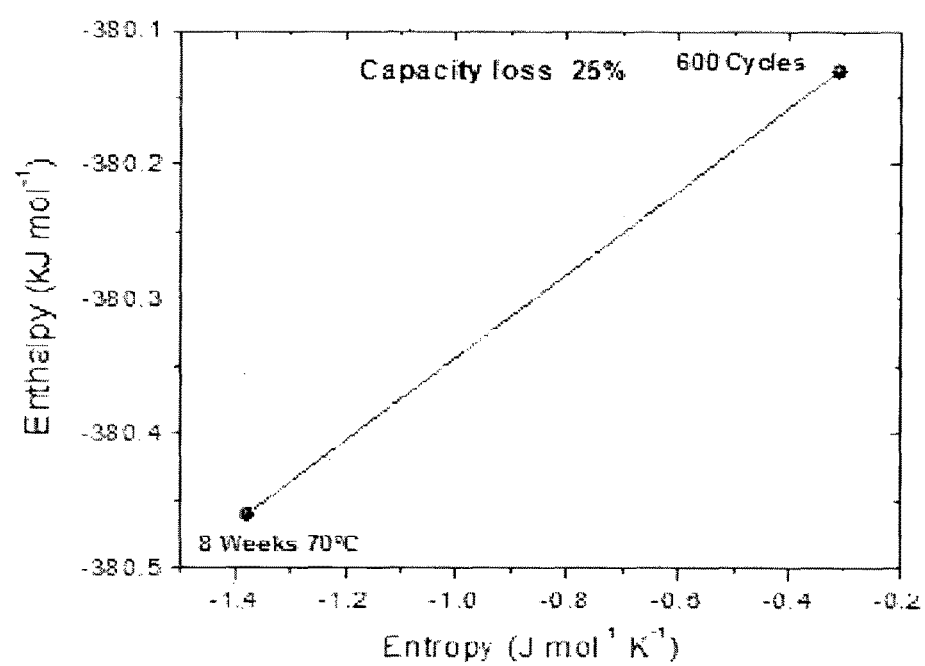
FIG. 102 shows a diagram for a battery with 25% capacity loss.

FIG. 102 shows a diagram for a battery with 25% capacity loss.

Throughout the description, the terminology as shown in the following Table 6 may be used.

TABLE 6

| Terminology | |
|---|---|
| Abbreviations | |
| 2D | Two dimensional |
| 3D | Three dimensional |
| COV | End of charge cut-off voltage |
| LCO | Lithium cobalt oxide |
| LiB | Lithium ion batteries |
| OCP | Open-circuit potential |
| SEI | Solid electrolyte interphase |
| SOC | State of charge |
| SOD | State of discharge |
| SOH | State of health |
| SOS | State of safety |
| US | United States of America |
| XRD | X-ray diffractometry |
| Roman | |
| A, mA | Ampere, milliampere |
| $A_1, A_2$ | Onsets of phase transition in the graphite anode |
| BA | Battery Analyzer for thermodynamics measurements |
| C | Carbon |
| ° C. | Degrees centigrade |
| $C_1$ to $C_4$ | Onsets of phase transitions in the LCO cathode |
| C/n | C-rate (mA) |
| $E_0, E_0(x)$ | Open-circuit potential (V) |
| $E_0^+$ | Cathode potential (V) |
| $E_0^-$ | Anode potential (V) |

TABLE 6-continued

Terminology

Abbreviations

| | |
|---|---|
| $E_i$ | Cell potential under current I (V) |
| $<e_d>$ | Average discharge potential (V) |
| $E_d$ | Discharge energy (mWh) |
| F | Faraday' constant (C) |
| G | Free (Gibbs) energy (J mole$^{-1}$) |
| H | Electrode host structure |
| H | Enthalpy (kJ mole$^{-1}$) |
| i | Electric current intensity (mA) |
| k | Boltzmann' constant (JK$^{-1}$ mole$^{-1}$) |
| Li | Lithium |
| n | Charge number |
| n | index number |
| N | Cycle number |
| O3 | Hexagonal phases in LCO |
| p | Pressure (Atm) |
| $q_d$ | Discharge capacity (mAh) |
| $q_{CL}$ | Capacity loss (%) |
| R | Ohmic resistance |
| S | Entropy (J K$^{-1}$ mole$^{-1}$) |
| t | Ageing time (weeks) |
| T | Absolute temperature (K) |
| T | Ageing temperature (° C.) |
| V | Volt |
| x | Cell reaction advancement rate |
| x | Fraction of the occupied sites by lithium |

Greek

| | |
|---|---|
| ΔG | Change in Gibbs energy (J mole$^{-1}$) |
| ΔH | Change in enthalpy (J mole$^{-1}$) |
| ΔS | Change in enthalpy (J K$^{-1}$ mole$^{-1}$) |
| ε | Li composition in Li$_\varepsilon$C$_6$ |
| $\eta_a$ | Anodic overpotential (V) |
| $\eta_c$ | Cathodic overpotential (V) |

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for testing a battery, the method comprising:
bringing the battery to a pre-determined voltage that is associated with at least one of a phase transition or a material change in at least one of an anode of the battery or a cathode of the battery;
changing a temperature of the battery by a pre-determined value;
determining a parameter of the battery at the pre-determined voltage and the temperature of the battery that is changed by the pre-determined value, the parameter of the battery comprising at least one of an entropy of the battery or an enthalpy of the battery; and
retroactively assessing a mode of ageing of the battery based on the determined parameter,
wherein the mode of ageing of the battery comprises information about at least one of a high voltage ageing, a high temperature ageing, or a long cycling ageing.

2. The method of claim 1, further comprising:
applying the pre-determined voltage to the battery for a pre-determined time; and
determining the parameter after applying the pre-determined voltage for the pre determined time.

3. The method of claim 1, wherein retroactively assessing the mode of ageing comprises comparing the determined parameter with a reference parameter.

4. The method of claim 3, wherein the reference parameter is a parameter of a battery which underwent a pre-determined mode of ageing.

5. A device configured to test a battery, the device comprising:
a voltage setting circuit configured to bring the battery to a pre-determined voltage that is associated with at least one of a phase transition or a material change in at least one of any anode of the battery or a cathode of the battery;
a parameter determination circuit configured to change a temperature of the battery by a pre-determined value and to determine a parameter of the battery at the pre-determined voltage and the temperature of the battery that is changed by the pre-determined value, the parameter of the battery comprising at least one of an entropy of the battery or an enthalpy of the battery; and
a history determination circuit configured to retroactively assess a mode of ageing of the battery based on the determined parameter,
wherein the mode of ageing of the battery comprises information about at least one of a high voltage ageing, a high temperature ageing, or a long cycling ageing.

6. The device of claim 5, wherein the voltage setting circuit is configured to apply the pre-determined voltage to the battery for a pre-determined time; and
wherein the parameter determination circuit is configured to determine the parameter after applying the pre-determined voltage for the pre-determined time.

7. The device of claim 5, wherein the history determination circuit is configured to retroactively assess the mode of ageing based on comparing the determined parameter with a reference parameter.

8. The device of claim 7, wherein the reference parameter is a parameter of a battery which underwent a pre-determined mode of ageing.

* * * * *